US011849230B2

(12) United States Patent
Tani

(10) Patent No.: US 11,849,230 B2
(45) Date of Patent: Dec. 19, 2023

(54) DIGITAL-TO-ANALOG CONVERTER, ANALOG-TO-DIGITAL CONVERTER, SIGNAL PROCESSING DEVICE, SOLID-STATE IMAGING DEVICE, AND DRIVING METHOD

(71) Applicant: OLYMPUS CORPORATION, Hachioji (JP)

(72) Inventor: Takaharu Tani, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 610 days.

(21) Appl. No.: 16/952,316

(22) Filed: Nov. 19, 2020

(65) Prior Publication Data

US 2021/0075987 A1 Mar. 11, 2021

Related U.S. Application Data

(63) Continuation of application No. PCT/JP2018/019606, filed on May 22, 2018.

(51) Int. Cl.
*H04N 25/75* (2023.01)
*H03M 1/46* (2006.01)
*H03M 1/68* (2006.01)

(52) U.S. Cl.
CPC ............ *H04N 25/75* (2023.01); *H03M 1/466* (2013.01); *H03M 1/68* (2013.01)

(58) Field of Classification Search
CPC ...... H04N 25/75; H03M 1/123; H03M 1/182; H03M 1/466; H03M 1/468; H03M 1/68
See application file for complete search history.

(56) References Cited

U.S. PATENT DOCUMENTS

2002/0084927 A1* 7/2002 Krymski ............. H03M 1/1014
341/155
2005/0151680 A1* 7/2005 Kearney ............... H03M 1/186
341/172

(Continued)

FOREIGN PATENT DOCUMENTS

JP 04-165822 A 6/1992
JP 2006-512861 A 4/2006

(Continued)

OTHER PUBLICATIONS

International Search Report dated Aug. 21, 2018, issued in counterpart application No. PCT/JP2018/019606, w/ English translation (4 pages).

(Continued)

*Primary Examiner* — Lin Ye
*Assistant Examiner* — Chriss S Yoder, III
(74) *Attorney, Agent, or Firm* — WHDA, LLP

(57) ABSTRACT

A digital-to-analog converter comprising: a plurality of capacitances and a plurality of switches. A capacitance among the plurality of capacitances, of which the number corresponds to the resolution of the analog signal to be output, is used as a voltage value generation capacitance, so as to generate a voltage value based on the reference voltage to be added or subtracted, by switching a node to which the second terminal is connected by a corresponding switch. A remaining capacitance, which is not used as the voltage value generation capacitance among the plurality of capacitances, is used as a gain adjustment capacitance, so as to adjust gain of a voltage value based on the reference voltage to be added or subtracted, by holding a node to which the second terminal is connected by a corresponding switch.

8 Claims, 18 Drawing Sheets

(56) References Cited

U.S. PATENT DOCUMENTS

| | | | |
|---|---|---|---|
| 2007/0001890 A1 | 1/2007 | Piasecki et al. | |
| 2007/0035434 A1 | 2/2007 | Tachibana et al. | |
| 2010/0066707 A1 | 3/2010 | Zebedee | |
| 2012/0056770 A1* | 3/2012 | Araki | H03M 1/466 |
| | | | 341/172 |

FOREIGN PATENT DOCUMENTS

| | | |
|---|---|---|
| JP | 2006-311144 A | 11/2006 |
| JP | 2007-049637 A | 2/2007 |
| JP | 2009-545909 A | 12/2009 |
| JP | 2010-166298 A | 7/2010 |
| JP | 2012-060221 A | 3/2012 |
| JP | 2013-526179 A | 6/2013 |
| JP | 2013-168870 A | 8/2013 |
| JP | 2016-005171 A | 1/2016 |
| JP | 2017-163193 A | 9/2017 |
| WO | 2011/133193 A1 | 10/2011 |
| WO | 2016/203522 A1 | 12/2016 |
| WO | 2017/158677 A1 | 9/2017 |

OTHER PUBLICATIONS

Notice of Allowance dated Jun. 7, 2022, issued in counterpart JP Application No. 2020-520894, with English Translation. (4 pages).
Office Action dated Nov. 9, 2021, issued in counterpart to JP Application No. 2020-520894, with English Translation. (12 pages).

* cited by examiner

FIG. 2

| OUTPUT LEVEL | D2 | D1 | D0 | DA1 | VDAC |
|---|---|---|---|---|---|
| 0 | 0 | 0 | 0 | 0 | VIN |
| 1 | 0 | 0 | 1 | 0 | VIN+(1/7.5)VREF |
| 2 | 0 | 1 | 0 | 0 | VIN+(2/7.5)VREF |
| 3 | 0 | 1 | 1 | 0 | VIN+(3/7.5)VREF |
| 4 | 1 | 0 | 0 | 0 | VIN+(4/7.5)VREF |
| 5 | 1 | 0 | 1 | 0 | VIN+(5/7.5)VREF |
| 6 | 1 | 1 | 0 | 0 | VIN+(6/7.5)VREF |
| 7 | 1 | 1 | 1 | 0 | VIN+(7/7.5)VREF |

VOLTAGE CHANGE WIDTH (1/7.5)VREF
OUTPUT AMPLITUDE (7/7.5)VREF

FIG. 3

| OUTPUT LEVEL | D2 | D1 | D0 | DA1 | VDAC |
|---|---|---|---|---|---|
| 0 | 0 | 0 | 0 | 0 | VIN |
| 1 | 0 | 0 | 0 | 1 | VIN+(0.5/7.5)VREF |
| 2 | 0 | 0 | 1 | 0 | VIN+(1/7.5)VREF |
| 3 | 0 | 0 | 1 | 1 | VIN+(1.5/7.5)VREF |
| 4 | 0 | 1 | 0 | 0 | VIN+(2/7.5)VREF |
| 5 | 0 | 1 | 0 | 1 | VIN+(2.5/7.5)VREF |
| 6 | 0 | 1 | 1 | 0 | VIN+(3/7.5)VREF |
| 7 | 0 | 1 | 1 | 1 | VIN+(3.5/7.5)VREF |

VOLTAGE CHANGE WIDTH (0.5/7.5)VREF
OUTPUT AMPLITUDE (3.5/7.5)VREF

FIG. 4

| OUTPUT LEVEL | D2 | D1 | D0 | DA1 | VDAC |
|---|---|---|---|---|---|
| 0 | 0 | 0 | 0 | 1 | VIN+(0.5/7.5)VREF |
| 1 | 0 | 0 | 1 | 1 | VIN+((1+0.5)/7.5)VREF |
| 2 | 0 | 1 | 0 | 1 | VIN+((2+0.5)/7.5)VREF |
| 3 | 0 | 1 | 1 | 1 | VIN+((3+0.5)/7.5)VREF |
| 4 | 1 | 0 | 0 | 1 | VIN+((4+0.5)/7.5)VREF |
| 5 | 1 | 0 | 1 | 1 | VIN+((5+0.5)/7.5)VREF |
| 6 | 1 | 1 | 0 | 1 | VIN+((6+0.5)/7.5)VREF |
| 7 | 1 | 1 | 1 | 1 | VIN+((7+0.5)/7.5)VREF |
| | | | VOLTAGE CHANGE WIDTH | | (1/7.5)VREF |
| | | | OUTPUT AMPLITUDE | | (7/7.5)VREF |

FIG. 5A

| DS | D2 | D1 | D0 | DA1 |
|----|----|----|----|-----|
| 1  | 0  | 0  | 0  | 1   |

FIG. 5B

| OUTPUT LEVEL | D2 | D1 | D0 | DA1 | VDAC |
|---|---|---|---|---|---|
| 0 | 0 | 0 | 0 | 0 | VIN−(0.5/7.5)VREF |
| 1 | 0 | 0 | 1 | 0 | VIN+((1−0.5)/7.5)VREF |
| 2 | 0 | 1 | 0 | 0 | VIN+((2−0.5)/7.5)VREF |
| 3 | 0 | 1 | 1 | 0 | VIN+((3−0.5)/7.5)VREF |
| 4 | 1 | 0 | 0 | 0 | VIN+((4−0.5)/7.5)VREF |
| 5 | 1 | 0 | 1 | 0 | VIN+((5−0.5)/7.5)VREF |
| 6 | 1 | 1 | 0 | 0 | VIN+((6−0.5)/7.5)VREF |
| 7 | 1 | 1 | 1 | 0 | VIN+((7−0.5)/7.5)VREF |

VOLTAGE CHANGE WIDTH (1/7.5) VREF
OUTPUT AMPLITUDE (7/7.5) VREF

FIG. 6A

| DS | D2 | D1 | D0 | DA1 |
|---|---|---|---|---|
| 1 | 1 | 0 | 0 | 0 |

FIG. 6B

| OUTPUT LEVEL | D2 | D1 | D0 | DA1 | VDAC |
|---|---|---|---|---|---|
| 0 | 0 | 0 | 0 | 0 | VIN−(4/7.5)VREF |
| 1 | 0 | 0 | 1 | 0 | VIN+((1−4)/7.5)VREF |
| 2 | 0 | 1 | 0 | 0 | VIN+((2−4)/7.5)VREF |
| 3 | 0 | 1 | 1 | 0 | VIN+((3−4)/7.5)VREF |
| 4 | 1 | 0 | 0 | 0 | VIN+((4−4)/7.5)VREF |
| 5 | 1 | 0 | 1 | 0 | VIN+((5−4)/7.5)VREF |
| 6 | 1 | 1 | 0 | 0 | VIN+((6−4)/7.5)VREF |
| 7 | 1 | 1 | 1 | 0 | VIN+((7−4)/7.5)VREF |
| VOLTAGE CHANGE WIDTH | | | | | (1/7.5) VREF |
| OUTPUT AMPLITUDE | | | | | (7/7.5) VREF |

FIG. 7A

| DS | D2 | D1 | D0 | DA1 |
|---|---|---|---|---|
| 1 | 0 | 1 | 0 | 0 |

FIG. 7B

| OUTPUT LEVEL | D2 | D1 | D0 | DA1 | VDAC |
|---|---|---|---|---|---|
| 0 | 0 | 0 | 0 | 0 | VIN−(2/7.5)VREF |
| 1 | 0 | 0 | 1 | 0 | VIN+((1−2)/7.5)VREF |
| 2 | 0 | 1 | 0 | 0 | VIN+((2−2)/7.5)VREF |
| 3 | 0 | 1 | 1 | 0 | VIN+((3−2)/7.5)VREF |
| 4 | 1 | 0 | 0 | 0 | VIN+((4−2)/7.5)VREF |
| 5 | 1 | 0 | 1 | 0 | VIN+((5−2)/7.5)VREF |
| 6 | 1 | 1 | 0 | 0 | VIN+((6−2)/7.5)VREF |
| 7 | 1 | 1 | 1 | 0 | VIN+((7−2)/7.5)VREF |
| VOLTAGE CHANGE WIDTH | | | | | (1/7.5) VREF |
| OUTPUT AMPLITUDE | | | | | (7/7.5) VREF |

FIG. 9

| OUTPUT LEVEL | D2 | D1 | D0 | DA1 | DA2 | VDAC |
|---|---|---|---|---|---|---|
| 0 | 0 | 0 | 0 | 0 | 0 | VIN |
| 1 | 0 | 0 | 1 | 0 | 0 | VIN+(1/7.75)VREF |
| 2 | 0 | 1 | 0 | 0 | 0 | VIN+(2/7.75)VREF |
| 3 | 0 | 1 | 1 | 0 | 0 | VIN+(3/7.75)VREF |
| 4 | 1 | 0 | 0 | 0 | 0 | VIN+(4/7.75)VREF |
| 5 | 1 | 0 | 1 | 0 | 0 | VIN+(5/7.75)VREF |
| 6 | 1 | 1 | 0 | 0 | 0 | VIN+(6/7.75)VREF |
| 7 | 1 | 1 | 1 | 0 | 0 | VIN+(7/7.75)VREF |

VOLTAGE CHANGE WIDTH  (1/7.75)VREF
OUTPUT AMPLITUDE  (7/7.75)VREF

FIG. 10

| OUTPUT LEVEL | D2 | D1 | D0 | DA1 | DA2 | VDAC |
|---|---|---|---|---|---|---|
| 0 | 0 | 0 | 0 | 0 | 0 | VIN |
| 1 | 0 | 0 | 0 | 1 | 0 | VIN+(0.5/7.75)VREF |
| 2 | 0 | 0 | 1 | 0 | 0 | VIN+(1/7.75)VREF |
| 3 | 0 | 0 | 1 | 1 | 0 | VIN+(1.5/7.75)VREF |
| 4 | 0 | 1 | 0 | 0 | 0 | VIN+(2/7.75)VREF |
| 5 | 0 | 1 | 0 | 1 | 0 | VIN+(2.5/7.75)VREF |
| 6 | 0 | 1 | 1 | 0 | 0 | VIN+(3/7.75)VREF |
| 7 | 0 | 1 | 1 | 1 | 0 | VIN+(3.5/7.75)VREF |

VOLTAGE CHANGE WIDTH  (0.5/7.75)VREF
OUTPUT AMPLITUDE  (3.5/7.75)VREF

FIG. 11

| OUTPUT LEVEL | D2 | D1 | D0 | DA1 | DA2 | VDAC |
|---|---|---|---|---|---|---|
| 0 | 0 | 0 | 0 | 0 | 0 | VIN |
| 1 | 0 | 0 | 0 | 0 | 1 | VIN+(0.25/7.75)VREF |
| 2 | 0 | 0 | 0 | 1 | 0 | VIN+(0.5/7.75)VREF |
| 3 | 0 | 0 | 0 | 1 | 1 | VIN+(0.75/7.75)VREF |
| 4 | 0 | 0 | 1 | 0 | 0 | VIN+(1/7.75)VREF |
| 5 | 0 | 0 | 1 | 0 | 1 | VIN+(1.25/7.75)VREF |
| 6 | 0 | 0 | 1 | 1 | 0 | VIN+(1.5/7.75)VREF |
| 7 | 0 | 0 | 1 | 1 | 1 | VIN+(1.75/7.75)VREF |

VOLTAGE CHANGE WIDTH (0.25/7.75)VREF
OUTPUT AMPLITUDE (1.75/7.75)VREF

FIG. 12

| OUTPUT LEVEL | D2 | D1 | D0 | DA1 | DA2 | VDAC |
|---|---|---|---|---|---|---|
| 0 | 0 | 0 | 0 | 0 | 0 | VIN |
| 1 | 0 | 0 | 0 | 1 | 1 | VIN+(0.75/7.75)VREF |
| 2 | 0 | 0 | 1 | 1 | 0 | VIN+(1.5/7.75)VREF |
| 3 | 0 | 1 | 0 | 0 | 1 | VIN+(2.25/7.75)VREF |
| 4 | 0 | 1 | 1 | 0 | 0 | VIN+(3/7.75)VREF |
| 5 | 0 | 1 | 1 | 1 | 1 | VIN+(3.75/7.75)VREF |
| 6 | 1 | 0 | 0 | 1 | 0 | VIN+(4.5/7.75)VREF |
| 7 | 1 | 0 | 1 | 0 | 1 | VIN+(5.25/7.75)VREF |

VOLTAGE CHANGE WIDTH (0.75/7.75)VREF
OUTPUT AMPLITUDE (5.25/7.75)VREF

FIG. 14

| OUTPUT LEVEL | D2 | D1 | D0 | DA1 | VDAC |
|---|---|---|---|---|---|
| 0 | 0 | 0 | 0 | 0 | VIN |
| 1 | 0 | 0 | 1 | 0 | VIN+(1/(7.5+p))VREF |
| 2 | 0 | 1 | 0 | 0 | VIN+(2/(7.5+p))VREF |
| 3 | 0 | 1 | 1 | 0 | VIN+(3/(7.5+p))VREF |
| 4 | 1 | 0 | 0 | 0 | VIN+(4/(7.5+p))VREF |
| 5 | 1 | 0 | 1 | 0 | VIN+(5/(7.5+p))VREF |
| 6 | 1 | 1 | 0 | 0 | VIN+(6/(7.5+p))VREF |
| 7 | 1 | 1 | 1 | 0 | VIN+(7/(7.5+p))VREF |

VOLTAGE CHANGE WIDTH (1/(7.5+p))VREF
OUTPUT AMPLITUDE (7/(7.5+p))VREF

FIG. 15

| OUTPUT LEVEL | D2 | D1 | D0 | DA1 | VDAC |
|---|---|---|---|---|---|
| 0 | 0 | 0 | 0 | 0 | VIN |
| 1 | 0 | 0 | 0 | 1 | VIN+(0.5/(7.5+p))VREF |
| 2 | 0 | 0 | 1 | 0 | VIN+(1/(7.5+p))VREF |
| 3 | 0 | 0 | 1 | 1 | VIN+(1.5/(7.5+p))VREF |
| 4 | 0 | 1 | 0 | 0 | VIN+(2/(7.5+p))VREF |
| 5 | 0 | 1 | 0 | 1 | VIN+(2.5/(7.5+p))VREF |
| 6 | 0 | 1 | 1 | 0 | VIN+(3/(7.5+p))VREF |
| 7 | 0 | 1 | 1 | 1 | VIN+(3.5/(7.5+p))VREF |

VOLTAGE CHANGE WIDTH (0.5/(7.5+p))VREF
OUTPUT AMPLITUDE (3.5/(7.5+p))VREF

DIGITAL-TO-ANALOG CONVERTER, ANALOG-TO-DIGITAL CONVERTER, SIGNAL PROCESSING DEVICE, SOLID-STATE IMAGING DEVICE, AND DRIVING METHOD

CROSS REFERENCE TO RELATED APPLICATIONS

This application is a continuation application based on PCT Patent Application No. PCT/JP2018/019606, filed on May 22, 2018, the content of which is incorporated herein by reference.

BACKGROUND

Technical Field

The present invention relates to a digital-to-analog converter, an analog-to-digital converter, a signal processing device, a solid-state imaging device, and a driving method.

Background Art

Conventionally, there is a digital-analog conversion that includes a plurality of weighted capacitances and outputs analog signals of various voltage values based on an input analog signal (hereinafter referred to as "input signal") and a reference voltage with a predetermined resolution. Each of the capacitances provided in the digital-to-analog converter is binary-weighted. In the digital-to-analog converter, the reference voltage connected to each capacitance is switched and the accumulated charges are redistributed. As a result, analog signals with various resolutions corresponding to the respective capacitance ratios are output. For example, a 3-bit resolution digital-to-analog converter has three binary weighted capacitances. Of the three capacitances, the capacitance value of one capacitance is set to 1 times the reference value. Of the other two capacitances, the capacitance value of one capacitance is set to 2 times, and the capacitance value of the other capacitance is set to 4 times. As a result, the respective capacitances provided in the digital-to-analog converter are binary weighted. Then, in the digital-to-analog converter, first, charges corresponding to the input signal are stored in all capacitances. Then, when outputting an analog signal, a switch is used to switch the combination for connecting each capacitance and the reference voltage.

Accordingly, the 3-bit resolution digital-to-analog converter outputs an analog signal having a voltage value obtained by adding a voltage value of 0/7 to 7/7 times the reference voltage to the voltage value of the input signal initially input, depending on the ratio of the sum of the capacitance values of the capacitances connected to the reference voltage to the sum of the capacitances of all capacitances.

Further, a successive approximation type analog-to-digital converter has been put into practical use. A digital-to-analog converter including a plurality of binary-weighted capacitances sequentially compares the voltage value of each output analog signal with the voltage value of the reference voltage. As a result, it is converted into a digital value representing the voltage value of the input input signal to be converted. The successive approximation type analog-to-digital converter (hereinafter, simply referred to as "analog-to-digital converter") includes a comparator and a SAR (Successive Application Register) logic circuit in addition to the digital-to-analog converter. In the analog-to-digital converter, first, the charges corresponding to the input signals input to the respective capacitances included in the digital-to-analog converter, that is, the voltage value of the analog signal to be converted into a digital value are accumulated. As a result, the digital-to-analog converter outputs an analog signal having a voltage value obtained by adding the voltage value of the input signal to be converted and the voltage value of the reference voltage that is a multiple determined by the combination of the capacitances connected to the reference voltage. The comparator successively compares the voltage value of each analog signal output by the digital-to-analog converter according to the combination of the reference voltage and the connected capacitance with the voltage value of the reference voltage. At this time, the SAR logic circuit switches the voltage value of each analog signal output by the digital-to-analog converter according to the result of comparison by the comparator. That is, the SAR logic circuit controls the switch for switching the combination of connecting the respective capacitances and the reference voltage provided in the digital-to-analog converter. Among the combinations of switches that connect the capacitance controlled by the SAR logic circuit and the reference voltage, the combination of switches whose analog signal voltage value output from the digital-to-analog converter and the reference voltage value are closest to each other is the digital value representing the voltage value of the input signal to be converted. That is, the switching state of the switch in the digital-to-analog converter when the SAR logic circuit controls the voltage value of the analog signal output by the digital-to-analog converter and the voltage value of the reference voltage are the closest to each other is a digital value that represents the voltage value of the input signal to be converted.

By the way, various voltage values can be considered as the voltage value of the input signal to be converted, which is input to the analog-to-digital converter. Therefore, for example, a digital-to-analog converter having a configuration disclosed in Japanese Unexamined Patent Application, First Publication No. 2006-311144 (hereinafter referred to as Patent Document 1) and a successive approximation type analog-to-digital converter have been proposed. In the digital-to-analog converter disclosed in Patent Document 1, each binary-weighted capacitance is divided into two. By simultaneously controlling both of the divided capacitances, it is possible to output an analog signal in the same voltage value range as the conventional one. Further, by controlling only one of the divided capacitances, it is possible to output an analog signal having a voltage value range lower than that of the related art (half the voltage value range of the related art). Then, the successive approximation type analog-to-digital converter in which the range of the voltage value of the input signal that can be converted is widened is realized. In other words, Patent Literature 1 realizes a successive approximation type analog-to-digital converter that converts the input signal to be converted into a digital value after adjusting the level with a gain value of 2 times.

However, as described above, the digital-to-analog converter disclosed in Patent Document 1 has a configuration in which each of the binary-weighted capacitances is divided into two and the combination of the capacitances is switched. Therefore, a switch corresponding to each of the divided capacitances is required. That is, the number of switches required is twice the resolution of the analog signal to be output. Therefore, the area required to form a digital-to-analog converter increases. The increase in the area required to form the digital-to-analog converter becomes a factor that hinders the miniaturization of the digital-to-analog converter and the successive approximation type analog-to-digital converter.

SUMMARY

The present invention relates to a digital-to-analog converter that can be formed while suppressing an increase in area and outputs an analog signal by switching over a range of a plurality of voltage values, an analog-to-digital converter using this digital-to-analog converter, and a driving method. Furthermore, the present invention provides a signal processing device and a solid-state imaging device using the analog-to-digital converter.

According to exemplary embodiments, there is provided a digital-to-analog converter that samples a voltage value of an input signal and outputs an analog signal of a voltage value obtained by adding and subtracting a voltage value based on a reference voltage to the sampled voltage value of the input signal with a predetermined resolution, comprising: a plurality of capacitances at least one more than the resolution, of which first terminal is connected to an output node side of the analog signal, and of which second terminal is connected to either a high potential side or a low potential side of the reference voltage; and a plurality of switches corresponding to each of the capacitances, and configured to switch the second terminal of a corresponding capacitance to either the high potential side node or the low potential side node according to an input control signal.

A capacitance among the plurality of capacitances, of which the number corresponds to the resolution of the analog signal to be output, is used as a voltage value generation capacitance, so as to generate a voltage value based on the reference voltage to be added or subtracted, by switching a node to which the second terminal is connected by a corresponding switch.

A remaining capacitance, which is not used as the voltage value generation capacitance among the plurality of capacitances, is used as a gain adjustment capacitance, so as to adjust gain of a voltage value based on the reference voltage to be added or subtracted, by holding a node to which the second terminal is connected by a corresponding switch.

When changing to lower a gain value of the voltage value of the output analog signal, a capacitance among the plurality of the capacitances are selected as the voltage value generation capacitance or the gain adjustment capacitance so that a capacitance value of a capacitance used as the voltage value generation capacitance is reduced.

When changing to increase the gain value of the voltage value of the output analog signal, the capacitance among the plurality of the capacitances are selected as the voltage value generation capacitance or the gain adjustment capacitance so that the capacitance value of the capacitance used as the voltage value generation capacitance is increased.

According to another embodiment, each of the above capacitance may be either a main capacitance weighted by a binary number corresponding to the resolution of the analog signal to be output, or a sub capacitance with a capacitance value of 1/k times (wherein k is 2 or more multiplier of 2) a smallest capacitance value among the main capacitances.

When changing to lower a gain value of the voltage value of the analog signal to be output, sub capacitances, of which the number corresponds to the gain value to be changed, are included in the voltage value generation capacitance in order from the sub capacitance having a largest capacitance value among the sub capacitances included in the gain adjustment capacitance, and main capacitances, of which the number is same as the number of the sub capacitances included in the voltage value generation capacitance, are included in the gain adjustment capacitance, in order from the main capacitance having a largest capacitance value among the voltage value generation capacitances.

When changing to increase the gain value, main capacitances, of which the number corresponds to the gain value to be changed, are included in the voltage value generation capacitance, in order from the main capacitance having the smallest capacitance value among the main capacitances included in the gain adjustment capacitance, and sub capacitances, of which the number is same as the number of the main capacitance included in the voltage value generation capacitance, are included in the gain adjustment capacitance, in order from the sub capacitance having the smallest capacitance value among the sub capacitances included in the voltage value generation capacitance.

According to another embodiment, a connection destination of the second terminal of at least one of the plurality of capacitances is switched to a node different from a node connected when sampling the voltage value of the input signal by the corresponding switch, and the capacitance is used for offset adjustment of a voltage value based on the reference voltage that is added or subtracted by the voltage value generation capacitance.

According to another embodiment, a connection destination of the second terminal of at least one of the plurality of capacitances during sampling the voltage value of the input signal is switched to a node different from a node to be connected when not performing offset adjustment by the corresponding switch, and the capacitance is used for offset adjustment of a voltage value based on the reference voltage that is added or subtracted by the voltage value generation capacitance.

According to another embodiment, there is provided an analog-to-digital converter comprising: the digital-to-analog converter; a comparator configured to compare the voltage value of the analog signal output from the digital-to-analog converter input to one input terminal and the voltage value of the voltage to be compared input to the other input terminal; and a control circuit configured to output a digital signal with the resolution representing a magnitude of the voltage value of the input signal, and to generate the control signal corresponding to each of the switches provided in the digital-to-analog converter, in reference to a comparison result of the comparator.

According to another embodiment, there is provided a signal processing device comprising: the analog-to-digital converter; and a signal processing circuit configured to determine a gain value of the voltage value of the analog signal output by the digital-to-analog converter in the analog-to-digital converter whose gain is adjusted when the analog-to-digital converter next performs analog-to-digital conversion based on the digital signal output from the analog-to-digital converter, and to output a gain change signal instructing the change of the gain value based on the determination result, to the analog-digital converter. The control circuit provided in the analog-to-digital converter generates the control signal corresponding to each of the switches provided in the digital-to-analog converter according to the gain change signal.

According to another embodiment, there is provided a solid-state imaging device comprising: a pixel array section in which a plurality of pixels that generate photoelectric conversion signals according to the amount of incident light are arranged in a two-dimensional matrix; a pixel selector configured to select each of the pixels arranged in the pixel array section, and to read out a pixel signal corresponding to the photoelectric conversion signal from the selected pixel; and the analog-to-digital converter. The analog-to-digital converter outputs the digital signal with the resolution representing the magnitude of the voltage value of the pixel signal.

According to another embodiment, there is provided a driving method of a digital-to-analog converter that samples a voltage value of an input signal and outputs an analog signal with a predetermined resolution, of which a voltage value obtained by adding and subtracting a voltage value based on a reference voltage to the sampled voltage value of the input signal, the digital-to-analog converter including: a plurality of capacitances at least one more than the resolution, of which first terminal is connected to an output node side of the analog signal, and of which second terminal is connected to either a high potential side or a low potential side of the reference voltage; and a plurality of switches corresponding to each of the capacitances, and configured to switch the second terminal of a corresponding capacitance to either the high potential side node or the low potential side node according to an input control signal. The driving method comprising: generating a voltage value based on the reference voltage to be added or subtracted, by switching a node to which the second terminal is connected by a corresponding switch, using a capacitance among the plurality of capacitances, of which the number corresponds to the resolution of the analog signal to be output, as a voltage value generation capacitance; adjusting gain of a voltage value based on the reference voltage to be added or subtracted, by holding a node to which the second terminal is connected by a corresponding switch, using a remaining capacitance among the plurality of capacitances, which is not used as the voltage value generation capacitance, as a gain adjustment capacitance; selecting a plurality of the capacitances as the voltage value generation capacitance or the gain adjustment capacitance, when changing to lower a gain value of the voltage value of the analog signal to be output, sub capacitances, of which the number corresponds to the gain value to be changed, are included in the voltage value generation capacitance, in order from the sub capacitance having a largest capacitance value among the sub capacitances included in the gain adjustment capacitance, and main capacitances, of which the number is same as the number of the sub capacitances included in the voltage value generation capacitance, are included in the gain adjustment capacitance, in order from the main capacitance having a largest capacitance value among the voltage value generation capacitances, when changing to increase the gain value, main capacitances, of which the number corresponds to the gain value to be changed, are included in the voltage value generation capacitance, in order from the main capacitance having the smallest capacitance value among the main capacitances included in the gain adjustment capacitance, and sub capacitances, of which the number is same as the number of the main capacitance included in the voltage value generation capacitance, are included in the gain adjustment capacitance, in order from the sub capacitance having the smallest capacitance value among the sub capacitances included in the voltage value generation capacitance.

According to each of the above embodiments, a digital-to-analog converter that can be formed while suppressing an increase in area and outputs an analog signal by switching over a range of a plurality of voltage values, and an analog-to-digital converter using this digital-to-analog converter, and a driving method. Furthermore, according to each of the above aspects, it is possible to provide a signal processing device and a solid-state imaging device using the analog-to-digital converter.

BRIEF DESCRIPTION OF THE DRAWINGS

FIG. 2 is a diagram showing voltage values of signals output by the digital-to-analog converter of the present invention.

FIG. 3 is a diagram showing another voltage value of a signal output by the digital-to-analog converter of the present invention.

FIG. 4 is a diagram showing still another voltage value of a signal output by the digital-to-analog converter of the present invention.

FIGS. 5A and 5B are diagrams showing still another voltage value of the signal output by the digital-to-analog converter of the present invention.

FIGS. 6A and 6B are diagrams showing still another voltage value of a signal output by the digital-to-analog converter of the present invention.

FIGS. 7A and 7B are diagrams showing still another voltage value of a signal output by the digital-to-analog converter of the present invention.

FIG. 9 is a diagram showing voltage values of signals output by the digital-to-analog converter according to the first modified example of the present invention.

FIG. 10 is a diagram showing another voltage value of a signal output by the digital-to-analog converter of the first modified example of the present invention.

FIG. 11 is a diagram showing still another voltage value of the signal output by the digital-to-analog converter of the first modified example of the present invention.

FIG. 12 is a diagram showing still another voltage value of the signal output by the digital-to-analog converter of the first modified example of the present invention.

FIG. 14 is a diagram showing voltage values of signals output by a digital-to-analog converter according to a second modification of the present invention.

FIG. 15 is a diagram showing another voltage value of the signal output by the digital-to-analog converter of the second modified example of the present invention.

DETAILED DESCRIPTION OF THE PREFERRED EMBODIMENT (Digital-to-Analog Converter)

Figure 1:
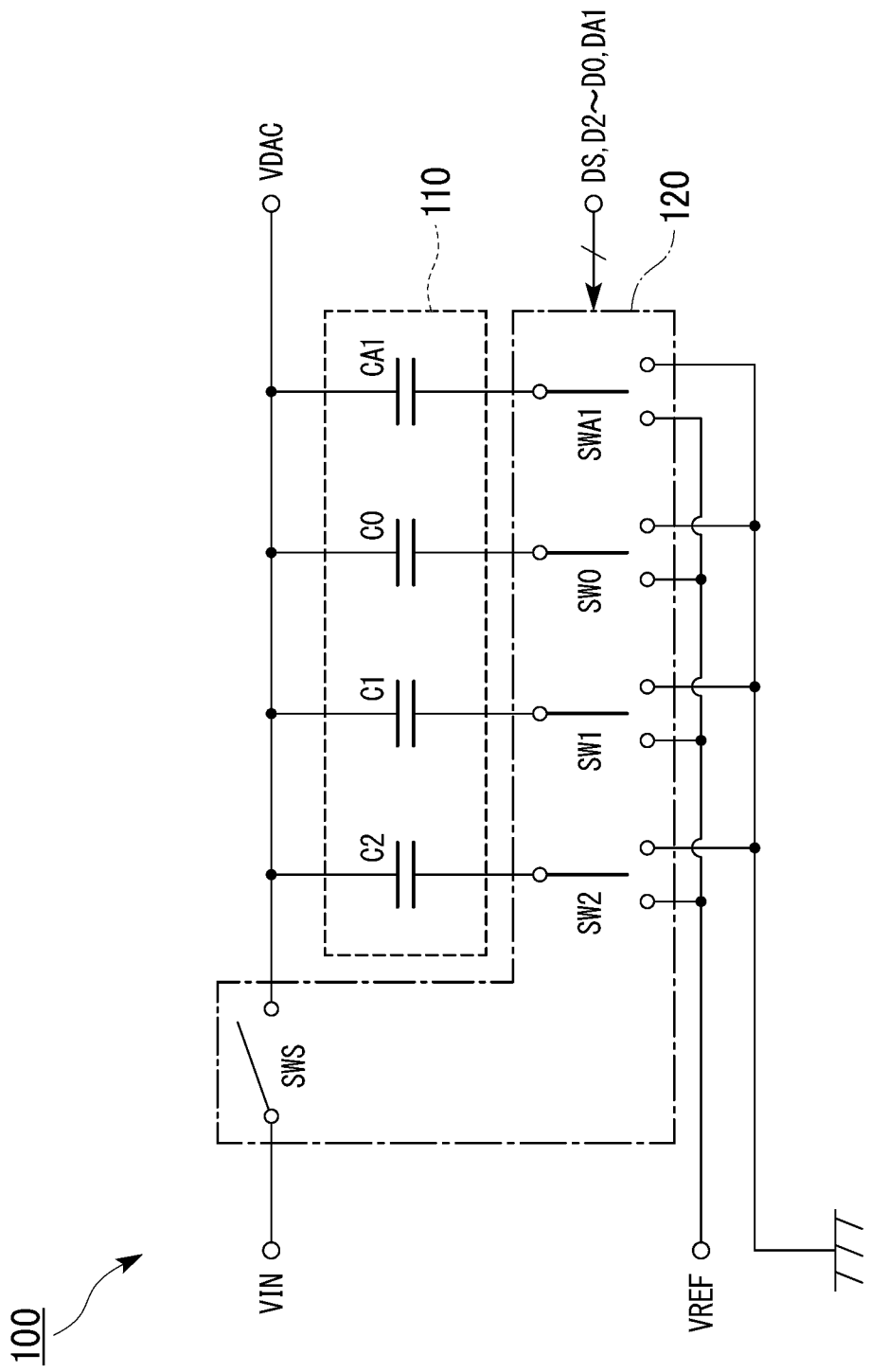
FIG. 1 is a block diagram showing an example of a configuration of a digital-to-analog converter of the present invention.

Embodiments of the present invention will be described below with reference to the drawings. FIG. 1 is a block diagram showing an example of the configuration of a digital-to-analog converter of the present invention. The digital-to-analog converter 100 shown in FIG. 1 includes a capacitance section 110 having a plurality of binary weighted capacitances C, and a switch section 120 having a plurality of switches SW corresponding to the respective capacitances C provided in the capacitance section 110. The digital-to-analog converter 100 outputs, with a predetermined resolution, analog signals VDAC having various voltage values based on the input signal VIN, the high-potential-side reference voltage VREF, and the low-potential-side reference voltage VREF. FIG. 1 shows an example of the configuration of a digital-to-analog converter when the high-potential-side reference voltage VREF is the reference voltage VREF and the low-potential-side reference voltage VREF is the ground (GND).

The digital-to-analog converter 100 performs gain adjustment within the range of the voltage value of the output analog signal VDAC, that is, the output amplitude of the output analog signal VDAC with a predetermined gain value. At this time, the digital-to-analog converter 100 sets the voltage value of the reference voltage VREF to a predetermined multiple according to the capacitance ratio of each capacitance C included in the capacitance section 110. That is, the digital-to-analog converter 100 adjusts gain so that the voltage value of the reference voltage VREF is a voltage value of a predetermined magnitude. Then, the digital-to-analog converter 100 adds/subtracts the voltage value of the gain-adjusted reference voltage VREF to/from the voltage value of the input signal VIN, and outputs the analog signal VDAC. Gain adjustment of the reference voltage VREF in the digital-to-analog converter 100, or multiple of the voltage value of the reference voltage VREF to be added to or subtracted from the voltage value of the input signal VIN (a multiple corresponding to the capacitance ratio of each capacitance C included in the capacitance section 110) are switched by a digital signal D which is a control signal for controlling each switch SW input from an external control circuit. That is, in the digital-to-analog converter 100, the voltage value of the output analog signal VDAC is controlled by the input digital signal D.

The digital-to-analog converter 100 adjusts gain so that the voltage value of the reference voltage VREF is 1 times or ½ times. The digital-to-analog converter 100 adds/subtracts the voltage value of the reference voltage VREF whose gain is adjusted to a predetermined multiple to/from the voltage value of the input signal VIN, and outputs the analog signal VDAC. The digital-to-analog converter 100 has a resolution of 3 bits.

The capacitance section 110 includes capacitances C0 to C2 and CA1. The switch section 120 includes switches SWS, SW0 to SW2, and SWA1. The switches SW0 to SW2 and SWA1 correspond to the capacitances C0 to C2 and CA1, respectively. More specifically, the switch SW0 corresponds to the capacitance C0. The switch SW1 corresponds to the capacitance C1. The switch SW2 corresponds to the capacitance C2. The switch SWA1 corresponds to the capacitance CA1. The capacitance CA1 included in the capacitance section 110 and the switch SWA1 included in the switch section 120 are the capacitance and switch added in the digital-to-analog converter 100. In the digital-to-analog converter 100, by a configuration of the capacitances C0 to C2 and CA1 included in the capacitance section 110 and the switches SWS, SW0 to SW2, and SWA1 included in the switch section 120, the gain in the range of the voltage value (output amplitude) of the output analog signal VDAC is adjusted. That is, in the digital-to-analog converter 100, the voltage value of the reference voltage VREF is adjusted by the configuration of the capacitances C included in the capacitance section 110 and the switches SW included in the switch section 120.

The first terminals of the capacitances C0 to C2 and CA1 are connected to the node side of the output analog signal VDAC. More specifically, the first terminals of the capacitances C0 to C2 and CA1 are connected in parallel to the node of the analog signal VDAC to be output. The second terminals of the capacitances C0 to C2 and CA1 are connected to the first terminals of the corresponding switches SW in the switch section 120. Note that FIG. 1 shows a case where each of the capacitances C0 to C2 and CA1 included in the capacitance section 110 is configured by one capacitance. However, in each of the capacitances C included in the capacitance section 110, some or all of the capacitances C may be configured by combining a plurality of capacitances. For example, in a case where two capacitances are connected in series to form the capacitance C0, the first terminal of one of the capacitances forming the capacitance C0 may be connected to the node of the analog signal VDAC, the second terminal of the one capacitance may be connected to the first terminal of the other capacitance, and the second terminal of the other capacitance may be connected to the first terminal of the corresponding switch SW. Further, for example, in a case where one capacitance CS is connected in series to form the capacitances C0 and C1 with a total of three capacitances, the first terminal of the capacitance CS may be connected to the node of the analog signal VDAC, the second terminal of the capacitance CS may be connected to the first terminal of the other two capacitances, and the second terminal of the other two capacitances may be connected to the first terminal of the corresponding switch SW.

The respective capacitances C of the capacitances C0 to C2 and CA1 are binary weighted by the capacitance value. More specifically, in a case where the capacitance value of the capacitance C0 is set to 1, the capacitance value of the capacitance C1 is 2 times, and the capacitance value of the capacitance C2 is 4 times. Further, the capacitance value of the capacitance CA1 is ½. The weighting of the capacitance value of each of the capacitances C0 to C2 and CA1 may be other than a binary number.

In the following description, it is assumed that the unit of the capacitance value of the capacitance C included in the capacitance section 110 is "Cu". In the following description, it is assumed that the capacitance value of the capacitance C0 is 1 Cu as a reference and the capacitance C of the capacitance section 110 is binary weighted by the capacitance value. Therefore, the capacitance value of the capacitance C1 is 2 Cu. The capacitance value of the capacitance C2 is 4 Cu. The capacitance value of the capacitance CA1 is 0.5 Cu. The sum of the capacitance values of all the capacitances C included in the capacitance section 110, that is, the capacitance value of the entire capacitance section 110 is 7.5 Cu.

The switch SWS connects (short-circuits) the input terminal of the input signal VIN and the node of the analog signal VDAC. The first terminal of the switch SWS is connected to the input terminal of the input signal VIN. The second terminal of the switch SWS is connected to the node of the analog signal VDAC to which the first terminals of the capacitances C0 to C2 and CA1 are connected in parallel. The control terminal of the switch SWS is connected to the input terminal of a digital signal DS which is a control signal for controlling the switch SWS. The switch SWS switches the connection between the input terminal of the input signal VIN and the node of the analog signal VDAC to either one of an on (short circuit) state or an off (open) state according to the digital signal DS.

In each of the switches SW0 to SW2 and SWA1, the second terminal of the corresponding capacitance C in the capacitance section 110 is connected (short-circuited) to either the node on the high potential side or the node on the low potential side of the reference voltage VREF. FIG. 1 shows a case where a node on the high potential side of the reference voltage VREF is a node connected to the input terminal on the high potential of the reference voltage VREF, and a node on the low potential side is a node with ground (GND) potential. In the following description, for ease of explanation, a node on the high potential side of the reference voltage VREF is referred to as a "node of the reference voltage VREF" and a node on the low potential side is referred to as a "node of ground potential".

The first terminals of the switches SW0 to SW2 and SWA1 are connected to the second terminals of the corresponding capacitances C, respectively. The second terminals of the switches SW0 to SW2 and SWA1 are connected to the node of the reference voltage VREF. The third terminals of the switches SW0 to SW2 and SWA1 are connected to the node of the ground potential. The control terminals of the switches SW0 to SW2 and SWA1 are connected to the input terminals of the corresponding digital signals D0 to D2 and DA1, which are the control signals for controlling each of the switches SW0 to SW2 and SWA1. Each of the switches SW0 to SW2 and SWA1 switches the node connected to the first terminal to either the node of reference voltage VREF or the node of the ground potential, in accordance with the corresponding digital signals D0 to D2 and DA1. That is, each of the switches SW0 to SW2 and SWA1 connects the second terminal of each of the corresponding capacitances C0 to C2 and CA1 to either the node of the reference voltage VREF or the node of the ground potential, in accordance with the corresponding digital signals D0 to D2 and DA1.

Here, the operation when the digital-to-analog converter 100 outputs the analog signal VDAC will be described. First, the voltage value of the input signal VIN is sampled in all the capacitances C0 to C2 and CA1.

More specifically, the switch SWS corresponding to the digital signal DS connects the input terminal of the input signal VIN and the node of the analog signal VDAC (short-circuit state). Then, the second terminals of the capacitances C0 to C2 and CA1 are connected to the ground potential node by the switches SW0 to SW2 and SWA1. As a result, each of the capacitances C0 to C2 and CA1 is charged with electric charge according to the potential difference between the potential of the input signal VIN and the ground potential. After that, the connection between the input terminal of the input signal VIN and the node of the analog signal VDAC is cut off (opened) by the switch SWS corresponding to the digital signal DS. As a result, the charged electric charge is held (stored) in each of the capacitances C0 to C2 and CA1. In the following description, holding (storing) charges corresponding to the potential difference between the potential of the input signal VIN and the ground potential in each of the capacitances C0 to C2 and CA1 is referred to as "sampling". In this way, in the digital-to-analog converter 100, in accordance with the control of the input digital signals DS, D0 to D2, and DA1, respectively, the voltage value of the input signal VIN is sampled in each of the capacitances C0 to C2 and CA1.

At this time, the voltage value of the analog signal VDAC output from the digital-to-analog converter 100 is expressed by the following equation (1). The electric charge Q sampled in the entire capacitance section 110 is expressed by the following equation (2).

$$VDAC = VIN \quad (1)$$

$$Q = 7.5\,Cu \times VIN \quad (2)$$

Then, in the digital-to-analog converter 100, multiple of the voltage value of the reference voltage VREF, which is according to the ratio of the sum of the capacitance values of all capacitances C of capacitances C0 to C2 and CA1 to the sum of the capacitance values of the capacitances C connected to the reference voltage VREF, is added to the voltage value of the sampled input signal VIN. An analog signal VDAC having the added voltage value is output.

More specifically, the switch SWS corresponding to the digital signal DS maintains the open state (OFF state) in which the connection between the input terminal of the input signal VIN and the node of the analog signal VDAC is cut off. Then, by the switches SW0 to SW2 and SWA1 corresponding to the digital signals D0 to D2 and DA1, the second terminals of the capacitances C0 to C2 and CA1 are connected to either the node of the reference voltage VREF or the node of the ground potential. As a result, of the capacitances C0 to C2 and CA1, the reference voltage VREF corresponding to the weight of the total capacitance value of the capacitance C whose second terminal is connected to the node of the reference voltage VREF is added to the voltage value of the sampled input signal VIN to output the voltage value. Thus, in the digital-to-analog converter 100, according to the control of the input digital signals DS, D0 to D2, and DA1, multiple of the voltage value of the reference voltage VREF, which is according to the capacitance ratio of each combination of the capacitances C0 to C2 and CA1 connected to the reference voltage VREF, is added to the voltage value of the input signal VIN. The analog signal VDAC having the added voltage value is output. In other words, the digital-to-analog converter 100 switches the voltage value of the analog signal VDAC to be output according to the control of the digital signals D0 to D2 and DA1.

At this time, the voltage value of the analog signal VDAC output from the digital-to-analog converter 100 is expressed by the following equation (3).

$$VDAC = VIN + (W/7.5)Cu \times VREF \quad (3)$$

In the above equation (3), W is the weight of the capacitance C among the capacitances C0 to C2 and CA1 whose second terminal is connected to the node of the reference voltage VREF.

In the digital-to-analog converter 100, among the capacitances C0 to C2 and CA1 included in the capacitance section 110, three capacitances C are used as voltage value generation capacitances and an analog signal VDAC with a resolution of 3 bits is output. More specifically, in a case where an analog signal VDAC with a gain of 1 times and a resolution of 3 bits is output, three capacitances C of capacitances C0 to C2 are used as the voltage value generation capacitances, and an analog signal VDAC having eight voltage values (output levels), which are obtained by adding voltage values that are (0/7.5) Cu to (7/7.5) Cu times of the reference voltage VREF to the voltage value of the input signal VIN is output. Further, in a case where an analog signal VDAC with a gain of ½ times and a resolution of 3 bits is output, the three capacitances C of the capacitances C0, C1 and CA1 are used as voltage value generation capacitances, and an analog signal VDAC having eight output levels obtained by adding voltage values that are (0/7.5) Cu to (3.5/7.5) Cu times of the reference voltage VREF to the voltage value of the input signal VIN is output.

Here, the relationship between the digital signal D input to the digital-to-analog converter 100 and the analog signal VDAC output by the digital-to-analog converter 100 will be described. FIGS. 2 and 3 are diagrams showing the voltage value of the signal (analog signal VDAC) output by the digital-to-analog converter 100 of the present invention. FIG. 2 shows the voltage value of the analog signal VDAC output from the digital-to-analog converter 100 when the gain is adjusted to 1 times. Further, FIG. 3 shows the voltage value of the analog signal VDAC output from the digital-to-analog converter 100 when the gain is adjusted to ½ times. In FIGS. 2 and 3, the analog signal VDAC with a 3-bit resolution output from the digital-to-analog converter 100 has eight output levels from output level 0 to output level 7, and is associated with the values of the digital signals D0 to D2 and DA1 to indicate the voltage value of the analog signal VDAC.

The digital signal DS is a digital signal D for controlling the switch SWS included in the switch section 120 to cause the capacitances C0 to C2 and CA1 included in the capacitance section 110 to sample the voltage value of the input signal VIN. Therefore, in the digital signal DS, when the analog signal VDAC of the voltage value obtained by adding multiple of the voltage value of the reference voltage VREF, which is according to the ratio of the sum of the capacitance values of all the capacitances C of the capacitances C0 to C2 and CA1 to the sum of the capacitance values of the capacitances C connected to the reference voltage VREF, to the voltage value of the sampled input signal VIN is output, the digital-to-analog converter 100 maintains the open state (off state) of the switch SWS. That is, the digital signal DS is a value that is fixed (held) without being changed while being controlled in an open state (OFF state) in which the connection between the input terminal of the input signal VIN and the node of the analog signal VDAC is cut off. In FIGS. 2 and 3, the digital signal DS of a fixed value is omitted.

In the following description, it is assumed that the voltage value of the input signal VIN is sampled in each of the capacitances C0 to C2 and CA1 included in the capacitance section 110. In FIGS. 2 and 3, it is assumed that the nodes connected to the respective first terminals of the switches SW0 to SW2 and SWA1 are switched to the ground potential node when the values of the corresponding digital signals D0 to D2 and DA1 are "0", and are switched to a node with a reference voltage VREF when they are "1".

First, the relationship between the digital signal D and the analog signal VDAC when the gain of the digital-to-analog converter 100 is adjusted to 1 times will be described with reference to FIG. 2. As described above, in a case where the gain in the range of the voltage value (output amplitude) of the analog signal VDAC adjusted and output by the digital-to-analog converter 100 is 1 times, an analog signal VDAC with a resolution of 3 bits is output by using the three capacitances C of the capacitances C0 to C2 provided in the capacitance section 110 as the voltage value generation capacitance. Therefore, in the digital-to-analog converter 100, the values of the digital signals D0 to D2 are controlled, and the value of the digital signal DA1 is fixed (held) to "0". Then, the analog signal VDAC of eight output levels is output, according to the values of the digital signals D0 to D2 corresponding to the three capacitances C of the capacitances C0 to C2 used when the gain is 1 times, that is, the value of the 3-bit digital signal D. In FIG. 2, the binary code of the 3-bit digital signal D corresponding to the three capacitances C0 to C2 indicates the respective values of the digital signals D0 to D2, that is, a node connected to each first terminal of the switches SW0 to SW2. In FIG. 2, the value of the digital signal D2 corresponding to the capacitance C2 having the largest capacitance value (=4 Cu) among the three capacitances C0 to C2 is defined as the most significant bit (MSB). The value of the digital signal D0 corresponding to the capacitance C0 having the smallest capacitance value (=1 Cu) is defined as the least significant bit (LSB).

In the digital-to-analog converter 100, when the value of the digital signal D (digital signal D2, digital signal D1, and digital signal D0) is "000", each of the first terminals of the switches SW2 to SW0 is connected to the node of the ground potential. Therefore, as shown in FIG. 2, the voltage value (=VIN) of the input signal VIN sampled in all capacitances C of the capacitances C2 to C0 and CA1 included in the capacitance section 110 is output as an analog signal VDAC with an output level of 0.

When the value of the digital signal D is "001", the first terminals of the switches SW2 and SW1 are connected to the node of the ground potential, and the first terminal of the switch SW0 is connected to the node of the reference voltage VREF. Therefore, the voltage value obtained by adding the voltage value (=(1/7.5)Cu×VREF) of reference voltage VREF, which is according to the ratio of the total capacitance value (=7.5 Cu) of all capacitances C included in the capacitance section 110 to the capacitance value (=1 Cu) of the capacitance C0 connected to the reference voltage VREF among the three capacitance C of capacitances C2 to C0, to the voltage value (=VIN) of the sampled input signal VIN is output as an analog signal VDAC of the output level 1.

At this time, the voltage value of the analog signal VDAC output from the digital-to-analog converter 100 is represented by the following expression (4).

$$VDAC = VIN + (1/7.5)Cu \times VREF \quad (4)$$

Further, when the value of the digital signal D is "010", the first terminals of the switches SW2 and SW0 are connected to the node of the ground potential, and the first terminal of the switch SW1 is connected to the node of the reference voltage VREF. Therefore, the voltage value obtained by adding the voltage value of the reference voltage VREF (=(2/7.5)Cu×VREF), which is according to the ratio of the total capacitance value (=7.5 Cu) of all the capacitances C to the capacitance value (=2 Cu) of the capacitance C1 connected to the reference voltage VREF, to the voltage value (=VIN) of the input signal VIN is output as an analog signal VDAC of the output level 2.

At this time, the voltage value of the analog signal VDAC output from the digital-to-analog converter 100 is expressed by the following equation (5).

$$VDAC = VIN + (2/7.5)Cu \times VREF \quad (5)$$

When the value of the digital signal D is "011", the first terminal of the switch SW2 is connected to the node of the ground potential, and the first terminals of the switches SW1 and SW0 are connected to the node of the reference voltage VREF. Therefore, the voltage value obtained by adding the voltage value of the reference voltage VREF (=(3/7.5)Cu×VREF), which is according to the ratio of the total capacitance value (=7.5 Cu) of all the capacitances C to the total capacitance value (=3 Cu) of the capacitances C1 and C0 connected to the reference voltage VREF, to the voltage value (=VIN) of the input signal VIN is output as an analog signal VDAC of the output level 3.

At this time, the voltage value of the analog signal VDAC output by the digital-to-analog converter 100 is expressed by the following equation (6).

$$VDAC=VIN+(3/7.5)Cu \times VREF \qquad (6)$$

When the value of the digital signal D is "100", the first terminals of the switches SW1 and SW0 are connected to the ground potential node, and the first terminal of the switch SW2 is connected to the reference voltage VREF node. Therefore, the voltage value obtained by adding the voltage value of the reference voltage VREF (=(4/7.5)Cu×VREF), which is according to the ratio of the total capacitance value (=7.5 Cu) of all the capacitances C to the capacitance value (=4 Cu) of the capacitance C2 connected to the reference voltage VREF, to the voltage value (=VIN) of the input signal VIN is output as an analog signal VDAC of the output level 4.

At this time, the voltage value of the analog signal VDAC output by the digital-to-analog converter 100 is expressed by the following equation (7).

$$VDAC=VIN+(4/7.5)Cu \times VREF \qquad (7)$$

When the value of the digital signal D is "101", the first terminal of the switch SW1 is connected to the node of the ground potential, and the first terminals of the switch SW2 and the switch SW0 are connected to the node of the reference voltage VREF. Therefore, the voltage value obtained by adding the voltage value of the reference voltage VREF (=(5/7.5)Cu×VREF), which is according to the ratio of the total capacitance value (=7.5 Cu) of all the capacitances C to the total capacitance value (=5 Cu) of the capacitances C2 and C0 connected to the reference voltage VREF, to the voltage value (=VIN) of the input signal VIN is output as an analog signal VDAC of the output level 5.

At this time, the voltage value of the analog signal VDAC output by the digital-to-analog converter 100 is expressed by the following equation (8).

$$VDAC=VIN+(5/7.5)Cu \times VREF \qquad (8)$$

When the value of the digital signal D is "110", the first terminal of the switch SW0 is connected to the ground potential node, and the first terminals of the switches SW2 and SW1 are connected to the reference voltage VREF node. Therefore, the voltage value obtained by adding the voltage value of the reference voltage VREF (=(6/7.5)Cu×VREF), which is according to the ratio of the total capacitance value (=7.5 Cu) of all the capacitances C to the total capacitance value (=6 Cu) of the capacitances C2 and C1 connected to the reference voltage VREF, to the voltage value (=VIN) of the input signal VIN is output as an analog signal VDAC of the output level 6.

At this time, the voltage value of the analog signal VDAC output from the digital-to-analog converter 100 is expressed by the following equation (9).

$$VDAC=VIN+(6/7.5)Cu \times VREF \qquad (9)$$

When the value of the digital signal D is "111", the first terminals of the switches SW2 to SW0 are connected to the node of the reference voltage VREF. Therefore, the voltage value obtained by adding the voltage value of the reference voltage VREF (=(7/7.5)Cu×VREF), which is according to the ratio of the total capacitance value (=7.5 Cu) of all the capacitances C and the total capacitance value (=7 Cu) of the capacitances C2 to C0 connected to the reference voltage VREF, to the voltage value (=VIN) of the input signal VIN is output as an analog signal VDAC of the output level 7.

At this time, the voltage value of the analog signal VDAC output by the digital-to-analog converter 100 is expressed by the following equation (10).

$$VDAC=VIN+(7/7.5)Cu \times VREF \qquad (10)$$

As described above, in a case where the gain of the output amplitude of the analog signal VDAC which is adjusted in gain and output is 1 times, the analog signal VDAC of eight output levels is output, which is obtained by adding a voltage value of (0/7.5) Cu to (7/7.5) Cu times of the reference voltage VREF to the voltage value (=VIN) of the input signal VIN, according to the values of the input digital signals D2 to D0. Here, the variation width of the voltage value of the analog signal VDAC output from the digital-to-analog converter 100 (difference between the voltage values of the analog signal VDAC of the output levels before and after) is (1/7.5)Cu×VREF as shown in FIG. 2.

The range of the voltage value (output amplitude) of the analog signal VDAC output by the digital-to-analog converter 100 is represented by the difference between the voltage value (=VIN+(7/7.5)Cu×VREF) of the analog signal VDAC at the output level 7 and the voltage value (=VIN) of the analog signal VDAC at the output level 0. Therefore, in FIG. 2, the output amplitude of the analog signal VDAC output by the digital-to-analog converter 100 is (7/7.5)Cu×VREF.

Next, the relationship between the digital signal D and the analog signal VDAC in a state where the gain of the digital-to-analog converter 100 is adjusted to ½ times will be described with reference to FIG. 3. As described above, when the gain of the output amplitude of the analog signal VDAC adjusted and output by the digital-to-analog converter 100 is ½ times, the three capacitances C of the capacitances C0, C1 and CA1 provided in the capacitance section 110 are used as the voltage value generation capacitance, to output an analog signal VDAC with a resolution of 3 bits. Therefore, in the digital-to-analog converter 100, the values of the digital signals D0, D1 and DA1 are controlled, and the value of the digital signal D2 is fixed (held) to "0". According to the values of the digital signals D0, D1 and DA1 corresponding to the three capacitances C0, C1 and CA1 used when the gain is ½ times (value of the 3-bit digital signal D), the analog signal VDAC of eight output levels is output. In FIG. 3, based on the same idea as in the case where the gain shown in FIG. 2 is 1 times, the binary code of the 3-bit digital signal D corresponding to the three capacitances C0, C1 and CA1 represents the respective values of the digital signals D0, D1 and DA1, that is, the nodes connected to the respective first terminals of the switches SW0, SW1 and SWA1. In FIG. 3, the value of the digital signal D1 corresponding to the capacitance C1 having the largest capacitance value (=2 Cu) among the three capacitances C0, C1 and CA1 is defined as the most significant bit (MSB). The value of the digital signal DA1 corresponding to the capacitance CA1 having the smallest capacitance value (=0.5 Cu) is defined as the least significant bit (LSB).

When the value of the digital signal D (digital signal D1, digital signal D0, and digital signal DA1) is "000", each first terminal of the switches SW1, SW0, and SWA1 is connected to the node of the ground potential. Therefore, as shown in FIG. 3, the voltage value (=VIN) of the input signal VIN sampled in all the capacitances C2 to C0 and CA1 included in the capacitance section 110 is output as an analog signal VDAC of the output level 0.

When the value of the digital signal D is "001", the first terminals of the switches SW1 and SW0 are connected to the node of the ground potential, and the first terminal of the switch SWA1 is connected to the node of the reference voltage VREF. Therefore, the voltage value obtained by adding the voltage value of the reference voltage VREF (=(0.5/7.5)Cu×VREF), which is according to the ratio of the total capacitance value (=7.5 Cu) of all the capacitances C included in the capacitance section 110 to the capacitance value (=0.5 Cu) of the capacitance CA1 connected to the reference voltage VREF among the three capacitances C the capacitances of C1, C0, and CA1, to the voltage value (=VIN) of the sampled input signal VIN is output as an analog signal VDAC of the output level 1.

At this time, the voltage value of the analog signal VDAC output from the digital-to-analog converter 100 is expressed by the following equation (11).

$$VDAC=VIN+(0.5/7.5)Cu \times VREF \quad (11)$$

When the value of the digital signal D is "010", the first terminals of the switches SW1 and SWA1 are connected to the node of the ground potential, and the first terminal of the switch SW0 is connected to the node of the reference voltage VREF. Therefore, the voltage value obtained by adding the voltage value of the reference voltage VREF (=(1/7.5)Cu×VREF), which is according to the ratio of the total capacitance value (=7.5 Cu) of all the capacitances C to the capacitance value (=1 Cu) of the capacitance C0 connected to the reference voltage VREF, to the voltage value (=VIN) of the input signal VIN is output as an analog signal VDAC of the output level 2.

At this time, the voltage value of the analog signal VDAC output from the digital-to-analog converter 100 is expressed by the following equation (12).

$$VDAC=VIN+(1/7.5)Cu \times VREF \quad (12)$$

Similarly, as shown in FIG. 3, according to the value of the digital signal D, the voltage value obtained by adding the voltage value of the reference voltage VREF, which is according to the ratio of the total capacitance value of all the capacitances C (=7.5 Cu) to the total capacitance value of the capacitances C connected to the reference voltage VREF, to the voltage value (=VIN) of the input signal VIN is output as an analog signal VDAC of each output level.

Then, when the value of the digital signal D is "111", the respective first terminals of the switches SW1, SW0, and SWA1 are connected to the node of the reference voltage VREF. Therefore, the voltage value obtained by adding the voltage value of the reference voltage VREF (=(3.5/7.5)Cu×VREF), which is according to the ratio of the total capacitance value (=7.5 Cu) of all the capacitances C to the total capacitance value (=3.5 Cu) of the capacitances C1, C0, and CA1 connected to the reference voltage VREF, to the voltage value (=VIN) of the input signal VIN is output as an analog signal VDAC of the output level 7.

At this time, the voltage value of the analog signal VDAC output from the digital-to-analog converter 100 is expressed by the following equation (13).

$$VDAC=VIN+(3.5/7.5)Cu \times VREF \quad (13)$$

As described above, when the gain of the output amplitude of the analog signal VDAC that is adjusted and output is ½ times, according to the values of the input digital signals D0, D1 and DA1, the analog signal VDAC of eight output levels obtained by adding the voltage value (=VIN) of the input signal VIN to the voltage value of (0/7.5) Cu to (3.5/7.5) Cu times of the reference voltage VREF is output. That is, when the gain of the output amplitude of the analog signal VDAC that is adjusted and output is ½ times, as shown in FIG. 3, the analog signal VDAC of eight output levels, in which the variation width of the voltage value (difference in the voltage value of the analog signal VDAC of the preceding and following output levels) is (0.5/7.5) Cu×VREF, is output.

As described above, the range of the voltage value (output amplitude) of the analog signal VDAC output by the digital-to-analog converter 100 is represented by the difference between the voltage value (=VIN+(3.5/7.5)Cu×VREF) of the analog signal VDAC having the output level 7 and the voltage value (=VIN) of the analog signal VDAC having the output level 0. Therefore, in FIG. 3, the output amplitude of the analog signal VDAC output by the digital-to-analog converter 100 is (3.5/7.5)Cu×VREF. That is, the output amplitude of the analog signal VDAC output by the digital-to-analog converter 100 is ½ times the (7/7.5)Cu×VREF of the output amplitude when the gain is 1 times, that is, the gain becomes ½ times.

As described above, the digital-to-analog converter 100 adds the capacitance CA1 to the capacitance section 110 and the switch SWA1 to the switch section 120 to adjust gain of the range of the voltage value (output amplitude) of the analog signal VDAC to be output. Then, of the four capacitances C2 to C0 and CA1 provided in the capacitance section 110, three capacitances C are used as the voltage value generation capacitances, and an analog signal VDAC with a resolution of 3 bits is output with a gain of 1 times or ½ times. That is, three of the four capacitances C included in the capacitance section 110 are used as a capacitance C for generating a voltage value of the analog signal VDAC output with a resolution of 3 bits according to the switching of the corresponding switch SW after sampling the voltage value of the input signal VIN. Then, the remaining one capacitance C included in the capacitance section 110 is fixed (held) without switching the corresponding switch SW. Moreover, the capacitance value of the capacitance C (capacitance CA1) added to adjust gain of the output amplitude of the analog signal VDAC to be output is a capacitance value smaller than the capacitance C of the smallest capacitance value when the gain is 1 times. Further, the switch SW (switch SWA1) added to adjust gain of the output amplitude of the output analog signal VDAC has the same configuration as the other switches SW (switches SW0 to SW2) used for switching the reference voltage VREF provided in the switch section 120. In other words, the switch SW (switch SWA1) added in the digital-to-analog converter 100 is not the switch SW configured to realize special performance. That is, the capacitance CA1 and the switch SWA1 are only added although the configuration is such that the analog signal VDAC switched in the range of a plurality of voltage values whose gain is adjusted to 1 times or ½ times is output. That is, the digital-to-analog converter 100 can be realized by adding fewer components as it is applied to a configuration that outputs an analog signal VDAC with a higher resolution. Therefore, an increase in the area required to form the digital-to-analog converter 100 can be suppressed.

As an operation when the digital-to-analog converter 100 outputs the analog signal VDAC, it was described that all the capacitances C included in the capacitance section 110 are made to sample the voltage value of the input signal VIN, and then the analog signal VDAC having a voltage value is output obtained by adding the voltage values of the multiple reference voltages VREF to the voltage value of the input signal VIN according to the capacitance ratio of the respective capacitances C included in the capacitance section 110 changed by the digital signal D. That is, in the operation of the digital-to-analog converter 100 described above, first, all the capacitances C included in the capacitance section 110 were made to sample the voltage value of the input signal VIN. Then, after all the capacitances C have sampled the voltage value of the input signal VIN, the second terminal of one capacitance C, which is not used for outputting the voltage value of the analog signal VDAC having a resolution of 3 bits, was fixed (held) in a state of being connected to the node of the ground potential. However, when sampling the voltage value of the input signal VIN in each of the capacitances C included in the capacitance section 110 or when thereafter outputting the voltage value of the analog signal VDAC with 3-bit resolution, by operating differently from the operation of the digital-to-analog converter 100 described above, it is possible to give an offset to the voltage value of the analog signal VDAC having a resolution of 3 bits to be output. That is, not only the voltage value of the reference voltage VREF is adjusted by a predetermined gain value, but also the offset of the output analog signal VDAC can be adjusted by controlling the digital signal D.

Here, the operation when offset adjustment is performed on the analog signal VDAC output from the digital-to-analog converter 100 will be described. First, the operation in the case of performing offset adjustment when outputting the voltage value of the analog signal VDAC with 3-bit resolution will be described.

In a case where the high-potential side of the reference voltage VREF is a positive voltage and the low-potential side is a ground (ground: GND) potential, the digital-to-analog converter 100 can perform the offset adjustment for adding the positive voltage value of the reference voltage VREF, which is a multiple corresponding to the capacitance ratio of each capacitance C provided in the capacitance section 110, to the analog signal VDAC to be output. On the other hand, in a case where the high-potential side of the reference voltage VREF is the ground (ground: GND) potential and the low-potential side is a negative voltage, the digital-to-analog converter 100 can perform offset adjustment for adding a negative voltage value of the reference voltage VREF, which is a multiple corresponding to the capacitance ratio of each capacitance C provided in the capacitance section 110, to the output analog signal VDAC, in other words, for subtracting a positive voltage value.

Here, a description will be made assuming that the reference voltage VREF is a positive voltage. In the following description, the offset adjustment that adds the voltage value of the reference voltage VREF, which is a multiple corresponding to the capacitance ratio of the capacitance C, to the output analog signal VDAC when the voltage value of the analog signal VDAC with a resolution of 3 bits is output is called the first offset adjustment.

Even in a case where the first offset adjustment is performed on the analog signal VDAC output by the digital-to-analog converter 100, the digital-to-analog converter 100 first samples the voltage value of the input signal VIN in all the capacitance C of the capacitances C0 to C2 and CA1. The operation of the digital-to-analog converter 100 in this case is similar to the operation in a case where the gain of the reference voltage VREF is adjusted with a predetermined gain value. Therefore, a detailed description of the operation of sampling the voltage value of the input signal VIN in a case where the first offset adjustment is performed on the analog signal VDAC output from the digital-to-analog converter 100 will be omitted.

After the voltage value of the input signal VIN is sampled on all the capacitances C of the capacitances C0 to C2 and CA1, the voltage value of the multiple reference voltage VREF, which is according to the ratio of the total capacitance value of all the capacitance C of the capacitances C0 to C2 and CA1 to the total capacitance value of the capacitance C connected to the reference voltage VREF, is added to the voltage value of the sampled input signal VIN. The analog signal VDAC of the added voltage value is output. The operation of the digital-to-analog converter 100 in this case is also similar to the operation in a case where the gain of the reference voltage VREF is adjusted with a predetermined gain value. That is, the open state (OFF state) in which the connection between the input terminal of the input signal VIN and the node of the analog signal VDAC is disconnected by the switch SWS corresponding to the digital signal DS is maintained. Then, the second terminals of the capacitances C0 to C2 and CA1 are connected to either the node of the reference voltage VREF or the node of the ground potential, by the switches SW0 to SW2 and SWA1 corresponding to the digital signals D0 to D2 and DA1, respectively. As a result, the reference voltage VREF corresponding to the weight of the total capacitance value of the capacitance C of the capacitances C0 to C2 and CA1 whose second terminal is connected to the node of the reference voltage VREF is added to the voltage value of the sampled input signal VIN. The added voltage value is output.

However, in a case where the digital-to-analog converter 100 performs the first offset adjustment with respect to the output analog signal VDAC, the analog signal VDAC is offset-adjusted by using the remaining one capacitance C that is not used for the output of the analog signal VDAC having a resolution of 3 bits as the offset adjustment capacitance. More specifically, when outputting an analog signal VDAC with a gain of 1 times and a resolution of 3 bits, the three capacitances C of the capacitances C0 to C2 are used as the voltage value generation capacitances, and an analog signal VDAC of eight output levels, which is obtained by adding a voltage value of (0/7.5) Cu to (7/7.5) Cu times the reference voltage VREF to the voltage value of the input signal VIN, is output. At this time, the capacitance CA1 that is not used for outputting the analog signal VDAC with 3-bit resolution is used for the first offset adjustment of the analog signal VDAC. Further, when outputting an analog signal VDAC with a gain of ½ times and a resolution of 3 bits, the three capacitances C of the capacitances C0 to C1 and CA1 are used as the voltage value generation capacitances, and an analog signal VDAC having eight output levels, which is obtained by adding voltage values of (0/7.5) Cu to (3.5/7.5) Cu times the reference voltage VREF to the voltage value of the input signal VIN, is output. At this time, the capacitance C2 that is not used for outputting the analog signal VDAC with 3-bit resolution is used for the first offset adjustment of the analog signal VDAC.

Here, the relationship between the digital signal D input to the digital-to-analog converter 100 and the first offset-adjusted analog signal VDAC output by the digital-to-analog converter 100 will be described. FIG. 4 is a diagram showing the voltage value of the signal (first offset-adjusted analog signal VDAC) output by the digital-to-analog converter 100 of the present invention. FIG. 4 shows the voltage value of the analog signal VDAC when the first offset adjustment is performed using the capacitance CA1 as the offset adjustment capacitance. Also in FIG. 4, similarly to the case shown in FIGS. 2 and 3 where the analog signal VDAC is gain-adjusted and output, the voltage value of the analog signal VDAC is shown by corresponding with the values of digital signals D0 to D2 and DA1, where the analog signal VDAC output by the digital-to-analog converter 100 with a resolution of 3 bits has eight output levels from output levels 0 to 7. Also in this case, the digital signal DS is a value that is fixed (held) without being changed while being controlled to the open state (off state) in which the connection between the input terminal of the input signal VIN and the node of the analog signal VDAC is cut off in order to maintain the open state (off state) of the switch SWS. Therefore, also in FIG. 4, as in the case shown in FIGS. 2 and 3 where the analog signal VDAC is gain-adjusted and output, the digital signal DS having a fixed value is omitted.

Also in the following description, in FIG. 4, as in the case shown in FIGS. 2 and 3 where the analog signal VDAC is gain-adjusted and output, it is assumed that the voltage value of the input signal VIN is sampled in each of the capacitances C0 to C2 and CA1 provided in the capacitance section 110. Also in FIG. 4, as in the case shown in FIGS. 2 and 3 where the analog signal VDAC is gain-adjusted and output, when the value of the corresponding digital signal D is "0", the node connected to each first terminal of the switch SW is switched to the node of the ground potential. When it is "1", it is switched to the node of the reference voltage VREF.

When the first offset-adjusted analog signal VDAC is output using the capacitance CA1 as the offset adjustment capacitance, the value of the digital signal DA1 is fixed (held) to "1". As in the case where the gain is 1 times as shown in FIG. 2, the analog signal VDAC having eight output levels is output according to the values of the digital signals D0 to D2 (values of the 3-bit digital signal D) corresponding to the three capacitances C of the capacitances C0 to C2 used when the gain is 1 times. The operation of the digital-to-analog converter 100 in this case is similar to the case shown in FIG. 2 where the gain is 1 times. In the operation shown in FIG. 4, since the digital-to-analog converter 100 outputs an analog signal VDAC of the voltage value adjusted with the first offset, the voltage value of the analog signal VDAC output at the value of each digital signal D (digital signals D2, D1, and D0) is different. In FIG. 4, focusing on the voltage value of the first offset-adjusted analog signal VDAC output from the digital-to-analog converter 100, the binary code of a 3-bit digital signal D corresponding to the three capacitances C0 to C2 is used based on the same concept as in the case shown in FIG. 2 where the gain is 1 times.

In the digital-to-analog converter 100, when the value of the digital signal D (digital signals D2, D1, and D0) is "000", the voltage value (=VIN) of the input signal VIN sampled in all the capacitance C of the capacitances C2 to C0 and CA1 included in the capacitance section 110 is subjected to the first offset adjustment using the capacitance CA1, to be output as the analog signal VDAC with an output level of 0. More specifically, when the value of the digital signal D is "000", since the value of the digital signal DA1 is "1", the first terminal of the switch SWA1 is connected to the node of the reference voltage VREF. Therefore, the voltage value obtained by adding the voltage value of the reference voltage VREF (=(0.5/7.5)Cu×VREF), which is according to the ratio of the total capacitance value (=7.5 Cu) of all the capacitance C to the capacitance value (=0.5 Cu) of the capacitance CA1 connected to the reference voltage VREF, to the voltage value (=VIN) of the input signal VIN is output as the first offset-adjusted analog signal VDAC with output level 0. That is, using the capacitance CA1 as the offset adjustment capacitance, the first offset-adjusted analog signal VDAC that adds the voltage value of offset value=(0.5/7.5)Cu×VREF is output.

At this time, the voltage value of the first offset-adjusted analog signal VDAC output from the digital-to-analog converter 100 is expressed by the following equation (14).

$$VDAC=VIN+(0.5/7.5)Cu \times VREF \quad (14)$$

Further, even when the value of the digital signal D is "001", the capacitance CA1 is used as the offset adjustment capacitance, and the first offset adjustment is performed by adding the voltage value of offset value=(0.5/7.5)Cu×VREF. Therefore, the voltage value of the reference voltage VREF (=(1/7.5)Cu×VREF), which is according to the ratio of the total capacitance value (=7.5 Cu) of all the capacitance C and the capacitance value (=1 Cu) of the capacitance C0 connected to the reference voltage VREF, is added to the voltage value (=VIN) of the input signal VIN, and the voltage value of offset value=(0.5/7.5)Cu×VREF is further added, to be output as the analog signal VDAC with output level 1 subjected to the first offset adjustment.

At this time, the voltage value of the analog signal VDAC output from the digital-to-analog converter 100 is expressed by the following equation (15).

$$VDAC=VIN+((1+0.5)/7.5)Cu \times VREF \quad (15)$$

As shown in FIG. 4, the voltage value of the analog signal VDAC corresponding to the value of the digital signal D is added to the voltage value of the offset value=(0.5/7.5)Cu× VREF using the capacitance CA1, to be output as the analog signal VDAC of each output level subjected to the first offset adjustment.

Even when the value of the digital signal D is "111", the first offset adjustment is performed with the voltage value of offset value=(0.5/7.5)Cu×VREF using the capacitance CA1. For this reason, the digital-to-analog converter 100 adds the voltage value of the reference voltage VREF (=(7/7.5)Cu× VREF), which is according to the ratio of the total capacitance value (=7.5 Cu) of all the capacitance C and the total capacitance value (=7 Cu) of the capacitances C2 to C0 connected to the reference voltage VREF, to the voltage value (=VIN) of the input signal VIN, and further adds the voltage value of offset value=(0.5/7.5)Cu×VREF, to output as the analog signal VDAC having an output level 7 subjected to the first offset adjustment.

At this time, the voltage value of the analog signal VDAC output by the digital-to-analog converter 100 is expressed by the following equation (16).

$$VDAC=VIN+((7+0.5)/7.5)Cu \times VREF \quad (16)$$

In a case where the first offset adjustment is performed when outputting the voltage value of the analog signal VDAC, the voltage value of offset value=(0.5/7.5) Cu×VREF using the capacitance CA1 is added to the voltage value of the analog signal VDAC corresponding to the value of the digital signal D, to perform offset adjustment for the analog signal VDAC of each output level. In the first offset adjustment, when the digital-to-analog converter 100 outputs the analog signal VDAC, the second terminal of the capacitance CA1 is connected to the node of the ground potential by the switch SWA1, so that the analog signal VDAC can be output without performing the first offset adjustment. That is, the first offset adjustment can be canceled even while the digital-to-analog converter 100 is outputting the analog signal VDAC.

Even when the digital-to-analog converter 100 performs the first offset adjustment, as shown in FIG. 4, the variation width of the voltage value of the analog signal VDAC to be output (the voltage value of the analog signal VDAC of the preceding and following output levels is $(1/7.5)$Cu×VREF, which is the same as the case where the gain shown in FIG. 2 is 1 times. Even when the digital-to-analog converter 100 makes the first offset adjustment, the range of the voltage value (output amplitude) of the analog signal VDAC output by the digital-to-analog converter 100 is $(7/7.5)$Cu×VREF, which is the same as the case where the gain shown in FIG. 2 is 1 times.

Note that the capacitance C2 is used for the first offset adjustment when the digital-to-analog converter 100 outputs the analog signal VDAC whose gain has been adjusted to ½ times. In this case, the offset value is a value based on the capacitance value (=4 Cu) of the capacitance C2. Therefore, when outputting the analog signal VDAC whose gain is adjusted to ½ times, the first offset adjustment is performed for adding the voltage value of the offset value=$(4/7.5)$Cu× VREF. The operation in this case is an operation for setting the value of the digital signal D2 to "1" when the gain shown in FIG. 3 is ½ times, and this can be thought to be similar to the first offset adjustment using the capacitance CA1. Therefore, detailed description of the operation of performing the first offset adjustment using the capacitance C2 for the analog signal VDAC output from the digital-to-analog converter 100 is omitted.

In the above description, the first offset adjustment is performed as the operation when the digital-to-analog converter 100 performs the offset adjustment when outputting the voltage value of the analog signal VDAC having the 3-bit resolution. However, the offset adjustment when outputting the voltage value of the analog signal VDAC with a resolution of 3 bits is not limited to the first offset adjustment.

Next, an operation in the case of performing offset adjustment when sampling the voltage value of the input signal VIN in each of the capacitances C included in the capacitance section 110 will be described.

Note that when the high potential side of the reference voltage VREF is a positive voltage and the low potential side is a ground (GND) potential, an offset adjustment can be performed by subtracting from to the output analog signal VDAC the positive voltage value of the reference voltage VREF, which is a multiple corresponding to the capacitance ratio of each capacitance C provided in the capacitance section 110. On the other hand, when the high potential side of the reference voltage VREF is the ground (GND) potential and the low potential side is a negative voltage, an offset adjustment can be performed by subtracting from to the output analog signal VDAC the negative voltage value of the reference voltage VREF, which is a multiple corresponding to the capacitance ratio of each capacitance C provided in the capacitance section 110, in other words, by adding the positive voltage value.

Here, description will be made assuming that the reference voltage VREF is a positive voltage. In the following description, the offset adjustment for subtracting the voltage value of the reference voltage VREF that is a multiple corresponding to the capacitance ratio of each capacitance C included in the capacitance section 110 when sampling the voltage value of the input signal VIN is called a second offset adjustment.

When the second offset adjustment is performed on the analog signal VDAC output from the digital-to-analog converter 100, the voltage value of the input signal VIN is sampled in a state where the second terminal of some capacitance C among the capacitances C0 to C2 and CA1 is connected to the node of the reference voltage VREF.

For example, the voltage value of the input signal VIN is sampled while the second terminal of the capacitance CA1 is connected to the node of the reference voltage VREF. In this case, the switch SWS corresponding to the digital signal DS connects the input terminal of the input signal VIN and the node of the analog signal VDAC (in a short-circuited state), the second terminals of capacitances C0 to C2 are connected to the node of the ground potential by the switches SW0 to SW2, and the switch SWA1 connects the second terminal of capacitance CA1 to the node of reference voltage VREF. As a result, each of the capacitances C0 to C2 is charged with electric charges according to the potential difference between the potential of the input signal VIN and the ground potential, and the capacitance CA1 is charged with a charge corresponding to the potential difference between the potential of the input signal VIN and the potential of the reference voltage VREF. After that, the connection between the input terminal of the input signal VIN and the node of the analog signal VDAC is cut off (opened) by the switch SWS corresponding to the digital signal DS. As a result, the charged electric charge is held (stored) in each of the capacitances C0 to C2 and CA1. In this way, when the second offset adjustment is performed on the output analog signal VDAC, depending on the control of the input digital signal DS and the digital signals D0 to D2 and DA1, different voltage values are sampled in the capacitances C0 to C2 and CA1.

At this time, the voltage value of the analog signal VDAC output from the digital-to-analog converter 100 is represented by the above equation (1). On the other hand, the charge Q sampled on the entire capacitance section 110 is represented by the following equation (17).

$$Q = (7.5\text{Cu} \times \text{VIN}) - (0.5\text{Cu} \times \text{VREF}) \quad (17)$$

After that, even when the second offset adjustment is performed on the analog signal VDAC output by the digital-to-analog converter 100, the digital-to-analog converter 100 outputs an analog signal VDAC having eight output levels according to the value of the 3-bit digital signal D. That is, the digital-to-analog converter 100 outputs an analog signal VDAC of a voltage value obtained by adding to the voltage value of the sampled input signal VIN the voltage value of the reference voltage VREF, which is a multiple according to the ratio of the sum of the capacitance values of all the capacitances C of the capacitances C0 to C2 and CA1 to the sum of the capacitance values of the capacitances C connected to the reference voltage VREF. The operation of the digital-to-analog converter 100 in this case is also similar to the operation when the voltage value of the reference voltage VREF is adjusted by a predetermined gain value. That is, the open state (OFF state) in which the connection between the input terminal of the input signal VIN and the node of the analog signal VDAC is disconnected by the switch SWS corresponding to the digital signal DS is maintained. The second terminals of the capacitances C0 to C2 and CA1 are connected to one of the nodes of the reference voltage VREF and the ground potential by the switches SW0 to SW2 and SWA1 corresponding to the digital signals D0 to D2 and DA1. As a result, the voltage value obtained by adding the reference voltage VREF corresponding to the weight of the total capacitance value of the capacitance C of the capacitances C0 to C2 and CA1 whose second terminal is connected to the node of the reference voltage VREF to the voltage value of the sampled input signal VIN is output.

However, when the second offset adjustment is performed on the analog signal VDAC output from the digital-to-analog converter 100, as described above, at the time of sampling, the electric charge corresponding to the potential difference between the potential of the input signal VIN and the potential of the reference voltage VREF is accumulated in the capacitance CA1. Therefore, the voltage value of the second offset-adjusted analog signal VDAC output from the digital-to-analog converter 100 is lower by the voltage value corresponding to 0.5 Cu×VREF in the second term on the right side of the above equation (17) when the second terminal of the capacitance CA1 is connected to the ground potential node by the switch SWA1.

In the second offset adjustment, the second offset adjustment can be canceled by sampling a different voltage value again, that is, by re-sampling the voltage value to each capacitance C. Further, in the second offset adjustment, the capacitance C (hereinafter, referred to as "gain adjustment capacitance") used for gain adjustment of the amplitude (voltage value range) of the voltage value of the analog signal VDAC to be output is used as the offset adjustment capacitance. In this case, the analog signal VDAC can be output without performing the second offset adjustment. That is, when the gain adjustment capacitance is used as the offset adjustment capacitance, the second offset adjustment can be canceled even while the digital-to-analog converter 100 is outputting the analog signal VDAC. In this case, in the digital-to-analog converter 100, when outputting the analog signal VDAC, the switch SW corresponding to the gain adjustment capacitance connects the second terminal of the gain adjustment capacitance to the node of the reference voltage VREF.

Here, the relationship between the digital signal D input to the digital-to-analog converter 100 and the second offset-adjusted analog signal VDAC output by the digital-to-analog converter 100 will be described. FIGS. 5A and 5B are diagrams showing the voltage value of the signal (the second offset-adjusted analog signal VDAC) output by the digital-to-analog converter 100 of the present invention. FIG. 5A shows the value of each digital signal D that is controlled when the digital-to-analog converter 100 samples the voltage value of the input signal VIN in each of the capacitances C of the capacitances C0 to C2 and CA1. When the second offset adjustment is performed on the analog signal VDAC using the capacitance CA1 as the offset adjustment capacitance, by setting the value of each digital signal D to the value shown in FIG. 5A, the voltage value of the input signal VIN is sampled with the second terminal of the capacitance CA1 connected to the node of the reference voltage VREF. Further, FIG. 5B shows the voltage value of the analog signal VDAC when the digital-to-analog converter 100 performs the second offset adjustment using the capacitance CA1 as the offset adjustment capacitance. Also in FIG. 5B, similarly to the case where the gain of the analog signal VDAC shown in FIGS. 2 and 3 is adjusted and output, the 3-bit resolution analog signal VDAC output by the digital-to-analog converter 100 has eight output levels from output level 0 to output level 7. The voltage value of the analog signal VDAC is shown in association with the values of the digital signals D0 to D2 and DA1. Also in this case, in order to maintain the open state (off state) of the switch SWS, the digital signal DS is a value that is fixed (held) without being changed while being controlled in an open state (off state) in which the connection between the input terminal of the input signal VIN and the node of the analog signal VDAC is cut off. Therefore, also in FIG. 5B, like the case where the analog signal VDAC shown in FIGS. 2 and 3 is adjusted in gain and output, the digital signal DS having a fixed value is omitted.

In the following description, it is assumed that the voltage value of the input signal VIN is sampled in the state where the second terminal of the capacitance CA1 is connected to the node of the reference voltage VREF in FIG. 5B. Note that, also in FIG. 5B, similarly to the case where the analog signal VDAC shown in FIG. 2 and FIG. 3 is output after gain adjustment, the nodes connected to the respective first terminals of the switch SW are the corresponding digital signals D. When the value of is "0", it is switched to the node of the ground potential, and when it is "1", it is switched to the node of the reference voltage VREF.

Even when the digital-to-analog converter 100 outputs the second offset-adjusted analog signal VDAC using the capacitance CA1 as the offset adjustment capacitance, the value of the digital signal DA1 is fixed (held) to "0" as in the case where the analog signal VDAC shown in FIGS. 2 and 3 is gain-adjusted and output. Then, as in the case where the gain is 1 times as shown in FIG. 2, the analog signal VDAC with eight output levels is output, depending on the values of the digital signals D0 to D2 (values of the 3-bit digital signal D) corresponding to the three capacitances C of the capacitances C0 to C2 used when the gain is 1 times. The operation of the digital-to-analog converter 100 in this case is similar to the case where the gain shown in FIG. 2 is 1 times. However, in the operation shown in FIG. 5B, since the digital-to-analog converter 100 outputs the analog signal VDAC having the voltage value for which the second offset adjustment has been performed, the voltage value of the analog signal VDAC output at the value of each digital signal D (digital signals D2, D1, and D0) is different. In FIG. 5B, focusing on the voltage value of the second offset-adjusted analog signal VDAC output from the digital-to-analog converter 100, the binary code of the 3-bit digital signal D corresponding to the three capacitances C of capacitances C0 to C2 based on the same concept as when the gain shown in FIG. 2 is 1 times is used.

When the value of the digital signal D (digital signals D2, D1, and D0) is "000", the voltage value (=VIN) of the input signal VIN sampled in all the capacitances C of the capacitances C2 to C0 and CA1 provided in the capacitance section 110 is subjected to the second offset adjustment using the capacitance CA1 and output as the analog signal VDAC with an output level of 0. More specifically, the voltage value obtained by subtracting the voltage value (=(0.5/7.5) Cu×VREF) of the reference voltage VREF according to the ratio of the total capacitance value (=7.5 Cu) of all the capacitances C and the capacitance value (=0.5 Cu) of the capacitance CA1 from the sampled voltage value (=VIN) of the input signal VIN is output as the analog signal VDAC of the output level 0 with the second offset adjustment. That is, the capacitance CA1 is used as the offset adjustment capacitance, and the second offset-adjusted analog signal VDAC that subtracts the voltage value of the offset value=(0.5/7.5) Cu×VREF is output.

At this time, the voltage value of the second offset-adjusted analog signal VDAC output from the digital-to-analog converter 100 is expressed by the following equation (18).

$$VDAC = VIN - (0.5/7.5) Cu \times VREF \qquad (18)$$

Further, even when the value of the digital signal D is "001", the capacitance CA1 is used as an offset adjustment capacitance and the second offset adjustment is performed by subtracting the voltage value of offset value=(0.5/7.5) Cu×VREF. Therefore, the voltage value (=(1/7.5)Cu× VREF) of the reference voltage VREF according to the ratio of the total capacitance value (=7.5 Cu) of all the capacitances C to the capacitance value (=1 Cu) of the capacitance C0 connected to the reference voltage VREF is added to the voltage value (=VIN) of the input signal VIN. Further, the voltage value of offset value=(0.5/7.5)Cu×VREF is subtracted, and the analog signal VDAC of the output level 1 with the second offset adjustment is output.

At this time, the voltage value of the analog signal VDAC output by the digital-to-analog converter 100 is expressed by the following equation (19).

$$VDAC=VIN+((1-0.5)/7.5)Cu\times VREF \qquad (19)$$

Similarly, as shown in FIG. 5B, the voltage value of offset value=(0.5/7.5)Cu×VREF using the capacitance CA1 is subtracted from the voltage value of the analog signal VDAC corresponding to the value of the digital signal D, and output as an analog signal VDAC of each output level adjusted for the second offset.

Then, even when the value of the digital signal D is "111", the second offset adjustment is performed by the voltage value of offset value=(0.5/7.5)Cu×VREF using the capacitance CA1. Therefore, the voltage value of the reference voltage VREF (=(7/7.5)Cu×VREF), which is according to the ratio of the total capacitance value (=7.5 Cu) of all the capacitances C to the total capacitance value (=7 Cu) of the capacitances C2 to C0 connected to the reference voltage VREF, is added to the voltage value (=VIN) of the input signal VIN. Further, the voltage value of offset value=(0.5/ 7.5)Cu×VREF is subtracted and output as an analog signal VDAC of output level 7 with a second offset adjustment.

At this time, the voltage value of the analog signal VDAC output by the digital-to-analog converter 100 is expressed by the following equation (20).

$$VDAC=VIN+((7-0.5)/7.5)Cu\times VREF \qquad (20)$$

As described above, when the second offset adjustment is performed when the voltage value of the analog signal VDAC is output, the voltage value of offset value=(0.5/7.5) Cu×VREF using the capacitance CA1 is subtracted from the voltage value of the analog signal VDAC corresponding to the value of the digital signal D, and the offset adjustment is performed on the analog signal VDAC of each output level.

Even when the digital-to-analog converter 100 performs the second offset adjustment, as shown in FIG. 5B, the variation width of the voltage value of the analog signal VDAC to be output (the difference between the voltage values of the analog signal VDAC of the output levels before and after) is (1/7.5)Cu×VREF, which is the same as in the case where the gain shown in FIG. 2 is 1 times. Even when the digital-to-analog converter 100 performs the second offset adjustment, as shown in FIG. 5B, the voltage value range (output amplitude) of the analog signal VDAC output by the digital-to-analog converter 100 is (7/7.5)Cu×VREF, which is the same as in the case where the gain shown in FIG. 2 is 1 times.

In the second offset adjustment in the digital-to-analog converter 100 described above, the case where the voltage value of offset value=(0.5/7.5)Cu×VREF is subtracted by using the capacitance CA1 as the offset adjustment capacitance has been described. However, in the digital-to-analog converter 100, the second offset adjustment can be performed by using the capacitance C other than the capacitance CA1 as the offset adjustment capacitance.

Here, an example of the operation when the second offset adjustment is performed using the capacitance C other than the capacitance CA1 included in the capacitance section 110 as the offset adjustment capacitance will be described. The operation in the case where the digital-to-analog converter 100 uses the capacitance C other than the capacitance CA1 included in the capacitance section 110 as the offset adjustment capacitance to perform the second offset adjustment is the same as the operation in the case of performing the second offset adjustment using the above-mentioned capacitance CA1 as the offset adjustment capacitance. However, when the second offset adjustment is performed by using the capacitance C other than the capacitance CA1 included in the capacitance section 110 as the offset adjustment capacitance, the capacitance C for sampling different voltage values is different. In the following description, focusing on the control of the capacitance C in which the digital-to-analog converter 100 samples different voltage values and the voltage value of the second offset-adjusted analog signal VDAC output by the digital-to-analog converter 100, the binary code of the 3-bit digital signal D corresponding to the three capacitances C of the capacitances C0 to C2, which is based on the same concept as the case where the gain shown in FIG. 2 is 1 times, will be described.

FIGS. 6A and 6B are diagrams showing the voltage value of the signal (the second offset-adjusted analog signal VDAC) output by the digital-to-analog converter 100 of the present invention. FIGS. 6A and 6B show an example of the case where the digital-to-analog converter 100 outputs the second offset-adjusted analog signal VDAC using the capacitance C2 as the offset adjustment capacitance. FIG. 6A shows the value of each digital signal D that is controlled when the digital-to-analog converter 100 causes each of the capacitances C0 to C2 and CA1 to sample the voltage value of the input signal VIN. Further, FIG. 6B shows the voltage value of the analog signal VDAC when the digital-to-analog converter 100 performs the second offset adjustment using the capacitance C2 as the offset adjustment capacitance. Also in FIG. 6B, as in the case where the analog signal VDAC shown in FIGS. 2 and 3 is gain-adjusted and output, the analog signal VDAC with 3-bit resolution output from the digital-to-analog converter 100 is set to eight output levels from output level 0 to output level 7, and the voltage values of the analog signal VDAC are shown in association with the values of the digital signals D0 to D2 and DA1. Also in this case, in order to maintain the open state (off state) of the switch SWS, the digital signal DS is a value that is fixed (held) without being changed while being controlled in an open state (off state) in which the connection between the input terminal of the input signal VIN and the node of the analog signal VDAC is cut off. Therefore, also in FIG. 6B, similarly to the case where the analog signal VDAC shown in FIGS. 2 and 3 is adjusted in gain and output, the digital signal DS having a fixed value is omitted.

When the second offset adjustment is performed on the analog signal VDAC by using the capacitance C2 as the offset adjustment capacitance, by setting the value of each digital signal D to the value shown in FIG. 6A, as described above, the voltage value of the input signal VIN is sampled in a state where the second terminal of C2 is connected to the node of the reference voltage VREF.

Then, for the output analog signal VDAC, the second offset adjustment of the voltage value of offset value=(4/ 7.5)Cu×VREF using the capacitance C2 is performed. As a result, the digital-to-analog converter 100 outputs the analog signal VDAC having the voltage value shown in FIG. 6B. That is, in each of the analog signals VDAC of eight output levels, the second offset-adjusted analog signal VDAC that subtracts the voltage value of offset value=(4/7.5)Cu×VREF is output.

For example, when the value of the digital signal D is "001", the capacitance C2 is used as an offset adjustment capacitance, the second offset adjustment is performed by subtracting the voltage value of Offset value=(4/7.5)Cu× VREF. In this case, the voltage value of the reference voltage VREF (=(1/7.5)Cu×VREF), corresponding to the ratio of the total capacitance value (=7.5 Cu) of all the capacitances C and the capacitance value (=1 Cu) of the capacitance C0 connected to the reference voltage VREF, is added to the voltage value (=VIN) of the input signal VIN. Further, the voltage value of offset value=(4/7.5)Cu×VREF is subtracted, and the analog signal VDAC of the output level 1 with the second offset adjustment is output.

At this time, the voltage value of the analog signal VDAC output from the digital-to-analog converter 100 is expressed by the following equation (21).

$$VDAC=VIN+((1-4)/7.5)Cu \times VREF \qquad (21)$$

As described above, when the second offset adjustment using the capacitance C2 is performed when the voltage value of the analog signal VDAC is output, the voltage value of offset value=(4/7.5)Cu×VREF is subtracted from the voltage value of the analog signal VDAC corresponding to the value of the digital signal D, and the offset adjustment is performed on the analog signal VDAC of each output level.

Even when the digital-to-analog converter 100 performs the second offset adjustment using the capacitance C2, as shown in FIG. 6B, the range of change in the voltage value of the analog signal VDAC to be output (difference in voltage value of the analog signal VDAC of the output levels before and after) is (1/7.5)Cu×VREF similar to the case where the gain shown in FIG. 2 is 1 times. Even when the digital-to-analog converter 100 performs the second offset adjustment using the capacitance C2, as shown in FIG. 6B, the range of the voltage value of the analog signal VDAC output by the digital-to-analog converter 100 (the output amplitude) is (7/7.5)Cu×VREF, which is the same as when the gain shown in FIG. 2 is 1 times.

FIGS. 7A and 7B are diagrams showing still another voltage value of the signal (the second offset-adjusted analog signal VDAC) output by the digital-to-analog converter 100 of the present invention. FIGS. 7A and 7B show an example of the case where the digital-to-analog converter 100 outputs the second offset-adjusted analog signal VDAC using the capacitance C1 as the offset adjustment capacitance. FIG. 7A shows the value of each digital signal D that is controlled when the digital-to-analog converter 100 causes each of the capacitances C0 to C2 and CA1 to sample the voltage value of the input signal VIN. Further, FIG. 7B shows the voltage value of the analog signal VDAC when the digital-to-analog converter 100 performs the second offset adjustment using the capacitance C1 as the offset adjustment capacitance. Also in FIG. 7B, as in the case where the analog signal VDAC shown in FIGS. 2 and 3 is output after gain adjustment, the analog signal VDAC with 3-bit resolution output from the digital-to-analog converter 100 is set to eight output levels from output level 0 to output level 7, and the voltage value of the analog signal VDAC is shown in association with the values of the digital signals D0 to D2 and DA1. Also in this case, in order to maintain the open state (off state) of the switch SWS, the digital signal DS is a value that is fixed (held) without being changed while being controlled in an open state (off state) in which the connection between the input terminal of the input signal VIN and the node of the analog signal VDAC is cut off. Therefore, also in FIG. 7B, similarly to the case where the analog signal VDAC shown in FIGS. 2 and 3 is adjusted in gain and output, the digital signal DS having a fixed value is omitted.

In the digital-to-analog converter 100, when the second offset adjustment is performed on the analog signal VDAC using the capacitance C1 as the offset adjustment capacitance, by setting the value of each digital signal D is set to the value shown in FIG. 7A, as described above, the voltage value of the input signal VIN is sampled in the state where the second terminal of the capacitance C1 is connected to the node of the reference voltage VREF.

After that, for the output analog signal VDAC, the second offset adjustment of the voltage value of the offset value= (2/7.5)Cu×VREF using the capacitance C1 is performed. As a result, the analog signal VDAC having the voltage value shown in FIG. 7B is output. That is, the digital-to-analog converter 100 outputs the second offset-adjusted analog signal VDAC that subtracts the voltage value of the offset value=(2/7.5)Cu×VREF in each of the analog signals VDAC of eight output levels.

For example, when the value of the digital signal D is "001", the capacitance C1 is used as an offset adjustment capacitance, and the second offset adjustment is performed by subtracting the voltage value of offset value=(2/7.5)Cu× VREF. In this case, the digital-to-analog converter 100 adds the voltage value of the reference voltage VREF (=(1/7.5) Cu×VREF), which corresponds to the ratio of the total capacitance value (=7.5 Cu) of all the capacitances C and the capacitance value (=1 Cu) of the capacitance C0 connected to the reference voltage VREF, to the voltage value (=VIN) of the input signal VIN. Further, the voltage value of offset value=(2/7.5)Cu×VREF is subtracted, and the analog signal VDAC of the output level 1 with the second offset adjustment is output.

At this time, the voltage value of the analog signal VDAC output from the digital-to-analog converter 100 is expressed by the following equation (22).

$$VDAC=VIN+((1-2)/7.5)Cu \times VREF \qquad (22)$$

As described above, in a case where the digital-to-analog converter 100 performs the second offset adjustment using the capacitance C1 when outputting the voltage value of the analog signal VDAC, the voltage value of offset value=(2/ 7.5)Cu×VREF is subtracted from the voltage value of the analog signal VDAC corresponding to the value of the digital signal D, and the offset adjustment is performed on the analog signal VDAC of each output level.

Even when the digital-to-analog converter 100 performs the second offset adjustment using the capacitance C1, as shown in FIG. 7B, the range of change in the voltage value of the analog signal VDAC to be output (difference in the voltage value of the analog signal VDAC of the output levels before and after) is (1/7.5)Cu×VREF, which is the same as when the gain shown in FIG. 2 is 1 times. Even when the digital-to-analog converter 100 performs the second offset adjustment using the capacitance C1, as shown in FIG. 7B, the range of the voltage value (output amplitude) of the analog signal VDAC output by the digital-to-analog converter 100 is (7/7.5)Cu×VREF, which is the same as when the gain shown in FIG. 2 is 1 times.

In addition, in the second offset adjustment in the digital-to-analog converter 100 described above, the case where any one capacitance C included in the capacitance section 110 is used as the offset adjustment capacitance to subtract the voltage value of the offset value has been described. However, the capacitance C used by the digital-to-analog converter 100 in the second offset adjustment is not limited to one capacitance C included in the capacitance section 110, and the second offset adjustment can be performed by using a plurality of capacitances C included in the capacitance section 110 as offset adjustment capacitances. Note that the operation of the digital-to-analog converter 100 in this case can be easily considered by considering it in the same manner as the operation when the second offset adjustment described above is performed. Therefore, a detailed description of the operation of performing the second offset adjustment by using the plurality of capacitances C included in the capacitance section 110 as the offset adjustment capacitances for the analog signal VDAC output from the digital-to-analog converter 100 will be omitted.

Further, regarding the offset adjustment in the digital-to-analog converter 100, the first offset adjustment method and the second offset adjustment method have been described separately. However, the digital-to-analog converter 100 can also perform the first offset adjustment and the second offset adjustment at the same time, that is, the offset adjustment combined with the first offset adjustment and the second offset adjustment can be performed. For example, in the digital-to-analog converter 100, when performing the second offset adjustment using the capacitance C2 shown in FIGS. 6A and 6B as the offset adjustment capacitance, similar to the first offset adjustment using the capacitance CA1 shown in FIG. 4 as the offset adjustment capacitance, the value of the digital signal DA1 may be fixed (held) at "1". In this case, in the digital-to-analog converter 100, the offset adjustment can be performed by combining the second offset adjustment for subtracting the voltage value of offset value=(4/7.5)Cu×VREF and the first offset adjustment for adding the voltage value of offset value=(0.5/7.5)Cu×VREF. That is, the digital-to-analog converter 100 can output the analog signal VDAC with offset adjustment that subtract the voltage value of offset value=((4−0.5)/7.5)Cu×VREF=(3.5/7.5)Cu×VREF in each analog signal VDAC of the eight output levels. The operation of the digital-to-analog converter 100 in this case can be easily considered by combining the above-mentioned operation when performing the first offset adjustment and the above-mentioned operation when performing the second offset adjustment. Therefore, a detailed description of the operation when performing the offset adjustment combined with the first offset adjustment and the second offset adjustment for the analog signal VDAC output from the digital-to-analog converter 100 is omitted.

As described above, in the digital-to-analog converter 100, the capacitance C provided in the capacitance section 110 is used as an offset adjustment capacitance, and the voltage value of the analog signal VDAC with a 3-bit resolution that is output by adjusting the gain to 1 times or ½ times can be offset. As a result, in the digital-to-analog converter 100, it is possible to realize the analog signal VDAC switched in a plurality of voltage value ranges in which the gain adjustment is further offset adjusted, while suppressing an increase in the area required to be formed.

In the above-described digital-to-analog converter 100, the configuration in which the output analog signal VDAC is an analog signal having a resolution of 3 bits has been described. However, the resolution of the analog signal VDAC output by the digital-to-analog converter 100 is not limited to 3 bits. For example, even in a digital-to-analog converter having a resolution of a larger number of bits, the configuration and operation can be easily considered by applying the concept of the configuration and operation of the digital-to-analog converter 100 described above. Therefore, a detailed description of the configuration and operation of the digital-to-analog converter having a higher bit resolution will be omitted.

In the digital-to-analog converter 100 described above, the configuration for outputting the analog signal VDAC has been described using two types of reference voltages VREF, that is, the high-potential-side reference voltage VREF and the low-potential-side reference voltage VREF (in FIG. 1, ground (GND)) are provided. However, in the digital-to-analog converter 100, the number and types of reference voltages VREF used to output the analog signal VDAC are not particularly specified. For example, the digital-to-analog converter 100 may be configured to use different reference voltages VREF when sampling the voltage value of the input signal VIN and when generating the voltage value of the analog signal VDAC, using the three types of reference voltages VREF. In this case, the switch section 120 included in the digital-to-analog converter 100, by using the respective switches SW, makes the node of the reference voltage VREF connected to the corresponding capacitance C different between when the voltage value of the input signal VIN is sampled and when the voltage value of the analog signal VDAC is generated.

Further, the above-described digital-to-analog converter 100 has been described with respect to the configuration for outputting the analog signal VDAC whose gain is adjusted to 1 times or ½ times. However, the gain adjustment in the digital-to-analog converter of the present invention is not limited to the above-described 1 times or ½ times. It is also possible to output an analog signal VDAC in which the voltage value range (output amplitude) of the analog signal VDAC to be output is further adjusted to 1/k times (k=2 or more multipliers of 2).

(First Modification of Digital-to-Analog Converter)

Here, as an example of a digital-to-analog converter having a configuration in which the range of the voltage value (output amplitude) of the analog signal VDAC to be output is adjusted to 1/k times (k=2 or more multipliers of 2), the digital-to-analog converter when k=4 will be described. That is, a digital-to-analog converter having a configuration for outputting the analog signal VDAC in which the gain of the voltage value range (output amplitude) is adjusted to ¼ times will be described.

Figure 8:
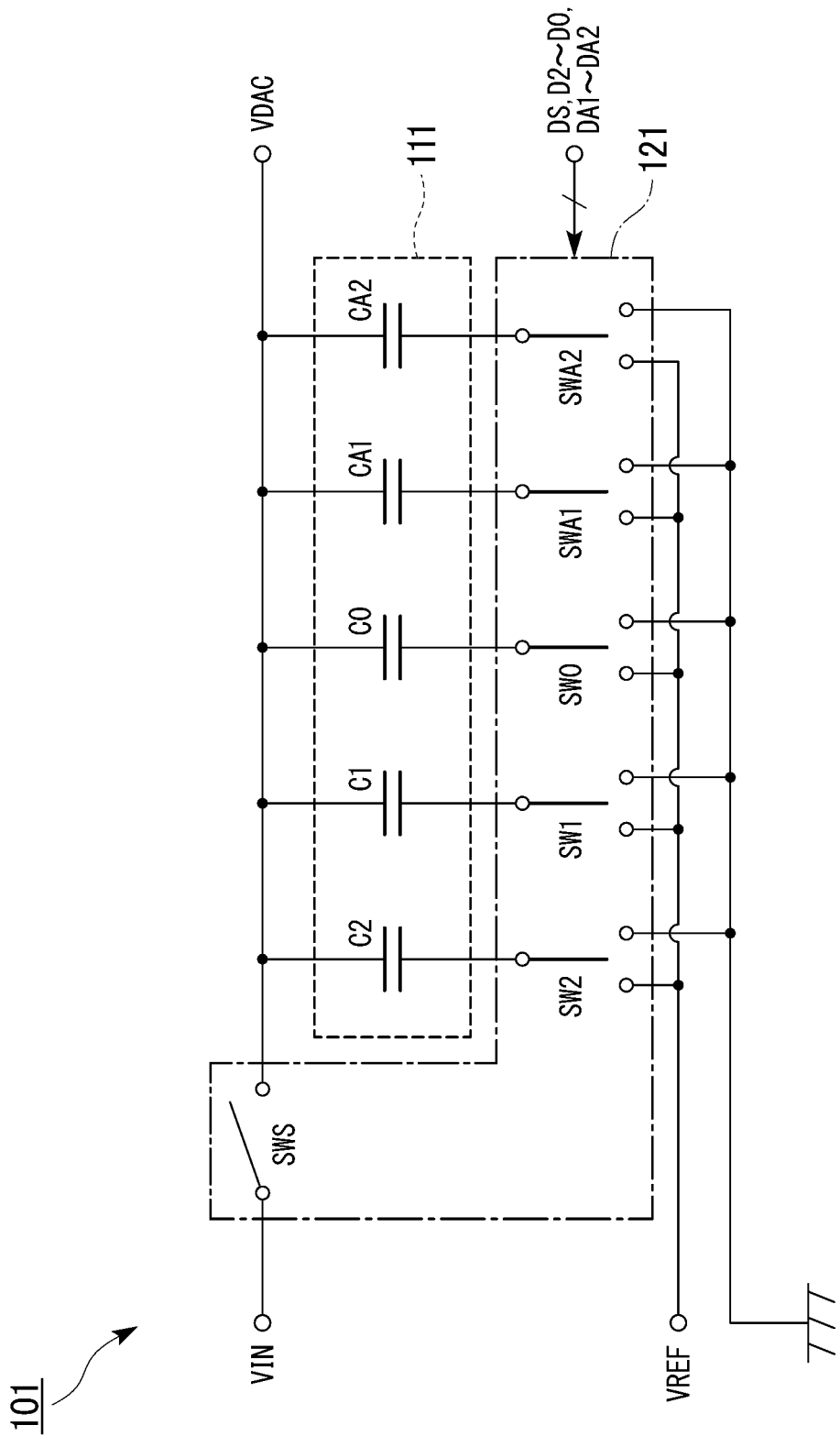
FIG. 8 is a block diagram showing an example of a configuration of a first modified example of the digital-to-analog converter of the present invention.

FIG. 8 is a block diagram showing an example of the configuration of the first modification of the digital-to-analog converter of the present invention. The digital-to-analog converter 101 shown in FIG. 8 is a digital-to-analog converter that outputs an analog signal VDAC with 3-bit resolution based on the input signal VIN and the reference voltage VREF that are input. The digital-to-analog converter 101 includes a capacitance section 111 including a plurality of binary weighted capacitances C, and a switch section 121 including a plurality of switches SW corresponding to the respective capacitances C included in the capacitance section 111. Depending on the digital signal D (digital signals D0 to D2, DA1, and DA2) input from the external control circuit, the digital-to-analog converter 101 adjusts the gain to 1 times, ½ times, or ¼ times, and adds or subtracts the voltage value of the reference voltage VREF whose gain is adjusted to a predetermined multiple to the voltage value of the input signal VIN, and outputs it as the analog signal VDAC.

The capacitance section 111 includes capacitances C0 to C2, CA1, and CA2. The switch section 121 includes switches SWS, SW0 to SW2, SWA1, and SWA2. The switches SW0 to SW2, SWA1, and SWA2 correspond to the capacitances C0 to C2, CA1, and CA2, respectively. More specifically, the switch SW0 corresponds to the capacitance C0. The switch SW1 corresponds to the capacitance C1. The switch SW2 corresponds to the capacitance C2. The switch SWA1 corresponds to the capacitance CA1. The switch SWA2 corresponds to the capacitance CA2. The capacitances CA1 and CA2 included in the capacitance section 111 and the switches SWA1 and SWA2 included in the switch section 121 are capacitances and switches added to adjust the gain of the output amplitude of the analog signal VDAC output by the digital-to-analog converter 101.

The constituent elements of the digital-to-analog converter 101 shown in FIG. 8 include the same constituent elements as the constituent elements of the digital-to-analog converter 100 shown in FIG. 1. Therefore, in the constituent elements of the digital-to-analog converter 101, the same constituent elements as the constituent elements of the digital-to-analog converter 100 are denoted by the same reference numerals, and a detailed description of each constituent element is omitted.

The capacitances C0 to C2 and CA1 are connected in the same manner as the capacitances C0 to C2 and CA1 provided in the capacitance section 110 in the digital-to-analog converter 100. The first terminal of the capacitance CA2 is also connected in parallel to the node of the analog signal VDAC output by the digital-to-analog converter 101. Further, the second terminal of the capacitance CA2 is connected to the first terminal of the corresponding switch SWA2 in the switch section 121. Each of the capacitances C0 to C2, CA1, and CA2 is binary weighted by the capacitance value. More specifically, when the capacitance value of the capacitance C0 is set to 1 times, the capacitance values of the capacitance C1 and the capacitance C2 are 2 times and 4 times, respectively. The capacitance values of the capacitances CA1 and CA2 are ½ times and ¼ times. Note that the weighting of the capacitance value of each of the capacitances C0 to C2, CA1, and CA2 may be other than a binary number.

Therefore, assuming that the capacitance value of the capacitance C0 is 1 Cu as a reference, the capacitance value of the capacitance C1 is 2 Cu and the capacitance value of the capacitance C2 is 4 Cu. The capacitance value of the capacitance CA1 is 0.5 Cu, and the capacitance value of the capacitance CA2 is 0.25 Cu. The sum of the capacitance values of all the capacitances C included in the capacitance portion 111 (total capacitance value of the capacitance portion 111) is 7.75 Cu.

Each of the switches SWS, SW0 to SW2, and SWA1 has the same function as each of the switches SWS, SW0 to SW2, and SWA1 provided in the switch section 120 in the digital-to-analog converter 100, and are connected as well. Further, the switch SWA2 is a switch that connects (short-circuits) the second terminal of the corresponding capacitance CA2 in the capacitance section 111 to one of the high potential side node and the low potential side node of the reference voltage VREF. In FIG. 8, as in FIG. 1, the node on the high potential side of the reference voltage VREF is the node connected to the input terminal of the high potential of the reference voltage VREF, and the case where the node on the low potential side is the node of the ground (GND) potential is shown.

The first terminal of the switch SWA2 is connected to the second terminal of the corresponding capacitance CA2. The second terminal of the switch SWA2 is connected to the node of the reference voltage VREF. The third terminal of the switch SWA2 is connected to the ground potential node. The control terminal of the switch SWA2 is connected to the input terminal of a digital signal DA2 which is a control signal for controlling the switch SWA2. The switch SWA2 switches the node connected to the first terminal to either one of the reference voltage VREF and the ground potential according to the corresponding digital signal DA2. That is, the switch SWA2 connects the second terminal of the corresponding capacitance CA2 to either the reference voltage VREF node or the ground potential node according to the corresponding digital signal DA2.

The operation when the digital-to-analog converter 101 outputs the analog signal VDAC is basically the same as the operation of the digital-to-analog converter 100, except that the gain is adjusted to ¼ times. That is, also in the digital-to-analog converter 101, similarly to the digital-to-analog converter 100, first, the voltage value of the input signal VIN is sampled in all the capacitances C of the capacitances C0 to C2, CA1, and CA2. After that, also in the digital-to-analog converter 101, similarly to the digital-to-analog converter 100, the analog signal VDAC of the voltage value obtained by adding the voltage value of the reference voltage VREF, which is a multiple of the ratio of the sum of the capacitance values of all the capacitances C of the capacitances C0 to C2, CA1, and CA2 to the sum of the capacitance values of the capacitances C connected to the reference voltage VREF, to the voltage value of the sampled input signal VIN is output. Therefore, a detailed description of the operation of the digital-to-analog converter 101 sampling the voltage value of the input signal VIN and the operation of the digital-to-analog converter 101 outputting the analog signal VDAC is omitted.

Similarly to the digital-to-analog converter 100, by using three capacitances C out of the capacitances C0 to C2, CA1, CA2 provided in the capacitance 111 as voltage value generation capacitances, the digital-to-analog converter 101 also outputs an analog signal VDAC with a resolution of 3 bits. More specifically, similarly to the digital-to-analog converter 100, when the digital-to-analog converter 101 outputs an analog signal VDAC with a gain of 1 times and a resolution of 3 bits, the three capacitances C of capacitances C0 to C2 as voltage value generation capacitances are used, to output an analog signal VDAC with eight voltage values (output levels), which is obtained by adding the voltage value of (0/7.75) Cu to (7/7.75) Cu times the reference voltage VREF to the voltage value of the input signal VIN. Similarly to the digital-to-analog converter 100, when the analog-to-digital converter 101 outputs the analog signal VDAC with a gain of ½ times and a resolution of 3 bits, the three capacitances C of the capacitances C0 to C1 and a capacitance CA1 are used, to output an analog signal VDAC with eight output levels, which is obtained by adding a voltage value of (0/7.75) Cu to (3.5/7.75) Cu times the reference voltage VREF to the voltage value of the input signal VIN. Further, when the digital-to-analog converter 101 outputs an analog signal VDAC with a gain of ¼ times and a resolution of 3 bits, the three capacitances C of the capacitances C0, CA1, and CA2 are used, to output an analog signal VDAC with eight output levels, which is obtained by adding a voltage value of (0/7.75) Cu to (1.75/7.75) Cu times the reference voltage VREF to the voltage value of the input signal VIN.

The digital-to-analog converter 101 can also use all the capacitances C of the capacitances C0 to C2, CA1, and CA2 as voltage value generation capacitances, to output an analog signal VDAC with a gain of ¾ times and a resolution of 3 bits. In this case, the digital-to-analog converter 101 outputs an analog signal VDAC with eight output levels, which is obtained by adding a voltage value of (0/7.75) Cu to (5.25/7.75) Cu times the reference voltage VREF to the voltage value of the input signal VIN.

Here, the relationship between the digital signal D input to the digital-to-analog converter 101 and the analog signal VDAC output by the digital-to-analog converter 101 will be described. FIGS. 9 to 12 are diagrams showing voltage values of signals (analog signal VDAC) output by the digital-to-analog converter 101 according to the first modification of the present invention. FIG. 9 shows the voltage value of the analog signal VDAC output from the digital-to-analog converter 101 when the gain is adjusted to 1 times. Further, FIG. 10 shows the voltage value of the analog signal VDAC output from the digital-to-analog converter 101 when the gain is adjusted to ½ times. Further, FIG. 11 shows the voltage value of the analog signal VDAC output from the digital-to-analog converter 101 when the gain is adjusted to ¼ times. Further, FIG. 12 shows the voltage value of the analog signal VDAC output from the digital-to-analog converter 101 when the gain is adjusted to ¾ times. In FIGS. 9 to 12, the analog signal VDAC with 3-bit resolution output from the digital-to-analog converter 101 is set to eight output levels from output level 0 to output level 7, and is associated with the values of digital signals D0 to D2, DA1, and DA2, to show the voltage value of the analog signal VDAC.

Also in the digital-to-analog converter 101, the digital signal DS is a digital signal D that controls the switch SWS provided in the switch section 121 to sample the voltage value of the input signal VIN in each of the capacitances C0 to C2, CA1 and CA2 provided in the capacitance section 111. Therefore, also in the digital-to-analog converter 101, in the digital signal DS, when the digital-to-analog converter 101 outputs an analog signal VDAC of voltage value obtained by adding the voltage value of the reference voltage VREF, which is a multiple of the ratio of the total capacitance value of all the capacitances C of the capacitances C0 to C2, CA1 and CA2 and the total capacitance value of the capacitance C connected to the reference voltage VREF, to the voltage value of the sampled input signal VIN, the open state (off state) of the switch SWS is maintained. That is, also in the digital-to-analog converter 101, the digital signal DS is a value that is fixed (held) without being changed while being controlled in an open state (off state) in which the connection between the input terminal of the input signal VIN and the node of the analog signal VDAC is cut off. Therefore, also in FIGS. 9 to 12, an explicit description of the digital signal DS having a fixed value is omitted.

Also in the following description, it is assumed that the voltage value of the input signal VIN is sampled in each of the capacitances C0 to C2, CA1, and CA2 included in the capacitance section 111. In FIGS. 9 to 12, it is assumed that, when the values of the corresponding digital signals D0 to D2, DA1 and DA2 are "0", the node connected to the first terminal of each of the switches SW0 to SW2, SWA1 and SWA2 is switched to the node of the ground potential, and when they are "1", it is switched to the node of the reference voltage VREF.

First, a relation between the digital signals D and the analog signal VDAC when the digital-to-analog converter 101 adjusts a gain factor to 1 will be described with reference to FIG. 9. As described above, when a factor of a gain of an output amplitude of the analog signal VDAC adjusted and output by the digital-to-analog converter 101 is 1, the analog signal VDAC with a 3-bit resolution is output using three capacitances C of a capacitance C0 to a capacitance C2 included in the capacitance unit 111 as voltage value generation capacitances. Therefore, the digital-to-analog converter 101 controls values of the digital signals D0 to D2 such that the values of the digital signals DA1 and DA2 are fixed (held) at "0." The digital-to-analog converter 101 outputs the analog signal VDAC with eight output levels in accordance with the values of the digital signals D0 to D2 (values of the digital signals D of 3 bits) corresponding to the three capacitances C of the capacitances C0 to C2 used when the gain factor is 1. In the description of FIG. 9, based on the idea similar to that of the digital-to-analog converter 100 when the gain factor illustrated in FIG. 2 is 1, the values of the digital signals D0 to D2, that is, nodes connected to the first terminals of the switches SW0 to SW2, are also shown with binary codes of the digital signals D of 3 bits corresponding to the three capacitances C of the capacitances C0 to C2. In the description of FIG. 9, as in the digital-to-analog converter 100 when the gain factor illustrated in FIG. 2 is 1, among three capacitances C of the capacitances C0 to C2, a value of the digital signal D2 corresponding to the capacitance C2 with the largest capacitance value (=4 Cu) is set as the most significant bit (MSB) and a value of the digital signal D0 corresponding to the capacitance C0 with the smallest capacitance value (=1 Cu) is set as the least significant bit (LSB).

In the digital-to-analog converter 101, when the values of the digital signals D (the digital signals D2, D1, and D0) are "000," the first terminals of the switches SW2 to SW0 are also connected to the node with the ground potential. Therefore, as illustrated in FIG. 9, the digital-to-analog converter 101 also outputs a voltage value (=VIN) of an input signal VIN sampled with all the capacitances C of the capacitances C0, C2, CA1, and CA2 included in the capacitance unit 111 as the analog signal VDAC with output level 0.

In the digital-to-analog converter 101, when the value of the digital signal D is "001," the first terminals of the switches SW2 and SW1 are also connected to the node with the ground potential and the first terminal of the switch SW0 is connected to the node with the reference voltage VREF. Therefore, the digital-to-analog converter 101 outputs a voltage value obtained by adding a voltage value (=(1/7.75) Cu×VREF) of the reference voltage VREF corresponding to a ratio of the capacitance value (=1 Cu) of the capacitance C0 connected to the reference voltage VREF among the three capacitances C of the capacitances C0 to C2 to a sum capacitance value (=7.75 Cu) of all the capacitances C included in the capacitance unit 111 to the voltage value (=VIN) of the input signal VIN, as the analog signal VDAC of output level 1.

At this time, a voltage output of the analog signal VDAC output by the digital-to-analog converter 101 is expressed in Expression (23) below.

$$VDAC = VIN + (1/7.75)Cu \times VREF \quad (23)$$

Similarly, as illustrated in FIG. 9, the digital-to-analog converter 101 outputs a voltage value obtained by adding a voltage value of the reference voltage VREF corresponding to a ratio of a sum capacitance value of the capacitance C connected to the reference voltage VREF to the sum capacitance value (=7.75 Cu) of all the capacitances C to the voltage value (=VIN) of the input signal VIN as the analog signal VDAC of each output level in accordance with the value of the digital signal D.

In the digital-to-analog converter 101, when the value of the digital signal D is "111," the first terminals of the switches SW2 to SW0 are also connected to the node with a reference voltage VREF. Therefore, the digital-to-analog converter 101 outputs a voltage value obtained by adding a voltage value (=(7/7.75)Cu×VREF) of the reference voltage VREF corresponding to a ratio of the sum capacitance value (=7 Cu) of the capacitances C2 to C0 connected to the reference voltage VREF to a sum capacitance value (=7.75 Cu) of all the capacitances C to the voltage value (=VIN) of the input signal VIN, as the analog signal VDAC of output level 7.

At this time, a voltage output of the analog signal VDAC output by the digital-to-analog converter 101 is expressed in Expression (24) below.

$$VDAC=VIN+(7/7.75)Cu \times VREF \quad (24)$$

In this way, when a factor of the gain of the output amplitude of the analog signal VDAC to be adjusted and output is 1, the digital-to-analog converter 101 outputs the analog signals VDAC with eight output levels obtained by adding the voltage value of (0/7.75) Cu to (7/7.75) Cu of the reference voltage VREF to the voltage value (=VIN) of the input signal VIN in accordance with the values of the input digital signals D2 to D0. Here, a change width of the voltage value of the analog signal VDAC output by the digital-to-analog converter 101 (a difference between the voltage values of the analog signals VDAC of the previous and subsequent output levels) is (1/7.75)Cu×VREF, as illustrated in FIG. 9. A range (an output amplitude) of the voltage value of the analog signal VDAC output by the digital-to-analog converter 101 is (7/7.75)Cu×VREF.

Next, a relation between the digital signals D and the analog signal VDAC when the digital-to-analog converter 101 adjusts a gain factor to ½ will be described with reference to FIG. 10. As described above, when a factor of a gain of an output amplitude of the analog signal VDAC adjusted and output by the digital-to-analog converter 101 is ½, the analog signal VDAC with a 3-bit resolution is output using three capacitances C of the capacitance C0, C1, and CA1 included in the capacitance unit 111 as voltage value generation capacitances. Therefore, the digital-to-analog converter 101 controls values of the digital signal D0, D1, and DA1 such that the values of the digital signals D2 and DA2 are fixed (held) at "0." The digital-to-analog converter 101 outputs the analog signal VDAC with eight output levels in accordance with the values of the digital signals D0, D1, and DA1 (values of the digital signals D of 3 bits corresponding to the three capacitances C of the capacitances C0, C1, and CA1 used when the gain factor is ½. In the description of FIG. 10, based on the idea similar to the case in which the gain factor illustrated in FIG. 9 is 1, the values of the digital signals D0, D1, and DA1, that is, nodes connected to the first terminals of the switches SW0, SW1, and SWA1, are also shown with binary codes of the digital signals D of 3 bits corresponding to the three capacitances C of the capacitances C0, C1, and CA1. In the description of FIG. 10, as in the digital-to-analog converter 100 when the gain factor illustrated in FIG. 3 is ½, among three capacitances C of the capacitances C0, C1, and CA1, a value of the digital signal D1 corresponding to the capacitance C1 with the largest capacitance value (=2 Cu) is set as the most significant bit (MSB) and a value of the digital signal DA1 corresponding to the capacitance CA1 with the smallest capacitance value (=0.5 Cu) is set as the least significant bit (LSB).

In the digital-to-analog converter 101, when the values of the digital signals D (the digital signals D1, D0, and DA1) are "000," the first terminals of the switches SW1, SW0, and SWA1 are also connected to a node with a ground potential.

Therefore, as illustrated in FIG. 10, the digital-to-analog converter 101 also outputs the voltage value (=VIN) of the input signal VIN sampled with all the capacitances C of the capacitances C0 to C2, CA1, and CA2 included in the capacitance unit 111 as the analog signal VDAC with output level 0. That is, as in the digital-to-analog converter 100, the digital-to-analog converter 101 also outputs the voltage value (=VIN) of the input signal VIN as the analog signal VDAC with output level 0 irrespective of the gain of which the output amplitude of the analog signal VDAC to be output is adjusted.

In the digital-to-analog converter 101, when the value of the digital signal D is "001," the first terminals of the switches SW1 and SW0 are also connected to the node with the ground potential and the first terminal of the switch SWA1 is connected to the node with the reference voltage VREF. Therefore, the digital-to-analog converter 101 outputs a voltage value obtained by adding a voltage value (=(0.5/7.75)Cu×VREF) of the reference voltage VREF corresponding to a ratio of the capacitance value (=0.5 Cu) of the capacitance CA1 connected to the reference voltage VREF among the three capacitances C of the capacitance C1, C0, and CA1 to a sum capacitance value (=7.75 Cu) of all the capacitances C to the voltage value (=VIN) of the input signal VIN, as the analog signal VDAC of output level 1.

At this time, a voltage output of the analog signal VDAC output by the digital-to-analog converter 101 is expressed in Expression (25) below.

$$VDAC=VIN+(0.5/7.75)Cu \times VREF \quad (25)$$

Similarly, as illustrated in FIG. 10, the digital-to-analog converter 101 outputs a voltage value obtained by adding a voltage value of the reference voltage VREF corresponding to a ratio of a sum capacitance value of the capacitance C connected to the reference voltage VREF to the sum capacitance value (=7.75 Cu) of all the capacitances C to the voltage value (=VIN) of the input signal VIN as the analog signal VDAC of each output level in accordance with the value of the digital signal D.

In the digital-to-analog converter 101, when the value of the digital signal D is "111," the first terminals of the switches SW1, SW0, and SWA1 are also connected to the node with a reference voltage VREF. Therefore, the digital-to-analog converter 101 outputs a voltage value obtained by adding a voltage value (=(3.5/7.75)Cu×VREF) of the reference voltage VREF corresponding to a ratio of the sum capacitance value (=3.5 Cu) of the capacitances C1, C0, and CA1 connected to the reference voltage VREF to a sum capacitance value (=7.75 Cu) of all the capacitances C to the voltage value (=VIN) of the input signal VIN, as the analog signal VDAC of output level 7.

At this time, a voltage output of the analog signal VDAC output by the digital-to-analog converter 101 is expressed in Expression (26) below.

$$VDAC=VIN+(3.5/7.75)Cu \times VREF \quad (26)$$

In this way, when a factor of the gain of the output amplitude of the analog signal VDAC to be adjusted and output is ½, the digital-to-analog converter 101 outputs the analog signals VDAC with eight output levels obtained by adding the voltage value of (0/7.75) Cu to (3.5/7.75) Cu of the reference voltage VREF to the voltage value (=VIN) of the input signal VIN in accordance with the values of the input digital signals D0, D1, and DA1. Here, a change width of the voltage value of the analog signal VDAC output by the digital-to-analog converter 101 (a difference between the voltage values of the analog signals VDAC of the previous and subsequent output levels) is (0.5/7.75)Cu×VREF, as illustrated in FIG. 10. A range (an output amplitude) of the voltage value of the analog signal VDAC output by the digital-to-analog converter 101 is (3.5/7.75)Cu×VREF.

Next, a relation between the digital signals D and the analog signal VDAC when the digital-to-analog converter 101 adjusts a gain factor to ¼ will be described with reference to FIG. 11. As described above, when a factor of a gain of an output amplitude of the analog signal VDAC adjusted and output by the digital-to-analog converter 101 is ¼, the analog signal VDAC with a 3-bit resolution is output using three capacitances C of the capacitances C0, CA1, and CA2 included in the capacitance unit 111 as voltage value generation capacitances. Therefore, the digital-to-analog converter 101 controls values of the digital signals D0, DA1, and DA2 such that the values of the digital signals D2 and D1 are fixed (held) at "0." The digital-to-analog converter 101 outputs the analog signal VDAC with eight output levels in accordance with the values of the digital signals D0, DA1, and DA2 (values of the digital signals D of 3 bits) corresponding to the three capacitances C of the capacitances C0, CA1, and CA2 used when the gain factor is ¼. In the description of FIG. 11, based on the idea similar to the case in which the gain factor illustrated in FIG. 9 is 1 or the case in which the gain factor illustrated in FIG. 10 is ½, the values of the digital signals D0, DA1, and DA2, that is, nodes connected to the first terminals of the switches SW0, SWA1, and SWA2, are also shown with binary codes of the digital signals D of 3 bits corresponding to the three capacitances C of the capacitances C0, CA1, and CA2. In the description of FIG. 11, among three capacitances C of the capacitances C0, CA1, and CA2, a value of the digital signal D0 corresponding to the capacitance C0 with the largest capacitance value (=1 Cu) is set as the most significant bit (MSB) and a value of the digital signal DA2 corresponding to the capacitance CA2 with the smallest capacitance value (=0.25 Cu) is set as the least significant bit (LSB).

In the digital-to-analog converter 101, when the values of the digital signals D (the digital signals D0, DA1, and DA2) are "000," the first terminals of the switches SW0, SWA1, and SWA2 are also connected to the node with the ground potential. Therefore, as illustrated in FIG. 11, the digital-to-analog converter 101 also outputs the voltage value (=VIN) of the input signal VIN sampled with all the capacitances C of the capacitances C0 to C2, CA1, and CA2 included in the capacitance unit 111 as the analog signal VDAC with output level 0. That is, as described above, the digital-to-analog converter 101 also outputs the voltage value (=VIN) of the input signal VIN as the analog signal VDAC with output level 0 irrespective of the gain of which the output amplitude of the analog signal VDAC to be output is adjusted.

In the digital-to-analog converter 101, when the value of the digital signal D is "001," the first terminals of the switches SW0 and SWA1 are also connected to the node with the ground potential and the first terminal of the switch SWA2 is connected to the node with the reference voltage VREF. Therefore, the digital-to-analog converter 101 outputs a voltage value obtained by adding a voltage value (=(0.25/7.75)Cu×VREF) of the reference voltage VREF corresponding to a ratio of the capacitance value (=0.25 Cu) of the capacitance CA2 connected to the reference voltage VREF among the three capacitances C of the capacitances C0, CA1, and CA2 to a sum capacitance value (=7.75 Cu) of all the capacitances C to the voltage value (=VIN) of the input signal VIN, as the analog signal VDAC of output level 1.

At this time, a voltage output of the analog signal VDAC output by the digital-to-analog converter 101 is expressed in Expression (27) below.

$$VDAC = VIN + (0.25/7.75)Cu \times VREF \quad (27)$$

In the digital-to-analog converter 101, when the value of the digital signal D is "010," the first terminals of the switches SW0 and SWA2 are also connected to the node with the ground potential and the first terminal of the switch SWA1 is connected to the node with the reference voltage VREF. Therefore, the digital-to-analog converter 101 outputs a voltage value obtained by adding a voltage value (=(0.5/7.75)Cu×VREF) of the reference voltage VREF corresponding to a ratio of the capacitance value (=0.5 Cu) of the capacitance CA1 connected to the reference voltage VREF to a sum capacitance value (=7.75 Cu) of all the capacitances C to the voltage value (=VIN) of the input signal VIN, as the analog signal VDAC of output level 2.

At this time, a voltage output of the analog signal VDAC output by the digital-to-analog converter 101 is expressed in Expression (28) below.

$$VDAC = VIN + (0.5/7.75)Cu \times VREF \quad (28)$$

Similarly, as illustrated in FIG. 11, the digital-to-analog converter 101 outputs a voltage value obtained by adding a voltage value of the reference voltage VREF corresponding to a ratio of a sum capacitance value of the capacitance C connected to the reference voltage VREF to the sum capacitance value (=7.75 Cu) of all the capacitances C to the voltage value (=VIN) of the input signal VIN as the analog signal VDAC of each output level in accordance with the value of the digital signal D.

In the digital-to-analog converter 101, when the value of the digital signal D is "111," the first terminals of the switches SW0, SWA1, and SWA2 are also connected to the node with a reference voltage VREF. Therefore, the digital-to-analog converter 101 outputs a voltage value obtained by adding a voltage value (=(1.75/7.75)Cu×VREF) of the reference voltage VREF corresponding to a ratio of the sum capacitance value (=1.75 Cu) of the capacitances C0, CA1, and CA2 connected to the reference voltage VREF to a sum capacitance value (=7.75 Cu) of all the capacitances C to the voltage value (=VIN) of the input signal VIN, as the analog signal VDAC of output level 7.

At this time, a voltage output of the analog signal VDAC output by the digital-to-analog converter 101 is expressed in Expression (29) below.

$$VDAC = VIN + (1.75/7.75)Cu \times VREF \quad (29)$$

In this way, when a factor of the gain of the output amplitude of the analog signal VDAC to be adjusted and output is ¼, the digital-to-analog converter 101 outputs the analog signals VDAC with eight output levels obtained by adding the voltage value of (0/7.75) Cu to (1.75/7.75) Cu of the reference voltage VREF to the voltage value (=VIN) of the input signal VIN in accordance with the values of the input digital signals D0, DA1, and DA2. Here, a change width of the voltage value of the analog signal VDAC output by the digital-to-analog converter 101 (a difference between the voltage values of the analog signals VDAC of the previous and subsequent output levels) is (0.25/7.75)Cu× VREF, as illustrated in FIG. 11. A range (an output amplitude) of the voltage value of the analog signal VDAC output by the digital-to-analog converter 101 is (1.75/7.75)Cu× VREF.

Next, a relation between the digital signals D and the analog signal VDAC when the digital-to-analog converter 101 adjusts a gain factor to ¾ will be described with reference to FIG. 12. As described above, when a factor of a gain of an output amplitude of the analog signal VDAC adjusted and output by the digital-to-analog converter 101 is ¾, the analog signal VDAC with a 3-bit resolution is output using all the capacitances C of the capacitances C0 to C2, CA1, and CA2 included in the capacitance unit 111 as voltage value generation capacitances. Therefore, the digital-to-analog converter 101 controls values of the digital signals D0 to D2, DA1, and DA2. The digital-to-analog converter 101 outputs the analog signal VDAC with eight output levels in accordance with the values of the digital signals D0 to D2, DA1, and DA2 (values of 5-bit digital signals D) corresponding to all the capacitances C of the capacitances C0 to C2, CA1, and CA2 used when the gain factor is ¾. In the description of FIG. 12, based on the idea similar to the case of each gain value illustrated in FIGS. 9 to 11, the values of the digital signals D0 to D2, DA1, and DA2, that is, nodes connected to the first terminals of the switches SW0 to SW2, SWA1, and SWA2, are also shown with binary codes of the 5-bit digital signals D corresponding to all the capacitances C of the capacitances C0 to C2, CA1, and CA2. In the description of FIG. 12, of all the capacitances C of the capacitances C0 to C2, CA1, and CA2, a value of the digital signal D2 corresponding to the capacitance C2 with the largest capacitance value (=4 Cu) is set as the most significant bit (MSB) and a value of the digital signal DA2 corresponding to the capacitance CA2 with the smallest capacitance value (=0.25 Cu) is set as the least significant bit (LSB).

In the digital-to-analog converter 101, when the values of the digital signals D (the digital signals D2, D1, D0, DA1, and DA2) are "00000," the first terminals of the switches SW2 to SW0, SWA1, and SWA2 are also connected to the node with the ground potential. Therefore, as illustrated in FIG. 12, the digital-to-analog converter 101 also outputs the voltage value (=VIN) of the input signal VIN sampled with all the capacitances C of the capacitances C0 to C2, CA1, and CA2 included in the capacitance unit 111 as the analog signal VDAC with output level 0. That is, as described above, the digital-to-analog converter 101 also outputs the voltage value (=VIN) of the input signal VIN as the analog signal VDAC with output level 0 irrespective of the gain of which the output amplitude of the analog signal VDAC to be output is adjusted.

In the digital-to-analog converter 101, when the value of the digital signal D is "00011," the first terminals of the switches SW2, SW1, and SW0 are connected to the node with the ground potential and the first terminals of the switches SWA1 and SWA2 are connected to the node with the reference voltage VREF. Therefore, the digital-to-analog converter 101 outputs a voltage value obtained by adding a voltage value (=(0.75/7.75)Cu×VREF) of the reference voltage VREF corresponding to a ratio of the sum capacitance value (=0.75 Cu) of the capacitances CA1 and CA2 connected to the reference voltage VREF to a sum capacitance value (=7.75 Cu) of all the capacitances C to the voltage value (=VIN) of the input signal VIN, as the analog signal VDAC of output level 1.

At this time, a voltage output of the analog signal VDAC output by the digital-to-analog converter 101 is expressed in Expression (30) below.

$$VDAC=VIN+(0.75/7.75)Cu\times VREF \quad (30)$$

In the digital-to-analog converter 101, when the value of the digital signal D is "00110," the first terminals of the switches SW2, SW1, and SWA2 are connected to the node with the ground potential and the first terminals of the switches SW0 and SWA1 are connected to the node with the reference voltage VREF. Therefore, the digital-to-analog converter 101 outputs a voltage value obtained by adding a voltage value (=(1.5/7.75)Cu×VREF) of the reference voltage VREF corresponding to a ratio of the sum capacitance value (=1.5 Cu) of the capacitances C0 and CA1 connected to the reference voltage VREF to a sum capacitance value (=7.75 Cu) of all the capacitances C to the voltage value (=VIN) of the input signal VIN, as the analog signal VDAC of output level 2.

At this time, a voltage output of the analog signal VDAC output by the digital-to-analog converter 101 is expressed in Expression (31) below.

$$VDAC=VIN+(1.5/7.75)Cu\times VREF \quad (31)$$

In the digital-to-analog converter 101, when the value of the digital signal D is "01001," the first terminals of the switches SW2, SW0, and SWA1 are connected to the node with the ground potential and the first terminals of the switches SW1 and SWA2 are connected to the node with the reference voltage VREF. Therefore, the digital-to-analog converter 101 outputs a voltage value obtained by adding a voltage value (=(2.25/7.75)Cu×VREF) of the reference voltage VREF corresponding to a ratio of the sum capacitance value (=2.25 Cu) of the capacitances C1 and CA2 connected to the reference voltage VREF to a sum capacitance value (=7.75 Cu) of all the capacitances C to the voltage value (=VIN) of the input signal VIN, as the analog signal VDAC of output level 3.

At this time, a voltage output of the analog signal VDAC output by the digital-to-analog converter 101 is expressed in Expression (32) below.

$$VDAC=VIN+(2.25/7.75)Cu\times VREF \quad (32)$$

In the digital-to-analog converter 101, when the value of the digital signal D is "01100," the first terminals of the switches SW2, SWA1, and SWA2 are connected to the node with the ground potential and the first terminals of the switches SW1 and SW0 are connected to the node with the reference voltage VREF. Therefore, the digital-to-analog converter 101 outputs a voltage value obtained by adding a voltage value (=(3/7.75)Cu×VREF) of the reference voltage VREF corresponding to a ratio of the sum capacitance value (=3 Cu) of the capacitances C1 and C0 connected to the reference voltage VREF to a sum capacitance value (=7.75 Cu) of all the capacitances C to the voltage value (=VIN) of the input signal VIN, as the analog signal VDAC of output level 4.

At this time, a voltage output of the analog signal VDAC output by the digital-to-analog converter 101 is expressed in Expression (33) below.

$$VDAC=VIN+(3/7.75)Cu\times VREF \quad (33)$$

In the digital-to-analog converter 101, when the value of the digital signal D is "01111," the first terminal of the switch SW2 is connected to the node with the ground potential and the first terminals of the switches SW1, SW0, SWA1, and SWA2 are connected to the node with the reference voltage VREF. Therefore, the digital-to-analog converter 101 outputs a voltage value obtained by adding a voltage value (=(3.75/7.75)Cu×VREF) of the reference voltage VREF corresponding to a ratio of the sum capacitance value (=3.75 Cu) of the capacitances C1, C0, CA1, and CA2 connected to the reference voltage VREF to a sum capacitance value (=7.75 Cu) of all the capacitances C to the voltage value (=VIN) of the input signal VIN, as the analog signal VDAC of output level 5.

At this time, a voltage output of the analog signal VDAC output by the digital-to-analog converter 101 is expressed in Expression (34) below.

$$VDAC=VIN+(3.75/7.75)Cu \times VREF \quad (34)$$

In the digital-to-analog converter 101, when the value of the digital signal D is "10010," the first terminals of the switches SW1, SW0, and SWA2 are connected to the node with the ground potential and the first terminals of the switches SW2 and SWA1 are connected to the node with the reference voltage VREF. Therefore, the digital-to-analog converter 101 outputs a voltage value obtained by adding a voltage value (=(4.5/7.75)Cu×VREF) of the reference voltage VREF corresponding to a ratio of the sum capacitance value (=4.5 Cu) of the capacitances C2 and CA1 connected to the reference voltage VREF to a sum capacitance value (=7.75 Cu) of all the capacitances C to the voltage value (=VIN) of the input signal VIN, as the analog signal VDAC of output level 6.

At this time, a voltage output of the analog signal VDAC output by the digital-to-analog converter 101 is expressed in Expression (35) below.

$$VDAC=VIN+(4.5/7.75)Cu \times VREF \quad (35)$$

In the digital-to-analog converter 101, when the value of the digital signal D is "10101," the first terminals of the switches SW1 and SWA1 are connected to the node with the ground potential and the first terminals of the switches SW2, SW0, and SWA2 are connected to the node with the reference voltage VREF. Therefore, the digital-to-analog converter 101 outputs a voltage value obtained by adding a voltage value (=(5.25/7.75)Cu×VREF) of the reference voltage VREF corresponding to a ratio of the sum capacitance value (=5.25 Cu) of the capacitances C2, C0, and CA2 connected to the reference voltage VREF to a sum capacitance value (=7.75 Cu) of all the capacitances C to the voltage value (=VIN) of the input signal VIN, as the analog signal VDAC of output level 7.

At this time, a voltage output of the analog signal VDAC output by the digital-to-analog converter 101 is expressed in Expression (36) below.

$$VDAC=VIN+(5.25/7.75)Cu \times VREF \quad (36)$$

In this way, when a factor of the gain of the output amplitude of the analog signal VDAC to be adjusted and output is ¾, the digital-to-analog converter 101 outputs the analog signals VDAC with eight output levels obtained by adding the voltage value of (0/7.75) Cu to (5.25/7.75) Cu of the reference voltage VREF to the voltage value (=VIN) of the input signal VIN in accordance with the values of the input digital signals D0 to D2, DA1, and DA2. Here, a change width of the voltage value of the analog signal VDAC output by the digital-to-analog converter 101 (a difference between the voltage values of the analog signals VDAC of the previous and subsequent output levels) is (0.75/7.75)Cu×VREF, as illustrated in FIG. 12. A range (an output amplitude) of the voltage value of the analog signal VDAC output by the digital-to-analog converter 101 is (5.25/7.75)Cu×VREF.

In this way, the digital-to-analog converter 101 is configured to perform the gain adjustment on the range (the output amplitude) of the voltage value of the analog signal VDAC to be output by adding the capacitances CA1 and CA2 to the capacitance unit 111 and adding the switches SWA1 and SWA2 to the switch unit 121. The digital-to-analog converter 101 outputs the analog signal VDAC with the 3-bit resolution in which the gain factor is adjusted to 1, ½, or ¼ using three capacitances C as the voltage value generation capacitances among five capacitances C of the capacitances C2 to C0, CA1, and CA2 included in the capacitance unit 111. Further, the digital-to-analog converter 101 outputs the analog signal VDAC with the 3-bit resolution in which the gain factor is adjusted to ¾ using each capacitance C as the voltage value generation capacitance included in the capacitance unit 111. That is, in the digital-to-analog converter 101, each capacitance C included in the capacitance unit 111 is used as the capacitance C for adjusting the gain of the output amplitude of the analog signal VDAC to be output with the 3-bit resolution in accordance with switching of the corresponding switch SW after the sampling of the voltage value of the input signal VIN. Further, in the digital-to-analog converter 101, the capacitance value of the capacitances C (the capacitances CA1 and CA2) added to perform the gain adjustment on the output amplitude of the analog signal VDAC to be output is the capacitance value less than the capacitance C of the smallest capacitance value when the gain factor is 1. The digital-to-analog converter 101 is configured such that the switches SW (the switches SWA1 and SWA2) added to perform the gain adjustment on the output amplitude of the analog signal VDAC to be output have configurations similar to the other switches SW (the switches SW0 to SW2) used to switch the reference voltage VREF included in the switch unit 121. In other words, the switches SW (the switches SWA1 and SWA2) added in the digital-to-analog converter 101 are not the switches SW configured to realize special performance. That is, while the digital-to-analog converter 101 is configured to output the analog signal VDAC switched within the range of the plurality of voltage values with which the gain factor is adjusted to 1 to ¼, the capacitances CA1 and CA2 and the switches SWA1 and SWA2 are merely added. That is, the digital-to-analog converter 101 can be realized by merely adding the smaller number of constituent elements as the configuration in which the analog signal VDAC with the high resolution is output. Accordingly, in the digital-to-analog converter 101, it is possible to inhibit an increase in an area necessary to form the digital-to-analog converter 101.

In the operation in a case in which the above-described digital-to-analog converter 101 outputs the analog signal VDAC, the operation of outputting the analog signal VDAC with the voltage value obtained by adding the voltage value of the reference voltage VREF of a multiple corresponding to the capacitance ratio of each capacitance C included in the capacitance unit 111 and changed by the digital signal D to the voltage value of the input signal VIN after the voltage value of the input signal VIN is sampled with all the capacitances C included in the capacitance unit 111 has been described. However, the digital-to-analog converter 101 can perform not only the adjustment of the gain but also the offset of the analog signal VDAC with respect to the analog signal VDAC with the 3-bit resolution to be output as in the digital-to-analog converter 100. Thus, in the digital-to-analog converter 101, it is also possible to realize the analog signal VDAC switched within the range of the plurality of voltage values with which the offset is adjusted in addition to the adjustment of the gain by inhibiting an increase in the area necessary to form the digital-to-analog converter 101, as in the digital-to-analog converter 100. The operation at the time of adjustment of the offset of the analog signal VDAC with the 3-bit resolution output by the digital-to-analog converter 101 can be considered to be similar to the operation at the time of adjustment of the offset of the analog signal VDAC in the digital-to-analog converter 100. Accordingly, detailed description of the operation at the time of adjustment of the offset of the analog signal VDAC in the digital-to-analog converter 101 will be omitted.

In the above-described digital-to-analog converter 101, the configuration in which the analog signal VDAC to be output is the analog signal with the 3-bit resolution has been described. However, the resolution of the analog signal VDAC output by the digital-to-analog converter 101 is not limited to 3 bits as in the digital-to-analog converter 100. For example, by applying the idea of the configuration or the operation of the above-described digital-to-analog converter 101 to a digital-to-analog converter with a resolution of a larger number of bits, it is possible to consider the configuration or the operation easily. Accordingly, detailed description of the configuration or the operation of the digital-to-analog converter with a resolution of a larger number of bits will be omitted.

In the digital-to-analog converter 100 and the digital-to-analog converter 101, the configuration in which the gain of the output amplitude of the analog signal VDAC to be output is adjusted by the added capacitance C (the capacitance CA1 or CA2) and the switch SW (the switch SWA1 or SWA2) has been described. However, the digital-to-analog converter according to the embodiment can be configured such that the analog signal VDAC to be output is attenuated at only a pre-decided ratio of the voltage value of the reference voltage VREF.

(Second Modification Example of Digital-to-Analog Converter)

Figure 13:
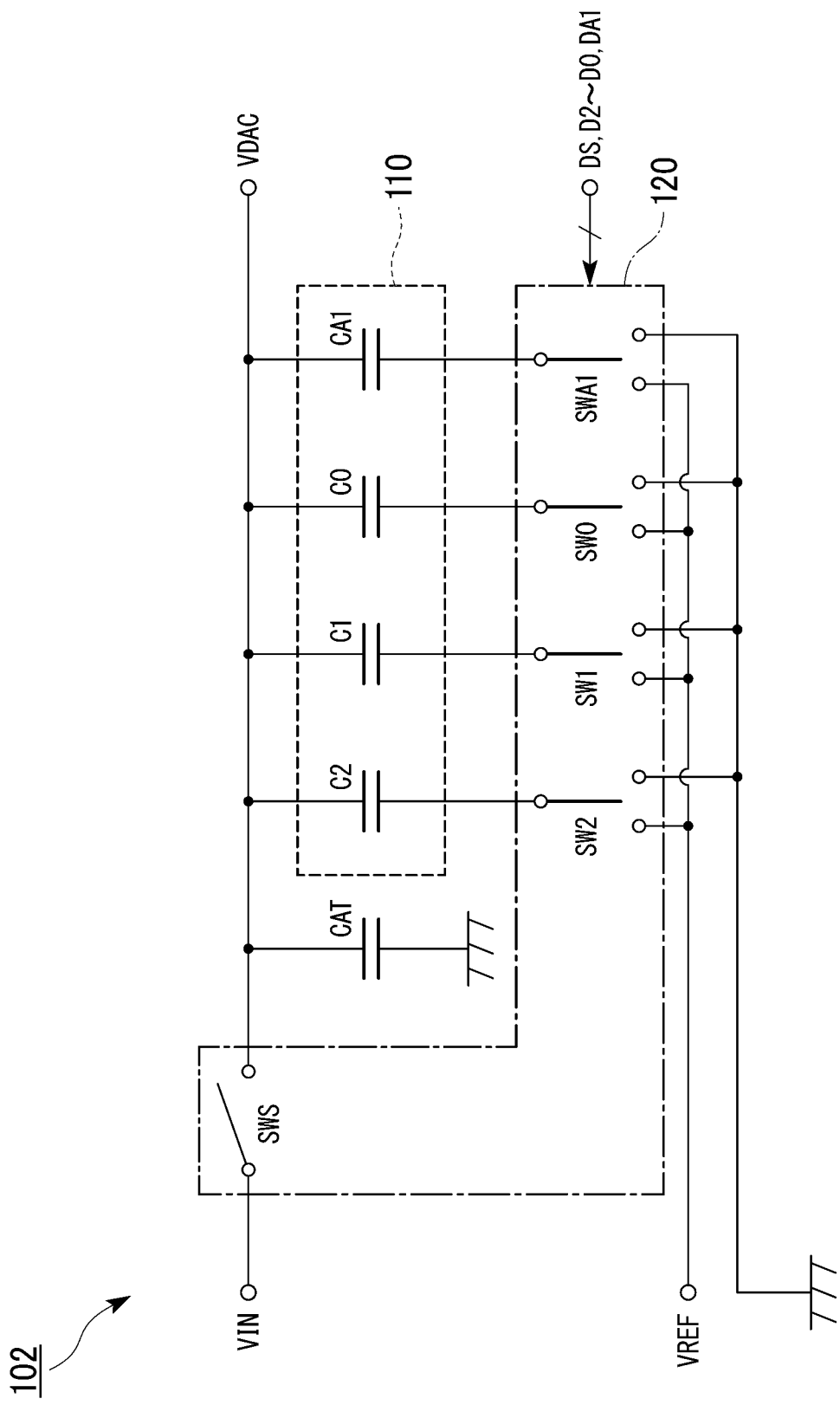
FIG. 13 is a block diagram showing an example of a configuration of a second modification of the digital-to-analog converter of the present invention.

Here, an example of a digital-to-analog converter configured to attenuate the analog signal VDAC to be output at only a pre-decided ratio will be described. FIG. 13 is a block diagram illustrating an example of a configuration according to a second modification example of the digital-to-analog converter according to the present invention. A digital-to-analog converter 102 illustrated in FIG. 13 is a digital-to-analog converter that outputs the analog signal VDAC with a 3-bit resolution based on the reference voltage VREF and the input signal VIN which has been input. The digital-to-analog converter 102 includes the capacitance unit 110 that has a plurality of capacitances C binary weighted, a switch unit 120 that includes a plurality of switches SW corresponding to the capacitances C included in the capacitance unit 110, and an attenuation capacitance CAT. As in the digital-to-analog converter 100, the digital-to-analog converter 102 adjusts the gain factor to 1 or ½ in accordance with the digital signals D (the digital signals D0 to D2 and DA1) input from an external control circuit, adds or subtracts a voltage value of the reference voltage VREF of which the gain is adjusted to a pre-decided multiple to or from the voltage value of the input signal VIN, and outputs the added or subtracted voltage as the analog signal VDAC.

The constituent elements of the digital-to-analog converter 102 illustrated in FIG. 13 also include constituent elements similar to the constituent elements of the digital-to-analog converter 100 illustrated in FIG. 1. Accordingly, in the constituent elements of the digital-to-analog converter 102, the same reference numerals are given to the constituent elements similar to the constituent elements of the digital-to-analog converter 100. Detailed description of the constituent elements will be omitted.

The attenuation capacitance CAT is a capacitance for attenuating the analog signal VDAC output by the digital-to-analog converter 102 at a pre-decided ratio. A first terminal of the attenuation capacitance CAT is also connected to the node of the analog signal VDAC output by the digital-to-analog converter 102 in parallel. A second terminal of the attenuation capacitance CAT is connected to one of a node on the high-potential side of the reference voltage VREF and a node on the low-potential side of the reference voltage VREF. Thus, the attenuation capacitance CAT attenuates the analog signal VDAC output by the digital-to-analog converter 102 at an increased ratio of the entire capacitance value (a sum capacitance value) in accordance with the capacitance value of the attenuation capacitance CAT. FIG. 13 also illustrates a case in which the node on the high-potential side of the reference voltage VREF is a node connected to a high-potential input terminal of the reference voltage VREF and the node on the low-potential side is a ground (GND)-potential node as in FIG. 1 or 8. In the digital-to-analog converter 102 illustrated in FIG. 13, the second terminal of the attenuation capacitance CAT is connected to the node of the ground potential. The capacitance value of the attenuation capacitance CAT is a capacitance value necessary to attenuate the analog signal VDAC output by the digital-to-analog converter 102 at the pre-decided ratio. In the following description, the capacitance value of the attenuation capacitance CAT is assumed to be pCu.

Accordingly, in the digital-to-analog converter 102, a capacitance value ($=(7.5+p)Cu$) in which 7.5 Cu which is a sum of capacitance values of all the capacitances C included in the capacitance unit 110 (the entire capacitance value of the capacitance unit 110) and the capacitance value pCu of the attenuation capacitance CAT are combined is an entire capacitance value in the digital-to-analog converter 102.

An operation in a case in which the digital-to-analog converter 102 outputs the analog signal VDAC is basically similar to the operation of the digital-to-analog converter 100. That is, as in the digital-to-analog converter 100, the digital-to-analog converter 102 also first samples the voltage value of the input signal VIN on all the capacitances C of the capacitances C0 to C2, the capacitance CA1, and the attenuation capacitance CAT. Thereafter, as in the digital-to-analog converter 100, the digital-to-analog converter 102 also outputs the analog signal VDAC of a voltage value obtained by adding the voltage value of the reference voltage VREF of a multiple corresponding to a ratio of a sum of the capacitance value of the capacitance C connected to the reference voltage VREF to the entire capacitance value (a sum of capacitance values of the capacitances C0 to C2, the capacitance CA1, and attenuation capacitance CAT) in the digital-to-analog converter 102 to the sampled voltage value of the input signal VIN. Accordingly, detailed description of an operation of sampling the voltage value of the input signal VIN in the digital-to-analog converter 102 and an operation of outputting the analog signal VDAC in the digital-to-analog converter 102 will be omitted.

As in the digital-to-analog converter 100, the digital-to-analog converter 102 also outputs the analog signal VDAC with a 3-bit resolution using three capacitances C among the capacitances C0 to C2 and CA1 included in the capacitance unit 110 as voltage value generation capacitances. More specifically, as in the digital-to-analog converter 100, the digital-to-analog converter 102 also outputs the analog signal VDAC with eight voltage values (output levels) obtained by adding the voltage value of $(0/(7.5+p))Cu$ to $(7/(7.5+p))$ Cu times the reference voltage VREF to the voltage value of the input signal VIN using three capacitances C of the capacitances C0 to C2 as the voltage value generation capacitances when the analog signal VDAC with a 3-bit resolution is output at 1 times the gain. As in the digital-to-analog converter 100, the digital-to-analog converter 102 also outputs the analog signal VDAC with eight output levels obtained by adding the voltage value of (0/(7.5+p))Cu to (3.5/(7.5+p))Cu times the reference voltage VREF to the voltage value of the input signal VIN using three capacitances C of the capacitances C0, C1, and CA1 as the voltage value generation capacitances when the analog signal VDAC with a 3-bit resolution is output at ½ times the gain.

Here, a relation between the digital signal D input to the digital-to-analog converter 102 and the analog signal VDAC output by the digital-to-analog converter 102 will be described. FIGS. 14 and 15 are diagrams illustrating voltage values of the signal (the analog signal VDAC) output by the digital-to-analog converter 102 according to the second modification example of the present invention. FIG. 14 illustrates voltage values of the analog signal VDAC output by the digital-to-analog converter 102 when the gain factor is adjusted to 1. FIG. 15 illustrates voltage values of the analog signal VDAC output by the digital-to-analog converter 102 when the gain factor is adjusted to ½. In FIGS. 14 and 15, the analog signal VDAC with a 3-bit resolution output by the digital-to-analog converter 102 is set with eight output levels of output levels 0 to 7 and voltage values of the analog signal VDAC are shown in association with values of the digital signals D0 to D2 and DA1.

In the digital-to-analog converter 102, the digital signal DS is also a digital signal D for sampling the voltage value of the input signal VIN in each of the capacitances C0 to C2 and CA1 included in the capacitance unit 110 and the attenuation capacitance CAT by controlling switches SWS included in the switch unit 120. Therefore, in the digital-to-analog converter 102, the digital signal DS also holds an open state (an OFF state) of the switches SWS when the digital-to-analog converter 102 outputs the analog signal VDAC with the voltage value obtained by adding the voltage value of the reference voltage VREF of a multiple corresponding to a ratio of the sum of the capacitance value of the capacitance C connected to the reference voltage VREF to the entire capacitance value in the digital-to-analog converter 102 to the sampled voltage value of the input signal VIN. That is, in the digital-to-analog converter 102, the digital signal DS is also a value that is fixed (held) without changing the control of the open state (the OFF state) in which connection between the input terminal of the input signal VIN and the node of the analog signal VDAC is cut. Accordingly, in FIGS. 14 and 15, the digital signal DS with the fixed value is not clearly illustrated.

In the following description, the voltage value of the input signal VIN is assumed to be sampled in each of the capacitances C0 to C2 and CA1 included in the capacitance unit 110 and the attenuation capacitance CAT. In FIGS. 14 and 15, it is assumed that the node connected to the first terminal of each of the switches SW0 to SW2 and SWA1 is switched to the node with the ground potential when the values of the corresponding digital signals D0 to D2 and DA1 are "0," and is switched to the node with the reference voltage VREF when the values thereof are "1."

First, a relation between the digital signals D and the analog signal VDAC when the digital-to-analog converter 102 adjusts the gain factor to 1 will be described with reference to FIG. 14. As described above, when a factor of the gain of the output amplitude of the analog signal VDAC adjusted and output by the digital-to-analog converter 102 is 1, the analog signal VDAC with the 3-bit resolution is output using three capacitances C of the capacitances C0 to C2 included in the capacitance unit 110 as voltage value generation capacitances, as in the digital-to-analog converter 100. Therefore, in the digital-to-analog converter 102, the values of the digital signals D0 to D2 are controlled and the value of the digital signal DA1 is fixed (held) at "0" as in the digital-to-analog converter 100. As in the digital-to-analog converter 100, the digital-to-analog converter 102 also outputs the analog signal VDAC with eight output levels in accordance with the values of the digital signals D0 to D2 (values of the digital signals D of 3 bits) corresponding to the three capacitances C of the capacitances C0 to C2 used when the gain factor is 1. In the description of FIG. 14, based on the idea similar to the case in which the gain factor illustrated in FIG. 2 is 1, the values of the digital signals D0 to D2, that is, nodes connected to the first terminals of the switches SW0 to SW2, are also shown with binary codes of the digital signals D of 3 bits corresponding to the three capacitances C of the capacitances C0 to C2. In the description of FIG. 14, as in the digital-to-analog converter 100 when the gain factor illustrated in FIG. 2 is 1, among three capacitances C of the capacitances C0 to C2, a value of the digital signal D2 corresponding to the capacitance C2 with the largest capacitance value (=4 Cu) is set as the most significant bit (MSB) and a value of the digital signal D0 corresponding to the capacitance C0 with the smallest capacitance value (=1 Cu) is set as the least significant bit (LSB).

In the digital-to-analog converter 102, when the values of the digital signals D (the digital signals D2, D1, and D0) are "000," the first terminals of the switches SW2 to SW0 are also connected to the node with the ground potential, as in the digital-to-analog converter 100. Therefore, as illustrated in FIG. 14, the digital-to-analog converter 102 also outputs a voltage value (=VIN) of an input signal VIN sampled with all the capacitances C of the capacitances C0 to C2 and CA1 included in the capacitance unit 110 and the attenuation capacitance CAT as the analog signal VDAC with output level 0.

In the digital-to-analog converter 102, when the value of the digital signal D is "001," the first terminals of the switches SW2 and SW1 are also connected to the node with the ground potential and the first terminal of the switch SW0 is connected to the node with the reference voltage VREF, as in the digital-to-analog converter 100. Therefore, the digital-to-analog converter 102 outputs a voltage value obtained by adding a voltage value (=(1/7.5+p)Cu×VREF) of the reference voltage VREF corresponding to a ratio of the capacitance value (=1 Cu) of the capacitance C0 connected to the reference voltage VREF to the entire capacitance value (=(7.5+p)Cu) of the digital-to-analog converter 102 to the voltage value (=VIN) of the input signal VIN, as the analog signal VDAC of output level 1.

At this time, a voltage output of the analog signal VDAC output by the digital-to-analog converter 102 is expressed in Expression (37) below.

$$VDAC=VIN+(1/(7.5+p))Cu \times VREF \qquad (37)$$

Similarly, as illustrated in FIG. 14, the digital-to-analog converter 102 outputs a voltage value obtained by adding a voltage value of the reference voltage VREF corresponding to a ratio of a sum capacitance value of the capacitance C connected to the reference voltage VREF to the entire capacitance value (=(7.5+p)Cu) in the digital-to-analog converter 102 to the voltage value (=VIN) of the input signal VIN as the analog signal VDAC of each output level in accordance with the value of the digital signal D.

In the digital-to-analog converter 102, when the value of the digital signal D is "111," the first terminals of the switches SW2 to SW0 are also connected to the node with a reference voltage VREF, as in the digital-to-analog converter 100. Therefore, the digital-to-analog converter 102 outputs a voltage value obtained by adding a voltage value (=(7(/7.5+p))Cu×VREF) of the reference voltage VREF corresponding to a ratio of the sum capacitance value (=7 Cu) of the capacitances C2 to C0 connected to the reference voltage VREF to the entire capacitance value (=(7.5+p)Cu) to the voltage value (=VIN) of the input signal VIN, as the analog signal VDAC of output level 7.

At this time, a voltage output of the analog signal VDAC output by the digital-to-analog converter 102 is expressed in Expression (38) below.

$$VDAC=VIN+(7/(7.5+p))Cu \times VREF \quad (38)$$

In this way, when a factor of the gain of the output amplitude of the analog signal VDAC to be adjusted and output is 1, the digital-to-analog converter 102 outputs the analog signals VDAC with eight output levels obtained by adding the voltage value of (0/(7.5+p))Cu to (7/(7.5+p))Cu of the reference voltage VREF to the voltage value (=VIN) of the input signal VIN in accordance with the values of the input digital signals D2 to D0. Here, a change width of the voltage value of the analog signal VDAC output by the digital-to-analog converter 102 (a difference between the voltage values of the analog signals VDAC of the previous and subsequent output levels) is (1/(7.5+p))Cu×VREF, as illustrated in FIG. 14. A range (an output amplitude) of the voltage value of the analog signal VDAC output by the digital-to-analog converter 102 is (7/(7.5+p))Cu×VREF.

Next, a relation between the digital signals D and the analog signal VDAC when the digital-to-analog converter 102 adjusts a gain factor to ½ will be described with reference to FIG. 15. As described above, when a factor of a gain of an output amplitude of the analog signal VDAC adjusted and output by the digital-to-analog converter 102 is ½, the analog signal VDAC with a 3-bit resolution is output using three capacitances C of the capacitances C0, C1, and CA1 included in the capacitance unit 110 as voltage value generation capacitances, as in the digital-to-analog converter 100. Therefore, as in the digital-to-analog converter 100, the digital-to-analog converter 102 also controls values of the digital signals D0, D1, and DA1 such that the values of the digital signals D2 and DA2 are fixed (held) at "0." As in the digital-to-analog converter 100, the digital-to-analog converter 102 also outputs the analog signal VDAC with eight output levels in accordance with the values of the digital signals D0, D1, and DA1 (values of the digital signals D of 3 bits) corresponding to the three capacitances C of the capacitances C0, C1, and CA1 used when the gain factor is ½. In the description of FIG. 15, based on the idea similar to the case in which the gain factor illustrated in FIG. 3 is ½ in the digital-to-analog converter 100, the values of the digital signals D0, D1, and DA1, that is, nodes connected to the first terminals of the switches SW0, SW1, and SWA1, are also shown with binary codes of the digital signals D of 3 bits corresponding to the three capacitances C of the capacitances C0, C1, and CA1. In the description of FIG. 15, as in the digital-to-analog converter 100 when the gain factor illustrated in FIG. 3 is ½, among three capacitances C of the capacitances C0, C1, and CA1, a value of the digital signal D1 corresponding to the capacitance C1 with the largest capacitance value (=2 Cu) is set as the most significant bit (MSB) and a value of the digital signal DA1 corresponding to the capacitance CA1 with the smallest capacitance value (=0.5 Cu) is set as the least significant bit (LSB).

In the digital-to-analog converter 102, when the values of the digital signals D (the digital signals D1, D0, and DA1) are "000," the first terminals of the switches SW1, SW0, and SWA1 are also connected to the node with the ground potential, as in the digital-to-analog converter 100. Therefore, as illustrated in FIG. 15, the digital-to-analog converter 102 also outputs the voltage value (=VIN) of the input signal VIN sampled with all the capacitances C of the capacitances C0 to C2, and CA1 included in the capacitance unit 110 and the attenuation capacitance CAT as the analog signal VDAC with output level 0. That is, as in the digital-to-analog converter 100, the digital-to-analog converter 102 also outputs the voltage value (=VIN) of the input signal VIN as the analog signal VDAC with output level 0 irrespective of the gain of which the output amplitude of the analog signal VDAC to be output is adjusted.

In the digital-to-analog converter 102, when the value of the digital signal D is "001," the first terminals of the switches SW1 and SW0 are also connected to the node with the ground potential and the first terminal of the switch SWA1 is connected to the node with the reference voltage VREF, as in the digital-to-analog converter 100. Therefore, the digital-to-analog converter 102 outputs a voltage value obtained by adding a voltage value (=(0.5/(7.5+p))Cu× VREF) of the reference voltage VREF corresponding to a ratio of the capacitance value (=0.5 Cu) of the capacitance CA1 connected to the reference voltage VREF to the entire capacitance value (=(7.5+p)Cu) in the digital-to-analog converter 102 to the voltage value (=VIN) of the input signal VIN, as the analog signal VDAC of output level 1.

At this time, a voltage output of the analog signal VDAC output by the digital-to-analog converter 102 is expressed in Expression (39) below.

$$VDAC=VIN+(0.5/(7.5+p))Cu \times VREF \quad (39)$$

Similarly, as illustrated in FIG. 15, the digital-to-analog converter 102 outputs a voltage value obtained by adding a voltage value of the reference voltage VREF corresponding to a ratio of a sum capacitance value of the capacitance C connected to the reference voltage VREF to the entire capacitance value (=(7.5+p)Cu) in the digital-to-analog converter 102 to the voltage value (=VIN) of the input signal VIN as the analog signal VDAC of each output level in accordance with the value of the digital signal D.

In the digital-to-analog converter 102, when the value of the digital signal D is "111," the first terminals of the switches SW1, SW0, and SWA1 are also connected to the node with a reference voltage VREF, as in the digital-to-analog converter 100. Therefore, the digital-to-analog converter 102 outputs a voltage value obtained by adding a voltage value (=(3.5/(7.5+P))Cu×VREF) of the reference voltage VREF corresponding to a ratio of the sum capacitance value (=3.5 Cu) of the capacitances C1, C0, and CA1 connected to the reference voltage VREF to the entire capacitance value (=(7.5+P)Cu) to the voltage value (=VIN) of the input signal VIN, as the analog signal VDAC of output level 7.

At this time, a voltage value of the analog signal VDAC output by the digital-to-analog converter 102 is expressed in Expression (40) below.

$$VDAC=VIN+(3.5/(7.5+p))Cu \times VREF \quad (40)$$

In this way, when a factor of the gain of the output amplitude of the analog signal VDAC to be adjusted and output is ½, the digital-to-analog converter 102 outputs the analog signals VDAC with eight output levels obtained by adding the voltage value of (0/(7.5+p))Cu to (3.5/(7.5+p))Cu of the reference voltage VREF to the voltage value (=VIN) of the input signal VIN in accordance with the values of the input digital signals D0, D1, and DA1. Here, a change width of the voltage value of the analog signal VDAC output by the digital-to-analog converter 102 (a difference between the voltage values of the analog signals VDAC of the previous and subsequent output levels) is $(0.5/(7.5+p))$Cu×VREF, as illustrated in FIG. 15. A range (an output amplitude) of the voltage value of the analog signal VDAC output by the digital-to-analog converter 102 is $(3.5/(7.5+p))$Cu×VREF.

In this way, the digital-to-analog converter 102 is also configured to perform the gain adjustment on the output amplitude of the analog signal VDAC to be output by adding the capacitance CA1 to the capacitance unit 110 and adding the switch SWA1 to the switch unit 120, as in the digital-to-analog converter 101. The digital-to-analog converter 102 also outputs the analog signal VDAC with the 3-bit resolution in which the gain factor is adjusted to 1 or ½ using three capacitances C among the four capacitances C included in the capacitance unit 110 as the voltage value generation capacitances, as in the digital-to-analog converter 100. Thus, in the digital-to-analog converter 102, it is also possible to obtain similar advantageous effects to those of the digital-to-analog converter 100.

The digital-to-analog converter 102 is configured to attenuate the analog signal VDAC to be output at the pre-decided ratio by adding the attenuation capacitance CAT. Thus, the digital-to-analog converter 102 can further adjust the gain of any attenuated output amplitude, and thus it is possible to inhibit an increase in an area necessary to form the digital-to-analog converter 102 and realize the analog signal VDAC switched within the range of the plurality of gain-adjusted voltage values.

The digital-to-analog converter 102 can perform not only the adjustment of the gain and the attenuation at the pre-decided ratio but also the adjustment of the offset with respect to the analog signal VDAC with the 3-bit resolution to be output as in the digital-to-analog converter 100. Thus, in the digital-to-analog converter 102, it is also possible to realize the analog signal VDAC switched within the range of the plurality of voltage values with which the offset is adjusted in addition to the adjustment of the gain by inhibiting an increase in the area necessary to form the digital-to-analog converter 102, as in the digital-to-analog converter 100. The operation at the time of adjustment of the offset of the analog signal VDAC with the 3-bit resolution output by the digital-to-analog converter 102 can be considered to be similar to the operation at the time of adjustment of the offset of the analog signal VDAC in the digital-to-analog converter 100. Accordingly, detailed description of the operation at the time of adjustment of the offset of the analog signal VDAC in the digital-to-analog converter 102 will be omitted.

In the above-described digital-to-analog converter 102, the configuration in which the analog signal VDAC to be output is the analog signal with the 3-bit resolution has been described. However, the resolution of the analog signal VDAC output by the digital-to-analog converter 102 is not limited to 3 bits as in the digital-to-analog converter 100. For example, by applying the idea of the configuration or the operation of the above-described digital-to-analog converter 102 to a digital-to-analog converter with a resolution of a larger number of bits, it is possible to consider the configuration or the operation easily. Accordingly, detailed description of the configuration or the operation of the digital-to-analog converter with a resolution of a larger number of bits will be omitted.

The digital-to-analog converter according to the present invention is a digital-to-analog converter (for example, the digital-to-analog converter 100) that samples a voltage value of an input signal (for example, the input signal VIN) and outputs an analog signal (the analog signal VDAC) with a voltage value obtained by adding or subtracting a voltage value based on a reference voltage (for example, the reference voltage VREF) to or from the voltage value of the sampled input signal VIN at a predetermined resolution. The digital-to-analog converter includes a plurality of capacitances (the capacitances C) which are weighted (binary weighted, for example) and are more than the resolution of the analog signal VDAC by at least one and in which the first terminal is connected to an output node side of the analog signal VDAC and a second terminal is connected to one of a high-potential side (for example, the input terminal of the reference voltage VREF) of the reference voltage VREF and a low-potential (for example, a ground (GND) potential) side; and a plurality of switches (the switches SW) which switch a connection destination of the second terminal of the corresponding capacitance C to one of a node of a high-potential side and a node of a low-potential side in accordance with an input control signal (the digital signal D) in correspondence with each capacitance C or hold the connection destination. The number of capacitances C corresponding to the resolution of the analog signal VDAC to be output among the plurality of capacitances C is used as voltage value generation capacitances for generating an added or subtracted voltage value based on the reference voltage VREF by switching the node of the connection destination of the second terminal by the corresponding switches SW, and the remaining capacitances C that are not used as the voltage value generation capacitances among the plurality of capacitances C are used as gain adjustment capacitances for adjusting the gain of the added or subtracted voltage value based on the reference voltage VREF by holding the node of the connection destination of the second terminal by the corresponding switches SW. The digital-to-analog converter (for example, the digital-to-analog converter 100) has such a configuration.

In the digital-to-analog converter according to the present invention, each capacitance C is any capacitance C of main capacitances (for example, the capacitances C0, C1, and C2) binary weighted by a number corresponding to the resolution of the analog signal VDAC to be output and sub-capacitances (for example, the capacitances CA1 and CA2) with a capacitance value of 1/k times (where k=a multiplier of 2 equal to or greater than 2) the smallest capacitance value among the main capacitances. At the time of a change in a direction in which the gain value of the voltage value of the analog signal VDAC to be output is lowered, the number of sub-capacitances in accordance with the gain value changed in order from the sub-capacitance with the largest capacitance value among the sub-capacitances is included in the voltage value generation capacitance, and the same number of main capacitances as the number of sub-capacitances included in the voltage value generation capacitances in order from the main capacitance with the largest capacitance value among the voltage value generation capacitances are included in the gain adjustment capacitances. At the time of a change in a direction in which the gain value is raised, the number of main capacitances in accordance with the gain value changed in order from the main capacitance with the smallest capacitance value among the main capacitances is included in the gain adjustment capacitances, and the same number of sub-capacitances as the number of main capacitances included in the voltage value generation capacitances in order from the sub-capacitance with the smallest capacitance value among the sub-capacitances included in the voltage value generation capacitances are included in the gain adjustment capacitances. The digital-to-analog converter (for example, the digital-to-analog converter 100) has such a configuration.

In the digital-to-analog converter according to the present invention, the connection destination of the second terminal of at least one capacitance C among the plurality of capacitances C is switched to a node different from a node connected when the voltage value of the input signal VIN is sampled by the corresponding switch SW and is used for offset adjustment of the added or subtracted voltage value based on the reference voltage VREF in accordance with the voltage value generation capacitance. The digital-to-analog converter (for example, the digital-to-analog converter 100) has such a configuration.

In the digital-to-analog converter according to the present invention, when the voltage value of the input signal VIN is sampled, the connection destination of the second terminal of at least one capacitance C among the plurality of capacitances C is switched to a node different from the node connected at the time of no adjustment of the offset by the corresponding switch SW and is used for the offset adjustment of the added or subtracted voltage value based on the reference voltage VREF in accordance with the voltage value generation capacitance. The digital-to-analog converter (for example, the digital-to-analog converter 100) has such a configuration.

A driving method according to the present invention is a method of driving a digital-to-analog converter (for example, the digital-to-analog converter 100) that samples a voltage value of an input signal (for example, the input signal VIN) and outputs an analog signal (the analog signal VDAC) with a voltage value obtained by adding or subtracting a voltage value based on a reference voltage (for example, the reference voltage VREF) to or from the voltage value of the sampled input signal VIN at a predetermined resolution. In the driving method, the digital-to-analog converter (for example, the digital-to-analog converter 100) includes a plurality of capacitances which are weighted (binary weighted) and are more than the resolution of the analog signal VDAC by at least one and in which the first terminal is connected to an output node side of the analog signal VDAC and a second terminal is connected to one of a high-potential side (for example, the input terminal of the reference voltage VREF) of the reference voltage VREF and a low-potential (for example, a ground (GND) potential) side; and a plurality of switches (the switches SW) which switch a connection destination of the second terminal of the corresponding capacitance C to one of a node of a high-potential side and a node of a low-potential side in accordance with an input control signal (the digital signal D) in correspondence with each capacitance C or hold the connection destination. The driving method (for example, the method of driving the digital-to-analog converter 100) includes a step of switching a node of the connection destination of the second terminal by the corresponding switch SW using the number of capacitances C corresponding to the resolution of the analog signal VDAC to be output among the plurality of capacitances C as voltage value generation capacitances and generating the subtracted or added voltage value based on the reference voltage VREF; and a step of holding the node of the connection destination of the second terminal by the corresponding switches SW using the remaining capacitances C that are not used as the voltage value generation capacitances among the plurality of capacitances C as gain adjustment capacitances and adjusting the gain of the added or subtracted voltage value based on the reference voltage VREF.

As described above, in the digital-to-analog converter according to the present invention, the voltage value of the reference voltage VREF is gain-adjusted by a factor of up to 1/k by adding the capacitance C (for example, the capacitance CA1) with a capacitance value of a factor of 1/k (where k=a multiplier of 2 equal to or greater than 2) to the capacitance unit and adding the corresponding switch SW (for example, the switch SWA1) to the switch unit. In the digital-to-analog converter according to the present invention, the analog signal VDAC which has a predetermined resolution and in which the voltage value of the reference voltage VREF gain-adjusted by a factor of up to 1/k is output using the number of capacitances C corresponding to the resolution of the analog signal VDAC to be output among the plurality of capacitances C included in the capacitance unit and the added capacitances C as the voltage value generation capacitances. That is, in the digital-to-analog converter according to the present invention, the plurality of capacitances C included in the capacitance unit are used as the capacitances C for generating the voltage value of the analog signal VDAC to be output at the predetermined resolution in response to the switching of the corresponding switches SW after the voltage value of the input signal VIN is sampled. The digital-to-analog converter according to the present invention fixes (holds) the remaining capacitances C included in the capacitance unit without switching the corresponding switches SW. Thus, the digital-to-analog converter according to the present invention can output the analog signal VDAC in which the voltage value of the reference voltage VREF of which the gain is adjusted by a factor of up to 1/k is added to or subtracted from the voltage value of the input signal VIN.

Further, in the digital-to-analog converter according to the present invention, the capacitance value of the capacitance C (for example, the capacitance CA1) added for the gain adjustment of the output amplitude of the analog signal VDAC to be output is a capacitance value smaller than the capacitance C with the smallest capacitance value when the gain factor is 1. In the digital-to-analog converter according to the present invention, the switch SW (for example, the switch SWA1) added for the gain adjustment of the output amplitude of the analog signal VDAC to be output has a similar configuration to the other switches SW (for example, the switches SW0 to SW2) used to switch the reference voltage VREF and included in the switch unit. In other words, the switch SW (for example, the switch SWA1) added to the digital-to-analog converter according to the present invention is not the switch SW configured to realize special performance. That is, while the digital-to-analog converter according to the present invention is configured such that the analog signal VDAC switched within the range of the plurality of voltage values of which the gain factors are adjusted to 1 to 1/k is output, the capacitance C with a smaller value than the capacitance C with the smallest capacitance value and the switch SW similar to the switch SW used to switch the reference voltage VREF are merely added. That is, the digital-to-analog converter according to the present invention can be realized by merely adding the smaller number of constituent elements as the analog signal VDAC with a high resolution is output. Accordingly, in the digital-to-analog converter according to the present invention, it is possible to inhibit an increase in an area necessary to form the digital-to-analog converter according to the present invention.

(Analog-to-Digital Converter)

Figure 16:
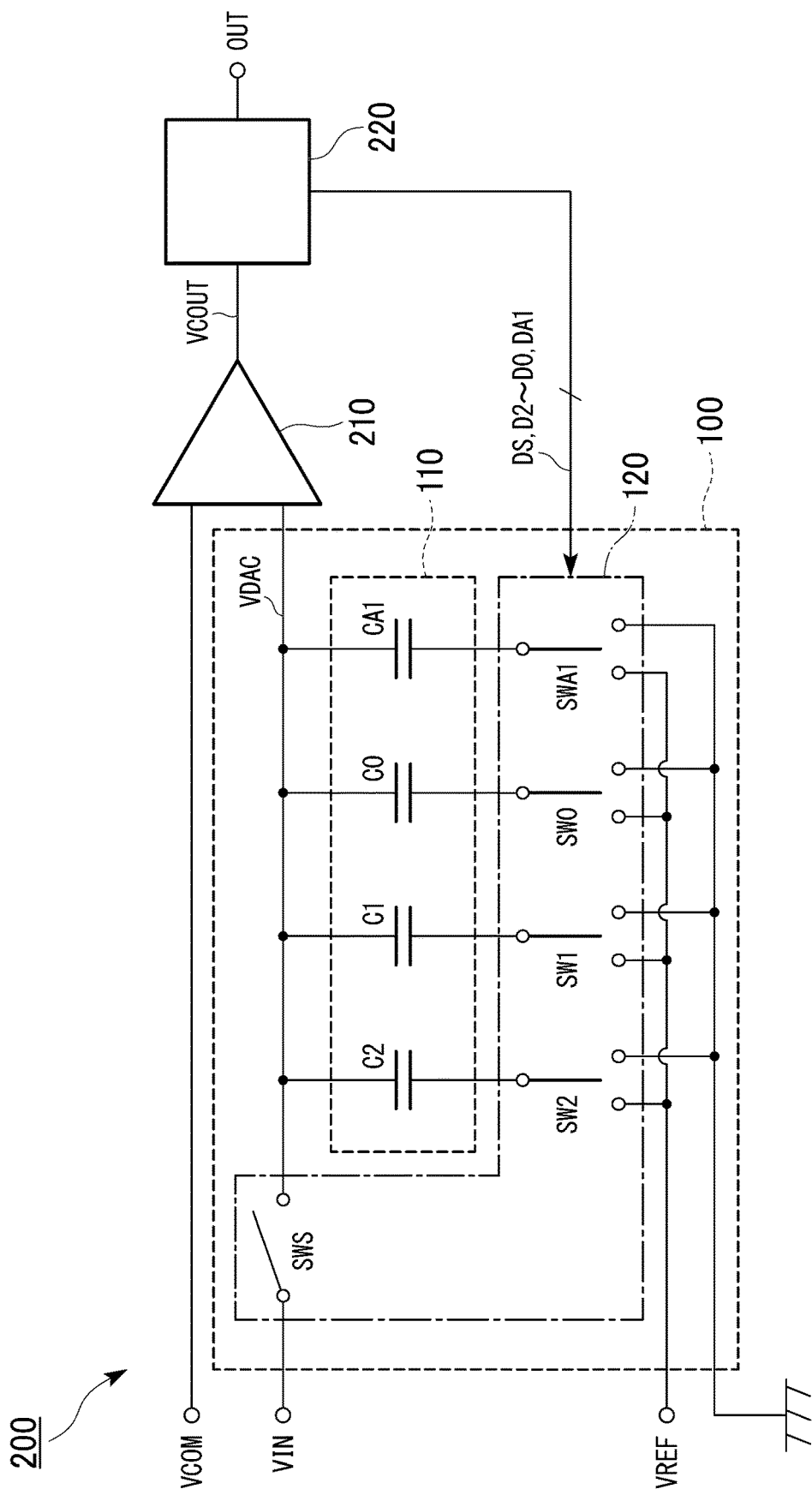
FIG. 16 is a block diagram showing an example of a configuration of an analog-to-digital converter of the present invention.

Next, an analog-to-digital converter in which the digital-to-analog converter according to the present invention is used will be described. In the following description, an analog-to-digital converter in which the digital-to-analog converter 100 is used will be described. FIG. 16 is a block diagram illustrating an example of a configuration of the analog-to-digital converter according to the present invention. An analog-to-digital converter 200 illustrated in FIG. 16 includes the digital-to-analog converter 100, a comparator 210, and a control circuit 220.

As described above, the digital-to-analog converter 100 outputs the analog signal VDAC with a 3-bit resolution in which a voltage value based on the reference voltage VREF of which the gain factor is adjusted to 1 or ½ is added to the voltage value of the input signal VIN, to the comparator 210.

The comparator 210 compares the voltage value of the analog signal VDAC output from the digital-to-analog converter 100 with an input comparison target voltage of an input comparison target voltage (in FIG. 16, a comparison reference voltage VCOM). The comparator 210 outputs a digital signal VCOUT indicating a comparison result in accordance with a magnitude relation between the compared voltage value of the analog signal VDAC and voltage value of the comparison reference voltage VCOM to the control circuit 220. More specifically, the comparator 210 outputs the digital signal VCOUT indicating whether the voltage value of the analog signal VDAC is a voltage value equal to or greater than the comparison reference voltage VCOM or a voltage value less than the comparison reference voltage VCOM to the control circuit 220. For example, when the voltage value of the analog signal VDAC is the voltage value equal to or greater than the voltage value of the comparison reference voltage VCOM, the comparator 210 outputs the digital signal VCOUT with the "high" level to the control circuit 220. Conversely, when the voltage value of the analog signal VDAC is the voltage value less than the comparison reference voltage VCOM, the comparator 210 outputs the digital signal VCOUT with a "low" level to the control circuit 220. In the analog-to-digital converter 200, a method of comparing the magnitude relation between the voltage value of the analog signal VDAC and the voltage value of the comparison reference voltage VCOM by the comparator 210, the configuration of the comparator 210, and the like are not particularly regulated.

The number, the kinds, and the like of comparison reference voltages VCOM are not particularly regulated. For example, the comparator 210 may be configured to perform a comparison operation using two kinds of comparison reference voltages VCOM. The comparator 210 may be configured to use signals in which the input signal VIN is reversed as the comparison reference voltages VCOM. The comparator 210 may be configured to input the comparison reference voltage VCOM to the digital-to-analog converter 100 and compare the voltage value of the analog signal VDAC output from the digital-to-analog converter 100 with the voltage value of the input signal VIN which has been input.

The control circuit 220 generates the digital signals D (the digital signals DS, D0 to D2, and DA1) based on the digital signal VCOUT output from the comparator 210 and outputs the generated digital signals D to the digital-to-analog converter 100. Each of the digital signals D output by the control circuit 220 is connected to a control terminal of each of the corresponding switches SW included in the switch unit 120 in the digital-to-analog converter 100. Thus, the control circuit 220 causes the digital-to-analog converter 100 to operate an operation of outputting the above-described analog signal VDAC with a 3-bit resolution. The control circuit 220 is a so-called successive approximation register (SAR) logic circuit. The control circuit 220 determines the magnitude of the voltage value of the input signal VIN which is an analog-to-digital switching target based on the digital signal VCOUT output from the comparator 210 in order. The control circuit 220 outputs a value indicating the finally determined magnitude of the voltage value of the input signal VIN as a digital signal OUT which is a result of the analog-to-digital conversion of the input signal VIN by the analog-to-digital converter 200. The digital-to-analog converter 100 included in the analog-to-digital converter 200 is a digital-to-analog converter that outputs the analog signal VDAC with the 3-bit resolution. Therefore, the control circuit 220 outputs the digital signal OUT with the 3-bit resolution as an analog-to-digital conversion result of the input signal VIN.

In the analog-to-digital converter 200, a method or a configuration in which the control circuit 220 generates the digital signals D, a direction or a configuration in which the digital-to-analog converter 100 is operated (controlled), a structure of the digital signal OUT to be output, and the like are not particularly regulated. The analog-to-digital converter 200 may be configured such that the digital signal D output by the control circuit 220 also serves as the digital signal OUT. In the analog-to-digital converter 200, a method of switching a ratio (a factor of 1 or ½) at the time of gain adjustment of an output amplitude of the analog signal VDAC output in the digital-to-analog converter 100 by the control circuit 220 is not particularly regulated either. For example, the control circuit 220 may be configured such that the ratio at the time of gain adjustment of the output amplitude of the analog signal VDAC output by the digital-to-analog converter 100 is switched in response to control from an external signal processing circuit. The number of comparisons or the like necessary for the analog-to-digital converter 200 to perform analog-to-digital conversion of a desired resolution is not particularly regulated. For example, the digital-to-analog converter 100 and the control circuit 220 included in the analog-to-digital converter 200 may be configured to determine 1 bit among the 3-bit resolution through the comparison operations performed a plurality of times. Therefore, the digital-to-analog converter 100 may be configured such that each capacitance C in the capacitance unit 110 includes a plurality of capacitances with the same capacitance value.

In this configuration, the analog-to-digital converter 200 is configured as a successive approximation analog-to-digital converter. Since the digital-to-analog converter 100 adjusts the gain factor to 1 or ½ and outputs the analog signal VDAC, as described above, the analog-to-digital converter 200 is configured as a successive approximation analog-to-digital converter that adjusts an input/output gain factor to 1 or ½ and performs analog-to-digital conversion on the input signal VIN. Therefore, in the analog-to-digital converter 200, even when the same input signal VIN is subjected to the analog-to-digital conversion due to a factor of 1, ½, or the like of the gain of the analog signal VDAC output by the digital-to-analog converter 100, a value of the digital signal OUT which is the result of the analog-to-digital conversion differs. For example, a case in which the magnitude of the input signal VIN is equivalent to ½ of the value of the output amplitude of the analog signal VDAC output when the gain factor is 1 can be considered. In this case, when a factor of the gain of the analog signal VDAC output by the digital-to-analog converter 100 is 1, the value of the digital signal OUT is "011." On the other hand, when a factor of the gain of the analog signal VDAC output by the digital-to-analog converter 100 is ½, the value of the digital signal OUT is "111."

In the analog-to-digital converter 200, when the input signal VIN is subjected to the analog-to-digital conversion, the control circuit 220 obtains a determination result during the analog-to-digital conversion in order bit by bit from the most significant bit (MSB) to the least significant bit (LSB). In the analog-to-digital converter 200, the control circuit 220 outputs the digital signal OUT indicating the magnitude of the voltage value of the final input signal VIN after the determination result of the least significant bit (LSB) is obtained.

Figure 17:
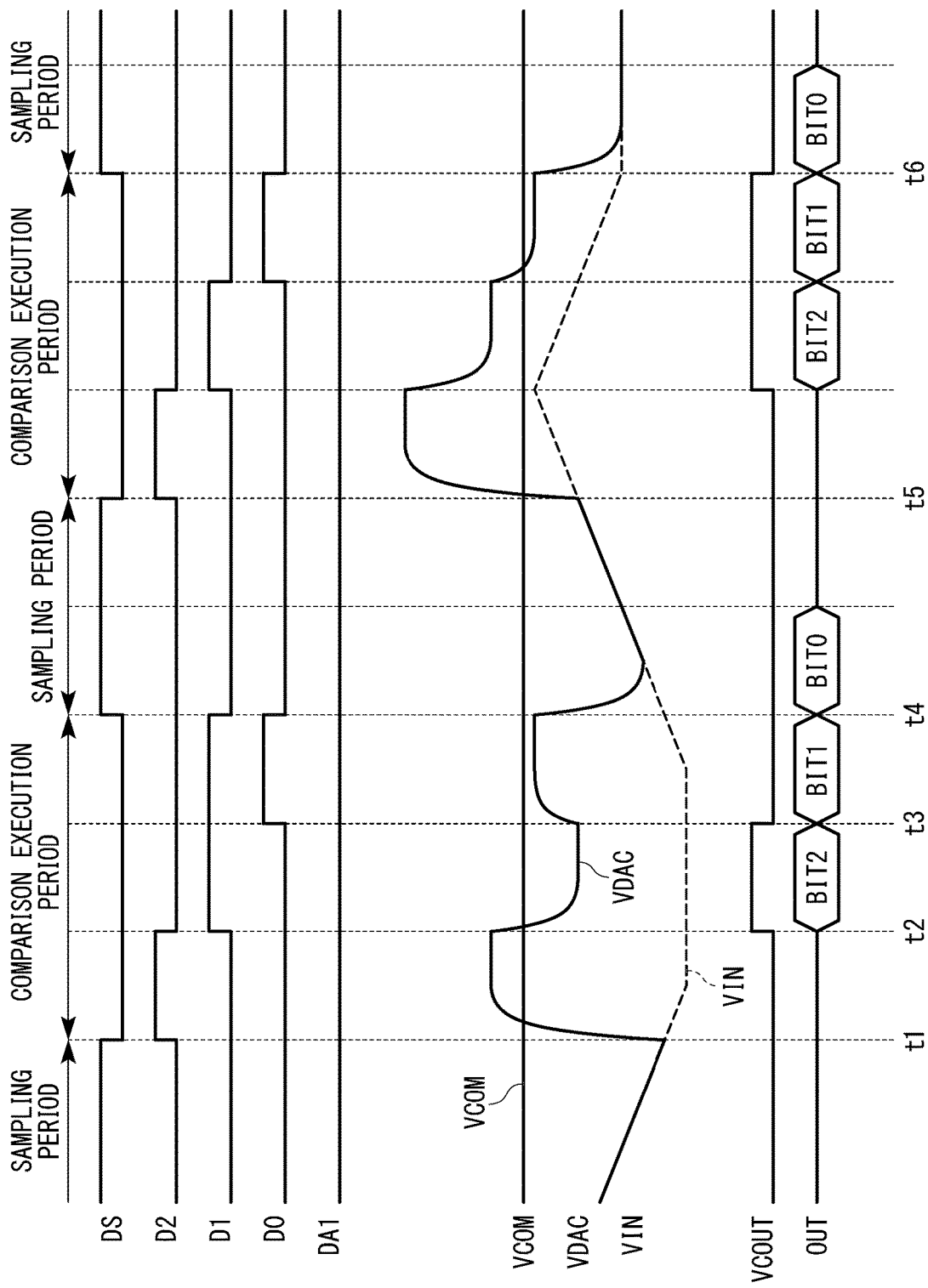
FIG. 17 is a timing chart showing an example of the operation of the analog-to-digital converter of the present invention.

Here, an operation of the analog-to-digital converter 200 will be described. First, an operation of the analog-to-digital converter 200 performing analog-to-digital conversion on the voltage value of the input signal VIN at the gain factor value of 1 will be described. FIG. 17 is a timing chart illustrating an example of an operation (an analog-to-digital conversion operation) of the analog-to-digital converter 200 according to the present invention. FIG. 17 illustrates an example of an operation in a case in which a factor of an input/output gain in the analog-to-digital converter 200 is 1 by causing the digital-to-analog converter 100 to output the analog signal VDAC in which the gain factor is adjusted to 1 and is added to the voltage value of the input signal VIN.

FIG. 17 illustrates each signal during each operation period when the analog-to-digital converter 200 performs analog-to-digital conversion on the voltage value of the input signal VIN. More specifically, FIG. 17 illustrates signals of the digital signals D (the digital signals DS, D2 to D0, and DA1) output to the digital-to-analog converter 100 by the control circuit 220. FIG. 17 illustrates a determination completion timing of each bit in the digital signal OUT output as a result of the analog-to-digital conversion by the analog-to-digital converter 200. FIG. 17 illustrates the analog signal VDAC output to the comparator 210 in accordance with the digital signal D output from the control circuit 220 by the digital-to-analog converter 100 in comparison with the input signal VIN and the comparison reference voltage VCOM. FIG. 17 illustrates the digital signal VCOUT of a comparison result obtained by causing the comparator 210 to compare the voltage value of the analog signal VDAC with the voltage value of the comparison reference voltage VCOM.

In the description of FIG. 17, it is assumed that the switch SWS included in the switch unit 120 in the digital-to-analog converter 100 enters a short-circuit state when the digital signal DS is in the "high" level, and the switch SWS enters an open state when the digital signal DS is in the "low" level. In the description of FIG. 17, it is assumed that the first terminals of the corresponding switches SW2 to SW0 and SWA1 included in the switch unit 120 in the digital-to-analog converter 100 are connected to the node with the reference voltage VREF when the digital signals D2 to D0 and DA1 is in the "high" level. It is assumed that the first terminal of the corresponding switches SW2 to SW0 and SWA1 are connected to the node with the ground potential when the digital signals D2 to D0 and DA1 is in the "low" level. In the description of FIG. 17, it is assumed that the comparator 210 outputs the digital signal VCOUT in the "high" level when the voltage value of the analog signal VDAC is a voltage value equal to or greater than the voltage value of the comparison reference voltage VCOM, and outputs the digital signal VCOUT with the "low" level when the voltage value of the analog signal VDAC is a voltage value less than the digital signal VCOUT.

In the following description, a relation between the analog signal VDAC and the comparison reference voltage VCOM during each operation period in the analog-to-digital converter 200 with reference to the voltage value of the analog signal VDC output by the digital-to-analog converter 100 when the gain factor is 1, as illustrated in FIG. 2, will be also described. In the following description, values of the digital signals D (the digital signals D2, D1, and D0) of 3 bits corresponding to three capacitances C of the capacitances C2 to C0 used when the gain factor is 1 will be described appropriately with binary codes. As described above, when the gain of the output amplitude of the analog signal VDAC output with the gain factor value of 1 by the digital-to-analog converter 100 is adjusted, the digital signal DA1 corresponding to the capacitance CA1 remains in the "low" level without change during all the operation periods. Therefore, description thereof will be omitted appropriately.

When the analog-to-digital converter 200 starts the analog-to-digital conversion operation, the control circuit 220 first sets the "high level" in the digital signal DS and sets the "low level" in each of the digital signals D2 to D0 and DA1 during a sampling period. Thus, in the digital-to-analog converter 100, the input terminal of the input signal VIN is connected to the node of the analog signal VDAC by the switch SWS and the second terminals of the capacitances C2 to C0 and CA1 are connected to the node with the ground potential by the switches SW2 to SW0 and SWA1. In the digital-to-analog converter 100, the capacitances C2 to C0 and CA1 are charged with charges in accordance with a potential difference between the potential of the input signal VIN and the ground potential. Thereafter, the control circuit 220 sets the "low" level in the digital signal DS at timing t1. Thus, in the digital-to-analog converter 100, the input terminal of the input signal VIN is disconnected from the node of the analog signal VDAC by the switch SWS. In the digital-to-analog converter 100, the voltage value of the input signal VIN is sampled and charges are held in all the capacitances C of the capacitances C2 to C0 and CA1 at timing t1.

At this time, the voltage value of the analog signal VDAC output by the digital-to-analog converter 100 is expressed in Expression (1) above and charges Q stored in the entire capacitance unit 110 are expressed in Expression (2) above.

During a comparison execution period, the control circuit 220 sets the "high" level in the digital signal D2 from timing t1 and holds the "low" level in each of the digital signals D1 and D0. That is, the control circuit 220 sets "100" in the value of the digital signals D of 3 bits. Thus, in the digital-to-analog converter 100, the second terminal of the capacitance C2 is connected to the node with the reference voltage VREF by the switch SW2 and the second terminals of the capacitances C1 and C0 are connected to the node with the ground potential by the switches SW1 and SW0, respectively. Therefore, the analog signal VDAC output by the digital-to-analog converter 100 has a voltage value of output level 4 expressed in Expression (7) above and obtained by adding the voltage value (=(4/7.5)Cu×VREF) of the reference voltage VREF corresponding to a ratio of a capacitance value (=2 Cu) of the capacitance C2 connected to the node with the reference voltage VREF to the sum capacitance value (=7.5 Cu) of all the capacitances C to the voltage value (=VIN) of the input signal VIN. FIG. 17 illustrates an aspect in which the voltage value of the analog signal VDAC is the voltage value (VIN+(4/7.5) Cu×VREF) of output level 4.

The comparator 210 outputs the digital signal VCOUT indicating a comparison result obtained by comparing the voltage value of the analog signal VDAC at this time with the voltage value of the comparison reference voltage VCOM to the control circuit 220. FIG. 17 illustrates an aspect in which the comparator 210 compares the voltage value of the analog signal VDAC with the voltage value of the comparison reference voltage VCOM at timing t2 and outputs the digital signal VCOUT. FIG. 17 illustrates an aspect in which the control circuit 220 acquires the digital signal VCOUT, holds the value of a most significant bit BIT2 of the digital signal OUT, and outputs the digital signal OUT. More specifically, since the voltage value of the analog signal VDAC is a voltage value equal to or greater than the voltage value of the comparison reference voltage VCOM, the comparator 210 outputs the digital signal VCOUT with the "high" level. Thus, FIG. 17 illustrates an aspect in which the control circuit 220 acquires the digital signal VCOUT with the "high" level, holds the digital signal VCOUT at the value of the most significant bit BIT2 of the digital signal OUT, and changes the value of the digital signal OUT.

Based on the digital signal VCOUT output from the comparator 210, at timing t2, the control circuit 220 determines whether the value of the digital signal D2 is switched. More specifically, when the digital signal VCOUT output from the comparator 210 is in the "high" level, the control circuit 220 sets the "low" level in the value of the digital signal D2 at timing t2. Conversely, when the digital signal VCOUT output from the comparator 210 is in the "low" level, the control circuit 220 holds the value of the digital signal D2 at the "high" level at timing t2. The control circuit 220 sets the "high" level in the digital signal D1 from timing t2. The control circuit 220 holds the "low" level in the digital signal D0.

Thus, the control circuit 220 sets the value of the digital signals D of 3 bits to one value of "010" and "110" in accordance with a comparison result (the digital signal VCOUT) at timing t2. That is, when the digital signal VCOUT output from the comparator 210 is in the "high" level, the control circuit 220 switches the voltage value of the analog signal VDAC from timing t2 to a voltage value (VIN+(2/7.5)Cu×VREF) of output level 2 expressed in Expression (5) above and obtained by subtracting the voltage value of (2/7.5)Cu×VREF from the current voltage value. Conversely, when the digital signal VCOUT output from the comparator 210 is in the "low" level, the control circuit 220 switches the voltage value of the analog signal VDAC from timing t2 to a voltage value (VIN+(6/7.5)Cu×VREF) of output level 6 expressed in Expression (9) above and obtained by adding the voltage value of (2/7.5)Cu×VREF to the current voltage value.

In FIG. 17, since the digital signal VCOUT output from the comparator 210 is in the "high" level, the control circuit 220 sets the value of the digital signals D of 3 bits to "010" from timing t2. That is, the control circuit 220 sets the "low" level in the value of the digital signal D2, sets the "high" level in the digital signal D1, and holds the "low" level in the digital signal D0. Thus, in the digital-to-analog converter 100, the second terminal of the capacitance C2 is connected to the node with the ground potential by the switch SW2, the second terminal of the capacitance C1 is connected to the node with the reference voltage VREF by the switch SW1, and the second terminal of the capacitance C0 is connected to the node with the ground potential by the switch SW0. Therefore, the analog signal VDAC output by the digital-to-analog converter 100 has a voltage value of output level 2 expressed in Expression (5) above and obtained by adding the voltage value (=(2/7.5)Cu×VREF) of the reference voltage VREF corresponding to a ratio of a capacitance value (=2 Cu) of the capacitance C1 connected to the node with the reference voltage VREF to the sum capacitance value (=7.5 Cu) of all the capacitances C to the voltage value (=VIN) of the input signal VIN. FIG. 17 illustrates an aspect in which the voltage value of the analog signal VDAC is the voltage value (VIN+(2/7.5)Cu×VREF) of output level 2.

The comparator 210 outputs the digital signal VCOUT indicating a comparison result obtained by comparing the voltage value of the analog signal VDAC at this time with the voltage value of the comparison reference voltage VCOM to the control circuit 220. FIG. 17 illustrates an aspect in which the comparator 210 compares the voltage value of the analog signal VDAC with the voltage value of the comparison reference voltage VCOM at timing t3 and outputs the digital signal VCOUT. FIG. 17 illustrates an aspect in which the control circuit 220 acquires the digital signal VCOUT, holds the value of a most significant bit BIT1 (=the most significant bit BIT2−1) of the digital signal OUT, and outputs the digital signal OUT. More specifically, since the voltage value of the analog signal VDAC is a voltage lower than the comparison reference voltage VCOM, the comparator 210 outputs the digital signal VCOUT with the "low" level. Thus, FIG. 17 illustrates an aspect in which the control circuit 220 acquires the digital signal VCOUT with the "low" level, holds the digital signal VCOUT at the value of the bit BIT1 of the digital signal OUT, and changes the value of the digital signal OUT.

Based on the digital signal VCOUT output from the comparator 210, at timing t3, the control circuit 220 determines whether the value of the digital signal D1 is switched. The idea in the case in which the control circuit 220 determines whether the value of the digital signal D1 is switched is similar to the idea in the case in which it is determined whether the value of the digital signal D2 is switched. That is, when the digital signal VCOUT output from the comparator 210 is in the "high" level, the control circuit 220 sets the "low" level in the value of the digital signal D1 at timing t3. Conversely, when the digital signal VCOUT output from the comparator 210 is in the "low" level, the control circuit 220 holds the value of the digital signal D1 in the "high" level at timing t3. The control circuit 220 sets the "high" level in the digital signal D0 from timing t3.

Thus, the control circuit 220 changes the value of the digital signals D of 3 bits in accordance with the comparison result (the digital signal VCOUT) at timing t3. More specifically, when the current value of the digital signals D of 3 bits is "010," the control circuit 220 sets the value of the digital signals D of 3 bits to one value of "001" and "011" from timing t3. Conversely, when the current value of the digital signals D of 3 bits is "110," the control circuit 220 sets the value of the digital signals D of 3 bits to one value of "101" and "111" from timing t3.

That is, when the current value of the digital signals D of 3 bits is "010" and the digital signal VCOUT output from the comparator 210 is in the "high" level, the control circuit 220 switches the voltage value of the analog signal VDAC from timing t3 to a voltage value (VIN+(1/7.5)Cu×VREF) of output level 1 expressed in Expression (4) above and obtained by subtracting the voltage value of (1/7.5)Cu×VREF from the current voltage value. Conversely, when the current value of the digital signals D of 3 bits is "010" and the digital signal VCOUT output from the comparator 210 is in the "low" level, the control circuit 220 switches the voltage value of the analog signal VDAC from timing t3 to a voltage value (VIN+(3/7.5)Cu×VREF) of output level 3 expressed in Expression (6) above and obtained by adding the voltage value of (1/7.5)Cu×VREF to the current voltage value.

When the current value of the digital signals D of 3 bits is "110" and the digital signal VCOUT output from the comparator 210 is in the "high" level, the control circuit 220 switches the voltage value of the analog signal VDAC from timing t3 to a voltage value (VIN+(5/7.5)Cu×VREF) of output level 5 expressed in Expression (8) above and obtained by subtracting the voltage value of (1/7.5)Cu× VREF from the current voltage value. Conversely, when the current value of the digital signals D of 3 bits is "110" and the digital signal VCOUT output from the comparator 210 is in the "low" level, the control circuit 220 switches the voltage value of the analog signal VDAC from timing t3 to a voltage value (VIN+(7/7.5)Cu×VREF) of output level 7 expressed in Expression (10) above and obtained by adding the voltage value of (1/7.5)Cu×VREF to the current voltage value.

In FIG. 17, since the current value of the digital signals of 3 bits is "010" and the digital signal VCOUT output from the comparator 210 is in the "low" level, the control circuit 220 sets the value of the digital signals D of 3 bits to "011" from timing t3. That is, the control circuit 220 holds the "low" level in the value of the digital signal D2, holds the "high" level in the digital signal D1, and set the digital signal D0 to the "high" level. Thus, in the digital-to-analog converter 100, the second terminal of the capacitance C2 is connected to the node with the ground potential by the switch SW2, the second terminal of the capacitance C1 is connected to the node with the reference voltage VREF by the switch SW1, and the second terminal of the capacitance C0 is connected to the node with the reference voltage VREF by the switch SW0. Therefore, the analog signal VDAC output by the digital-to-analog converter 100 has a voltage value of output level 3 expressed in Expression (6) above and obtained by adding the voltage value (=(3/7.5) Cu×VREF) of the reference voltage VREF corresponding to a ratio of a sum capacitance value (=3 Cu) of the capacitances C1 and C0 connected to the node with the reference voltage VREF to the sum capacitance value (=7.5 Cu) of all the capacitances C to the voltage value (=VIN) of the input signal VIN. FIG. 17 illustrates an aspect in which the voltage value of the analog signal VDAC is the voltage value (VIN+(3/7.5)Cu× VREF) of output level 3.

The comparator 210 outputs the digital signal VCOUT indicating a comparison result obtained by comparing the voltage value of the analog signal VDAC at this time with the voltage value of the comparison reference voltage VCOM to the control circuit 220. FIG. 17 illustrates an aspect in which the comparator 210 compares the voltage value of the analog signal VDAC with the voltage value of the comparison reference voltage VCOM at timing t4 and outputs the digital signal VCOUT. FIG. 17 illustrates an aspect in which the control circuit 220 acquires the digital signal VCOUT, holds the value of the bit BIT0 (=the most significant bit BIT2−2: the least significant bit in the analog-to-digital converter 200) of the digital signal OUT, and outputs the digital signal OUT. More specifically, since the voltage value of the analog signal VDAC is a voltage lower than the comparison reference voltage VCOM, the comparator 210 outputs the digital signal VCOUT with the "low" level. Thus, FIG. 17 illustrates an aspect in which the control circuit 220 acquires the digital signal VCOUT with the "low" level, holds the digital signal VCOUT at the value of the bit BIT0 of the digital signal OUT, and changes the value of the digital signal OUT.

In this way, the control circuit 220 acquires the digital signal VCOUT output from the comparator 210 in order bit by bit from the most significant bit (MSB) to the least significant bit (LSB) and holds the value of each bit BIT of the digital signal OUT during the comparison execution period. The control circuit 220 outputs the finally held value of each bit BIT as the digital signal OUT indicating the magnitude of the voltage value of the final input signal VIN subjected to the analog-to-digital conversion by the analog-to-digital converter 200.

In the description of the operation of the above-described analog-to-digital converter 200, the operation of outputting the finally held value of each bit BIT as the digital signal OUT indicating the magnitude of the voltage value of the final input signal VIN after the value of each bit BIT is held at the determination completion timing of each bit in the digital signal OUT, that is, after the value of the least significant bit BIT0 is confirmed has been described. That is, the operation of the analog-to-digital converter 200 which is an analog-to-digital converter outputting the digital signal OUT in a parallel format has been described. However, a case in which the analog-to-digital converter 200 is the analog-to-digital converter outputting the digital signal OUT in a serial output format can also be considered. In this case, the analog-to-digital converter 200 sequentially outputs the digital signal OUT indicating the magnitude of the voltage value of the final input signal VIN whenever a determination result of each bit BIT is obtained.

Thereafter, the analog-to-digital converter 200 performs analog-to-digital conversion on the voltage values of the input signals VIN which have been sequentially input by repeating the operation during the sampling period and the operation during the comparison execution period, as described above. In FIG. 17, the analog-to-digital converter 200 starts sampling the subsequent input signal VIN from timing t4 and starts a comparison operation of comparing the voltage value of the analog signal VDAC with the voltage value of the comparison reference voltage VCOM from timing t5. In FIG. 17, during the comparison execution period from timing t5 to timing t6, the comparison operation is performed based on the voltage value of the input signal VIN which has been subsequently input and the value of each bit BIT is held in accordance with the comparison determination.

As illustrated in FIG. 17, the analog-to-digital converter 200 may start sampling the subsequent input signal VIN from any timing and perform the comparison operation based on the voltage value of the subsequent input signal VIN after the control circuit 220 acquires the digital signal VCOUT corresponding to the least significant bit (LSB) in the input signal VIN subjected to the current analog-to-digital conversion and holds the values of all the bits BIT. FIG. 17 illustrates an aspect in which the output of the bit BIT0 from timing t4 ends during the sampling period of the subsequent input signal VIN. For example, when the sampling period of the subsequent input signal VIN is short, a timing at which the bit BIT0 is output overlaps timing t5 at which the sampling of the subsequent input signal VIN is completed and the comparison operation starts in some cases. Here, the output of the bit BIT0 from timing t4 does not overlap the output of the bit BIT2 corresponding to the subsequent input signal VIN.

Figure 18:
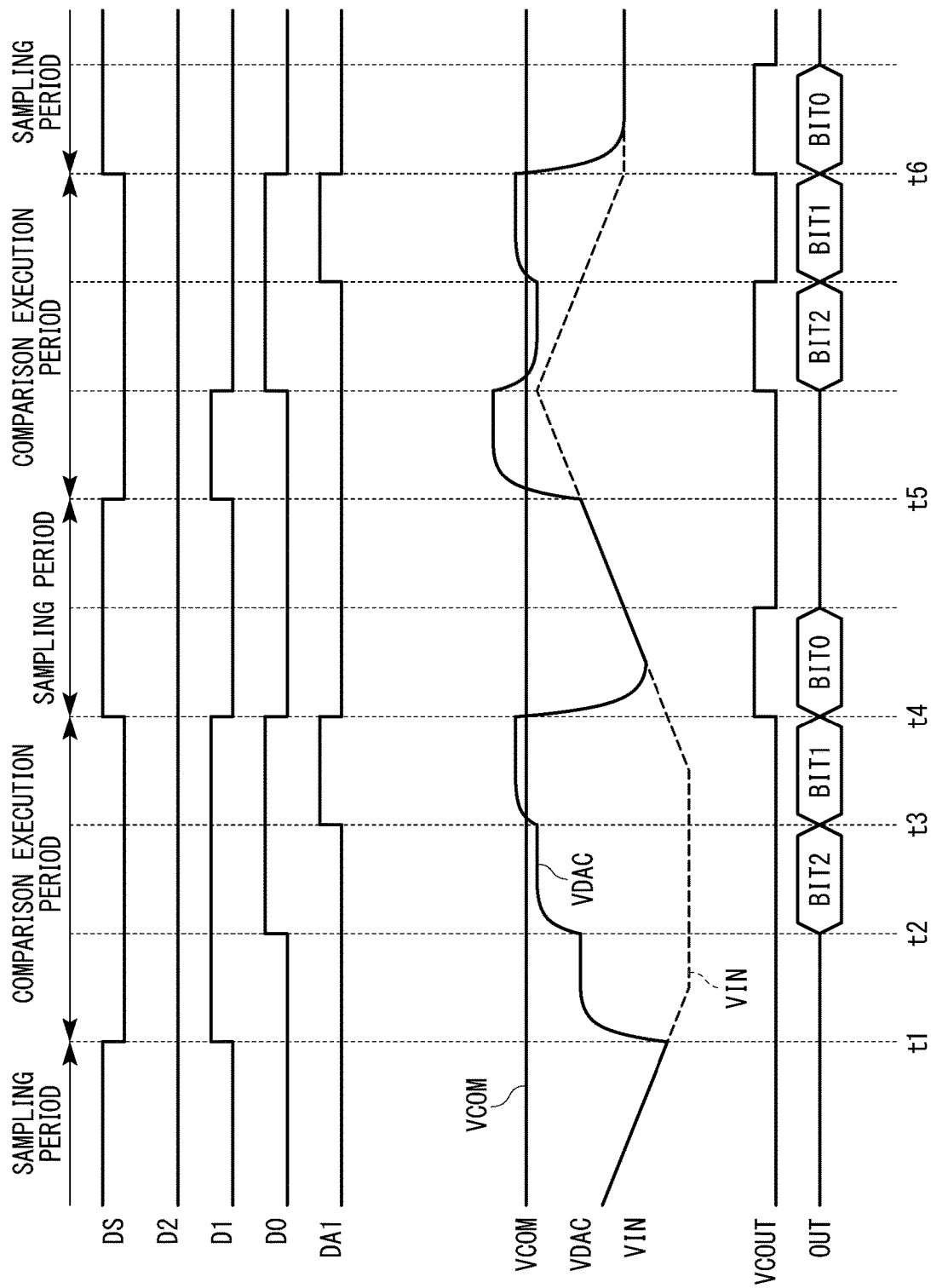
FIG. 18 is a timing chart showing an example of another operation of the analog-to-digital converter of the present invention.

Next, an operation of the analog-to-digital converter 200 performing analog-to-digital conversion on the voltage value of the input signal VIN at a gain factor value of 2 will be described. FIG. 18 is a timing chart illustrating an example of another operation (an analog-to-digital conversion operation) of the analog-to-digital converter 200 according to the present invention. FIG. 18 illustrates an example of an operation in a case in which a factor of an input/output gain in the analog-to-digital converter 200 is 2 by causing the digital-to-analog converter 100 to output the analog signal VDAC in which a factor of the gain is adjusted to ½ and is added to the voltage value of the input signal VIN.

FIG. 18 illustrates each signal during each operation period when the analog-to-digital converter 200 performs analog-to-digital conversion on the voltage value of the input signal VIN as in the case in which the voltage value of the input signal VIN is subjected to the analog-to-digital conversion at the gain factor value of 1, as illustrated in FIG. 17. In the description of FIG. 18, meanings of signal levels in each signal or an operation of each constituent element in accordance with the signal level are similar to those in the description of FIG. 17.

In the following description, a relation between the analog signal VDAC and the comparison reference voltage VCOM during each operation period in the analog-to-digital converter 200 with reference to the voltage value of the analog signal VDC output by the digital-to-analog converter 100 when the gain factor is ½, as illustrated in FIG. 3, will be also described. In the following description, values of the digital signals D (the digital signals D1, D0, and DA1) of 3 bits corresponding to three capacitances C of the capacitances C0, C1, and CA1 used when a factor of the gain of the digital-to-analog converter 100 is ½ will be described appropriately with binary codes. As described above, when a factor of the gain of the output amplitude of the analog signal VDAC output with the gain value of ½ by the digital-to-analog converter 100 is adjusted, the digital signal D2 corresponding to the capacitance C2 remains in the "low" level without change during all the operation periods. Therefore, description thereof will be omitted appropriately.

When the analog-to-digital converter 200 starts the analog-to-digital conversion operation, the control circuit 220 first samples the voltage value of the input signal VIN during the sampling period and holds the charges at timing t1 in all the capacitances C of the capacitances C0 to C2 and CA1 included in the capacitance unit 110 in the digital-to-analog converter 100. An operation of each constituent element in this case is similar to the operation in the case of the analog-to-digital conversion of the voltage value of the input signal VIN at the gain factor value of 1, as illustrated in FIG. 17. Accordingly, detailed description of an operation during the sampling period when the voltage value of the input signal VIN is subjected to the analog-to-digital conversion at the gain factor value of 2 will be omitted.

During the comparison execution period, the control circuit 220 first sets the "high" level in the digital signal D1 from timing t1 and holds the "low" level in each of the digital signals D0 and DA1. That is, the control circuit 220 sets "100" in the value of the digital signals D of 3 bits. Thus, in the digital-to-analog converter 100, the second terminal of the capacitance C1 is connected to the node with the reference voltage VREF by the switch SW1 and the second terminals of the capacitances C0 and CA1 are connected to the node with the ground potential by the switches SW0 and SWA1, respectively. Therefore, the analog signal VDAC output by the digital-to-analog converter 100 has a voltage value of output level 4 obtained by adding the voltage value of (=2/7.5)Cu×VREF) of the reference voltage VREF corresponding to a ratio of the capacitance value (=2 Cu) of the capacitance C1 connected to the node with the reference voltage VREF to the sum capacitance value (=7.5 Cu) of all the capacitances C to the voltage value (=VIN) of the input signal VIN. FIG. 18 illustrates an aspect in which the voltage value of the analog signal VDAC is the voltage value (VIN+(2/7.5)Cu×VREF) of output level 4.

The comparator 210 outputs the digital signal VCOUT indicating a comparison result obtained by comparing the voltage value of the analog signal VDAC at this time with the voltage value of the comparison reference voltage VCOM to the control circuit 220. FIG. 18 illustrates an aspect in which the comparator 210 compares the voltage value of the analog signal VDAC with the voltage value of the comparison reference voltage VCOM at timing t2 and outputs the digital signal VCOUT as in the operation in a case in which the voltage value of the input signal VIN is subjected to the analog-to-digital conversion at the gain factor value of 1, as illustrated in FIG. 17. FIG. 18 illustrates an aspect in which the control circuit 220 acquires the digital signal VCOUT, holds the value of a most significant bit BIT2 of the digital signal OUT, and outputs the digital signal OUT. More specifically, since the voltage value of the analog signal VDAC is a voltage value lower than the comparison reference voltage VCOM, the comparator 210 outputs the digital signal VCOUT with the "low" level. Thus, FIG. 18 illustrates an aspect in which the control circuit 220 acquires the digital signal VCOUT with the "low" level, holds the digital signal VCOUT at the value of the most significant bit BIT2 of the digital signal OUT, and changes the value of the digital signal OUT.

Based on the digital signal VCOUT output from the comparator 210, at timing t2, the control circuit 220 determines whether the value of the digital signal D1 is switched. The idea in the case in which the control circuit 220 determines whether the value of the digital signal D1 is switched is similar to the idea in the case in which it is determined whether the value of the digital signal D1 or D2 is switched when the voltage value of the input signal VIN is subjected to the analog-to-digital conversion at the gain factor value of 1. That is, when the digital signal VCOUT output from the comparator 210 is in the "high" level, the control circuit 220 sets the "low" level in the value of the digital signal D1 at timing t2. Conversely, when the digital signal VCOUT output from the comparator 210 is in the "low" level, the control circuit 220 holds the value of the digital signal D1 at the "high" level at timing t2. The control circuit 220 sets the "high" level in the digital signal D0 from timing t2. The control circuit 220 holds the "low" level in the digital signal DA1.

Thus, the control circuit 220 sets the value of the digital signals D of 3 bits to one value of "010" and "110" in accordance with a comparison result (the digital signal VCOUT) at timing t2 as in the operation in the case in which the voltage value of the input signal VIN is subjected to the analog-to-digital conversion at the gain factor value of 1, as illustrated in FIG. 17. That is, when the digital signal VCOUT output from the comparator 210 is in the "high" level, the control circuit 220 switches the voltage value of the analog signal VDAC from timing t2 to a voltage value (VIN+(1/7.5)Cu×VREF) of output level 2 expressed in Expression (12) above and obtained by subtracting the voltage value of (1/7.5)Cu×VREF from the current voltage value. Conversely, when the digital signal VCOUT output from the comparator 210 is in the "low" level, the control circuit 220 switches the voltage value of the analog signal VDAC from timing t2 to a voltage value (VIN+(3/7.5)Cu× VREF) of output level 6 obtained by adding the voltage value of (1/7.5)Cu×VREF to the current voltage value.

In FIG. 18, since the digital signal VCOUT output from the comparator 210 is in the "low" level, the control circuit 220 sets the value of the digital signals D of 3 bits to "110" from timing t2. That is, the control circuit 220 sets the "high" level in the value of the digital signal D1, sets the "high" level in the digital signal D0, and holds the "low" level in the digital signal DA1. Thus, in the digital-to-analog converter 100, the second terminal of the capacitance C1 is connected to the node with the reference voltage VREF by the switch SW1, the second terminal of the capacitance C0 is connected to the node with the reference voltage VREF by the switch SW0, and the second terminal of the capacitance CA1 is connected to the node with the ground potential by the switch SWA1. Therefore, the analog signal VDAC output by the digital-to-analog converter 100 has a voltage value of output level 6 obtained by adding the voltage value (=(3/7.5)Cu×VREF) of the reference voltage VREF corresponding to a ratio of a sum capacitance value (=3 Cu) of the capacitances C1 and C0 connected to the node with the reference voltage VREF to the sum capacitance value (=7.5 Cu) of all the capacitances C to the voltage value (=VIN) of the input signal VIN. FIG. 18 illustrates an aspect in which the voltage value of the analog signal VDAC is the voltage value (VIN+(3/7.5)Cu×VREF) of output level 6.

The comparator 210 outputs the digital signal VCOUT indicating a comparison result obtained by comparing the voltage value of the analog signal VDAC at this time with the voltage value of the comparison reference voltage VCOM to the control circuit 220. FIG. 18 illustrates an aspect in which the comparator 210 compares the voltage value of the analog signal VDAC with the voltage value of the comparison reference voltage VCOM at timing t3 and outputs the digital signal VCOUT as in the operation in the case in which the voltage value of the input signal VIN is subjected to the analog-to-digital conversion at the gain factor value of 1, as illustrated in FIG. 17. FIG. 18 illustrates an aspect in which the control circuit 220 acquires the digital signal VCOUT, holds the value of a most significant bit BIT1 (=the most significant bit BIT2−1) of the digital signal OUT at timing t3, and outputs the digital signal OUT. More specifically, since the voltage value of the analog signal VDAC is a voltage lower than the comparison reference voltage VCOM, the comparator 210 outputs the digital signal VCOUT with the "low" level. Thus, FIG. 18 illustrates an aspect in which the control circuit 220 acquires the digital signal VCOUT with the "low" level, holds the digital signal VCOUT at the value of the bit BIT1 of the digital signal OUT, and changes the value of the digital signal OUT.

Based on the digital signal VCOUT output from the comparator 210, at timing t3, the control circuit 220 determines whether the value of the digital signal D0 is switched. The idea in the case in which the control circuit 220 determines whether the value of the digital signal D0 is switched is similar to the idea in the case in which it is determined whether the value of the digital signal D2 or D1 is switched when the voltage value of the input signal VIN is subjected to the analog-to-digital conversion at the gain factor value of 1. The control circuit 220 sets the "high" level in the digital signal DA1 from timing t3.

Thus, the control circuit 220 changes the value of the digital signals D of 3 bits in accordance with the comparison result (the digital signal VCOUT) at timing t3 as in the operation in the case in which the voltage value of the input signal VIN is subjected to the analog-to-digital conversion at the gain factor value of 1, as illustrated in FIG. 17. More specifically, when the current value of the digital signals D of 3 bits is "010," the control circuit 220 sets the value of the digital signals D of 3 bits to one value of "001" and "011" from timing t3. Conversely, when the current value of the digital signals D of 3 bits is "110," the control circuit 220 sets the value of the digital signals D of 3 bits to one value of "101" and "111" from timing t3.

That is, when the current value of the digital signals D of 3 bits is "010" and the digital signal VCOUT output from the comparator 210 is in the "high" level, the control circuit 220 switches the voltage value of the analog signal VDAC from timing t3 to a voltage value (VIN+(0.5/7.5)Cu×VREF) of output level 1 expressed in Expression (11) above and obtained by subtracting the voltage value of (0.5/7.5)Cu×VREF from the current voltage value. Conversely, when the current value of the digital signals D of 3 bits is "010" and the digital signal VCOUT output from the comparator 210 is in the "low" level, the control circuit 220 switches the voltage value of the analog signal VDAC from timing t3 to a voltage value (VIN+(1.5/7.5)Cu×VREF) of output level 3 obtained by adding the voltage value of (0.5/7.5)Cu×VREF to the current voltage value.

When the current value of the digital signals D of 3 bits is "110" and the digital signal VCOUT output from the comparator 210 is in the "high" level, the control circuit 220 switches the voltage value of the analog signal VDAC from timing t3 to a voltage value (VIN+(2.5/7.5)Cu×VREF) of output level 5 obtained by subtracting the voltage value of (0.5/7.5)Cu×VREF from the current voltage value. Conversely, when the current value of the digital signals D of 3 bits is "110" and the digital signal VCOUT output from the comparator 210 is in the "low" level, the control circuit 220 switches the voltage value of the analog signal VDAC from timing t3 to a voltage value (VIN+(3.5/7.5)Cu×VREF) of output level 7 expressed in Expression (13) above and obtained by adding the voltage value of (0.5/7.5)Cu×VREF to the current voltage value.

In FIG. 18, since the current value of the digital signals D of 3 bits is "110" and the digital signal VCOUT output from the comparator 210 is in the "low" level, the control circuit 220 sets the value of the digital signals D of 3 bits to "111" from timing t3. That is, the control circuit 220 holds the "high" level in the value of the digital signal D1, holds the "high" level in the digital signal D0, and set the digital signal DA1 to the "high" level. Thus, in the digital-to-analog converter 100, the second terminal of the capacitance C1 is connected to the node with the reference voltage VREF by the switch SW1, the second terminal of the capacitance C0 is connected to the node with the reference voltage VREF by the switch SW0, and the second terminal of the capacitance CA1 is connected to the node with the reference voltage VREF by the switch SWA1. Therefore, the analog signal VDAC output by the digital-to-analog converter 100 has a voltage value of output level 7 expressed in Expression (13) above and obtained by adding the voltage value (=(3.5/7.5) Cu×VREF) of the reference voltage VREF corresponding to a ratio of a sum capacitance value (=3.5 Cu) of the capacitances C1, C0, and CA1 connected to the node with the reference voltage VREF to the sum capacitance value (=7.5 Cu) of all the capacitances C to the voltage value (=VIN) of the input signal VIN. FIG. 18 illustrates an aspect in which the voltage value of the analog signal VDAC is the voltage value (VIN+(3.5/7.5)Cu×VREF) of output level 7.

The comparator 210 outputs the digital signal VCOUT indicating a comparison result obtained by comparing the voltage value of the analog signal VDAC at this time with the voltage value of the comparison reference voltage VCOM to the control circuit 220. FIG. 18 illustrates an aspect in which the comparator 210 compares the voltage value of the analog signal VDAC with the voltage value of the comparison reference voltage VCOM at timing t4 and outputs the digital signal VCOUT as in the operation in the case in which the voltage value of the input signal VIN is subjected to the analog-to-digital conversion at the gain factor value of 1, as illustrated in FIG. 17. FIG. 18 illustrates an aspect in which the control circuit 220 acquires the digital signal VCOUT, holds the value of the bit BIT0 (=the most significant bit BIT2−2: the least significant bit in the analog-to-digital converter 200) of the digital signal OUT, and outputs the digital signal OUT. More specifically, since the voltage value of the analog signal VDAC is a voltage value equal to or greater than the comparison reference voltage VCOM, the comparator 210 outputs the digital signal VCOUT with the "high" level. Thus, FIG. 18 illustrates an aspect in which the control circuit 220 acquires the digital signal VCOUT with the "high" level, holds the digital signal VCOUT at the value of the bit BIT0 of the digital signal OUT, and changes the value of the digital signal OUT.

In this way, the control circuit 220 acquires the digital signal VCOUT output from the comparator 210 in order bit by bit from the most significant bit (MSB) to the least significant bit (LSB) and holds the value of each bit BIT of the digital signal OUT during the comparison execution period even in a case in which the voltage value of the input signal VIN is subjected to the analog-to-digital conversion at the gain factor time of 2, as in the case in which the voltage value of the input signal VIN is subjected to the analog-to-digital conversion at the gain factor value of 1. The control circuit 220 outputs the finally held value of each bit BIT as the digital signal OUT indicating the magnitude of the voltage value of the input signal VIN subjected to the analog-to-digital conversion by the analog-to-digital converter 200 even in a case in which the voltage value of the input signal VIN is subjected to the analog-to-digital conversion at the gain factor value of 2, as in the case in which the voltage value of the input signal VIN is subjected to the analog-to-digital conversion at the gain factor value of 1.

Thereafter, the analog-to-digital converter 200 sequentially performs analog-to-digital conversion on the voltage values of the input signals VIN which have been sequentially input by repeating the operation during the sampling period and the operation during the comparison execution period when the voltage value of the input signal VIN is subjected to the analog-to-digital conversion at the gain factor of 2, as described above. In FIG. 18, the analog-to-digital converter 200 starts sampling the subsequent input signal VIN from timing t4 and starts a comparison operation of comparing the voltage value of the analog signal VDAC with the voltage value of the comparison reference voltage VCOM from timing t5, as in the operation in the case in which the voltage value of the input signal VIN is subjected to the analog-to-digital conversion at the gain factor value of 1, as illustrated in FIG. 17. In FIG. 18, during the comparison execution period from timing t5 to timing t6, the comparison operation is performed based on the input signals VIN which have been subsequently input and the value of each bit BIT is held in accordance with the comparison determination, as in the operation in the case in which the voltage value of the input signal VIN is subjected to the analog-to-digital conversion at the gain factor value of 1, as illustrated in FIG. 17.

Even in the case in which the voltage value of the input signal VIN is subjected to the analog-to-digital conversion at the gain factor value of 2, as in the case in which the voltage value of the input signal VIN is subjected to the analog-to-digital conversion at the gain factor value of 1, the analog-to-digital converter 200 may start sampling the subsequent input signal VIN from any timing and perform the comparison operation based on the voltage value of the subsequent input signal VIN after the control circuit 220 holds the values of all the bits BIT.

In this way, the analog-to-digital converter 200 is configured as a successive approximation analog-to-digital converter that adjusts a factor of the input/output gain to 1 or 2 and performs the analog-to-digital conversion on the input signal VIN using the analog signal VDAC of which the gain factor is adjusted to 1 or ½ and which is output by the digital-to-analog converter 100. Here, while the digital-to-analog converter 100 used in the analog-to-digital converter 200 is configured to output the analog signal VDAC switched within the range of the plurality of gain-adjusted voltage values, it is possible to inhibit an increase in an area necessary to form the digital-to-analog converter 100. Thus, the analog-to-digital converter 200 can also be realized by inhibiting the increase in the area necessary to form the analog-to-digital converter. In the analog-to-digital converter 200, the gain is adjusted by the analog-to-digital converter 200 in the configuration of the digital-to-analog converter 100. Therefore, by adjusting the gain factor to 2 through the digital signal processing (that is, performing bit shifting) on the digital value OUT of which the gain factor is adjusted to 1, it is possible to inhibit deterioration in signal/noise (S/N) characteristics or distortion characteristics.

In the above-described analog-to-digital converter 200, the configuration in which the digital-to-analog converter 100 is used has been described. However, the digital-to-analog converter used to configure the analog-to-digital converter according to the present invention is not limited to the above-described digital-to-analog converter 100. That is, as the digital-to-analog converter used to configure the analog-to-digital converter according to the present invention, for example, the digital-to-analog converter that has the above-described configuration according to the present invention, such as the above-described digital-to-analog converter 101 or the digital-to-analog converter 102, may be used.

In the above-described analog-to-digital converter 200, the configuration in which one digital-to-analog converter 100 is included and the analog signal VDAC output by the digital-to-analog converter 100 is input as one signal compared by the comparator 210 has been described. However, the number of digital-to-analog converters used in the analog-to-digital converter according to the present invention is not limited to 1, and the analog signal VDAC output by different digital-to-analog converters of both signals compared by the comparator can also be input.

(Modification Example of Analog-to-Digital Converter)

Figure 19:
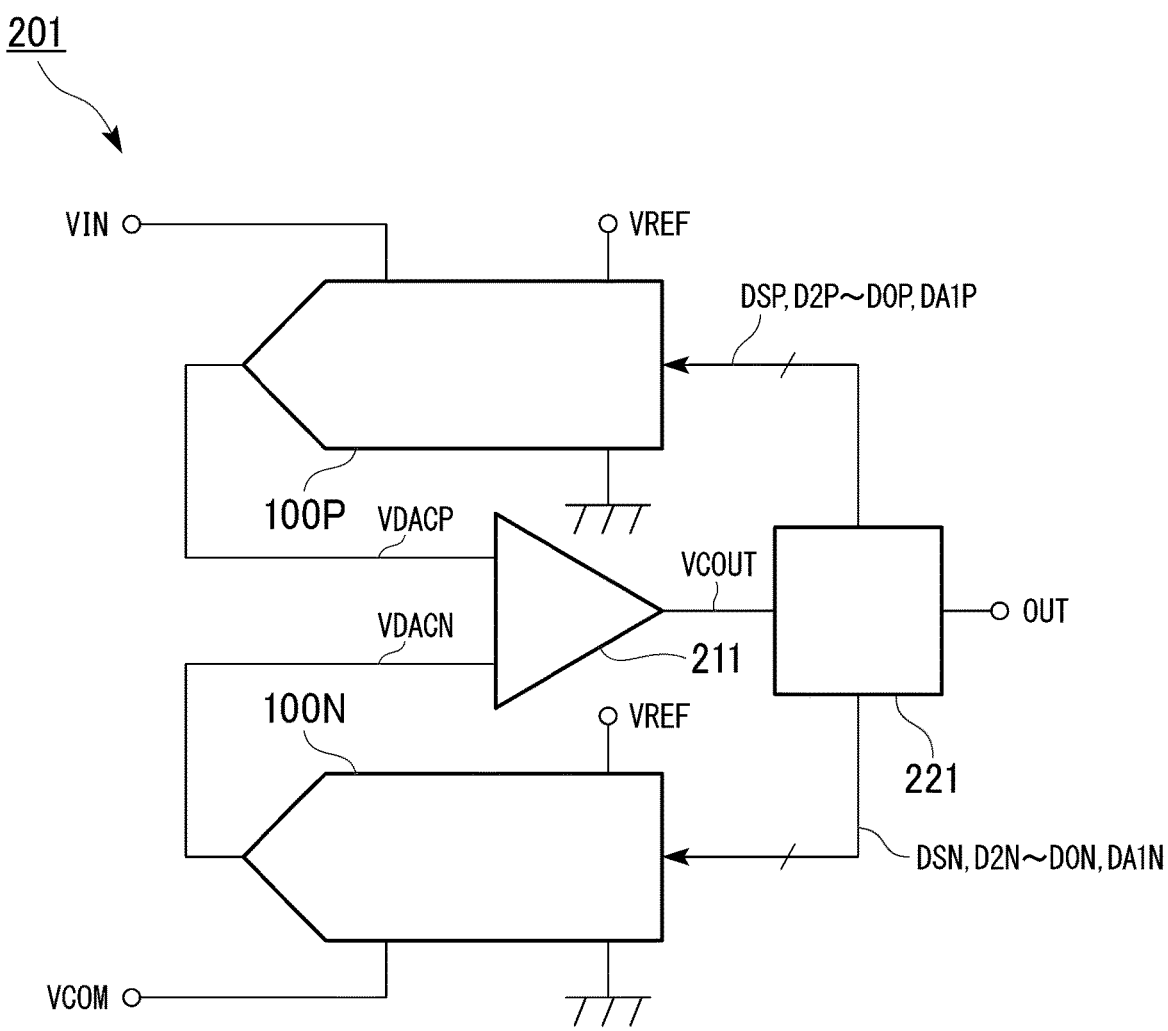
FIG. 19 is a block diagram showing an example of a configuration of a modified example of the analog-to-digital converter of the present invention.

Here, an example of an analog-to-digital converter configured to input the analog signal VDAC output by a different digital-to-analog converter of both signals compared by the comparator will be described. FIG. 19 is a block diagram illustrating an example of a configuration in a modification example of the analog-to-digital converter according to the present invention. An analog-to-digital converter 201 illustrated in FIG. 19 includes two digital-to-analog converters 100 (digital-to-analog converters 100P and 100N), a comparator 211, and a control circuit 221. The analog-to-digital converter 201 is an analog-to-digital converter that outputs a digital signal OUT with a 4-bit resolution by using two digital-to-analog converters 100 with a 3-bit resolution.

Each of the digital-to-analog converters 100P and 100N is a digital-to-analog converter 100 that outputs the analog signal VDAC with a 3-bit resolution of a voltage value based on the reference voltage VREF of which the gain factor is adjusted to 1 or ½, as described above. The digital-to-analog converter 100P outputs an analog signal VDACP of a 3-bit resolution in which the voltage value based on the gain-adjusted reference voltage VREF is added to the voltage value of the input signal VIN to one input terminal (hereinafter referred to as a "positive input terminal") of the comparator 211. The digital-to-analog converter 100N outputs an analog signal VDACN of a 3-bit resolution in which the voltage value based on the gain-adjusted reference voltage VREF is added to the voltage value of the comparison reference voltage VCOM to the other input terminal (hereinafter referred to as a "negative input terminal") of the comparator 211.

The comparator 211 is a comparator that has the same configuration as the comparator 210 illustrated in FIG. 16. Here, the comparator 211 compares a voltage value of the analog signal VDACP input to the positive input terminal from the digital-to-analog converter 100P with a voltage value of the analog signal VDACN input to the negative input terminal from the digital-to-analog converter 100N. The comparator 211 outputs the digital signal VCOUT indicating a comparison result in accordance with a magnitude relation between the compared voltage value of the analog signal VDACP and voltage value of the analog signal VDACN to the control circuit 221. More specifically, the comparator 211 outputs the digital signal VCOUT indicating whether the voltage value of the analog signal VDACP is a voltage value equal to or greater than the voltage value of the analog signal VDACN or a voltage value less than the analog signal VDACN to the control circuit 221. For example, when the voltage value of the analog signal VDACP is the voltage value equal to or greater than the voltage value of the analog signal VDACN, the comparator 211 outputs the digital signal VCOUT with the "high" level to the control circuit 221. Conversely, when the voltage value of the analog signal VDACP is the voltage value less than the voltage value of the analog signal VDACN, the comparator 211 outputs the digital signal VCOUT with the "low" level to the control circuit 221. In the analog-to-digital converter 201, a method of comparing the magnitude relation between the voltage value of the analog signal VDACP and the voltage value of the analog signal VDACN by the comparator 211, the configuration of the comparator 211, and the like are not particularly regulated.

The control circuit 221 generates digital signals D corresponding to each of the digital-to-analog converters 100P and 100N based on the digital signal VCOUT output from the comparator 211 and outputs the generated digital signals D to the corresponding digital-to-analog converter 100P or 100N. More specifically, the control circuit 221 generates digital signals DP (digital signals DSP, D0P to D2P, and DA1P) corresponding to the digital-to-analog converter 100P and outputs the generated digital signals DP to the digital-to-analog converter 100P. Each of the digital signals DP output by the control circuit 221 is connected to the control terminal of each of the corresponding switches SW included in the switch unit 120 in the digital-to-analog converter 100P. Thus, the control circuit 221 causes the digital-to-analog converter 100P to perform an operation of outputting the analog signal VDACP of the above-described 3-bit resolution to the digital-to-analog converter 100P. The control circuit 221 generates digital signals DN (digital signals DSN, D0N to D2N, and DA1N) corresponding to the digital-to-analog converter 100N and outputs the generated digital signals DN to the digital-to-analog converter 100N. Each of the digital signals DN output by the control circuit 221 is connected to the control terminal of each of the corresponding switches SW included in the switch unit 120 in the digital-to-analog converter 100N. Thus, the control circuit 221 causes the digital-to-analog converter 100N to perform an operation of outputting the analog signal VDACN of the above-described 3-bit resolution to the digital-to-analog converter 100N.

In the analog-to-digital converter 201, a method or configuration in which the control circuit 221 generates the digital signals DP or DN, a direction or a configuration in which the digital-to-analog converter 100P or 100N is caused to operate (controlled), and the like are not particularly regulated. In the analog-to-digital converter 201, a method in which the control circuit 221 switches a ratio (a factor of 1 or ½) at the time of gain adjustment of the output amplitude of the analog signal VDAC to be output in each of the digital-to-analog converters 100P and 100N is not particularly regulated either. For example, the control circuit 221 may be configured such that the ratio at the time of gain adjustment of the output amplitude of the analog signal VDAC output by each of the digital-to-analog converters 100P and 100N is switched in response to control from an external signal processing circuit.

The control circuit 221 is also an SAR logic circuit similar to the control circuit 220 included in the analog-to-digital converter 200. Accordingly, the control circuit 221 sequentially determines the magnitude of a difference between the voltage value of the analog signal VDACP and the voltage value of the analog signal VDACN based on the digital signal VCOUT output from the comparator 211. In other words, the control circuit 221 also sequentially determines the magnitude of the voltage value of the input signal VIN which is an analog-to-digital conversion target based on the digital signal VCOUT output from the comparator 211 as in the control circuit 220. The control circuit 221 outputs a value indicating the finally determined magnitude of the voltage value of the input signal VIN as the digital signal OUT of the analog-to-digital conversion result of the input signal VIN by the analog-to-digital converter 201. The digital-to-analog converter 100P included in the analog-to-digital converter 201 is a digital-to-analog converter that outputs the analog signal VDACP of the 3-bit resolution. The digital-to-analog converter 100N included in the analog-to-digital converter 201 is a digital-to-analog converter that outputs the analog signal VDACN of the 3-bit resolution. Therefore, the control circuit 221 outputs the digital signal OUT with a 4-bit resolution as the analog-to-digital conversion result of the input signal VIN.

In the analog-to-digital converter 201, a structure or the like of the digital signal OUT output by the control circuit 221 is not particularly regulated.

In this configuration, the analog-to-digital converter 201 is also configured as a successive approximation analog-to-digital converter as in the analog-to-digital converter 200. The digital-to-analog converter 100P adjusts the gain factor to 1 or ½ and outputs the analog signal VDACP, as described above. The digital-to-analog converter 100N adjusts the gain factor to 1 or ½ and outputs the analog signal VDACN, as described above. Therefore, the analog-to-digital converter 201 is configured as a successive approximation analog-to-digital converter that adjusts a factor of an input/output gain to 1 or 2 and performs analog-to-digital conversion on the input signal VIN.

In the analog-to-digital converter 201, as in the analog-to-digital converter 200, when the input signal VIN is subjected to the analog-to-digital conversion, the control circuit 221 obtains a determination result during the analog-to-digital conversion in order bit by bit from the most significant bit (MSB) to the least significant bit (LSB). In the analog-to-digital converter 201, as in the analog-to-digital converter 200, the control circuit 221 outputs the digital signal OUT indicating the magnitude of the voltage value of the final input signal VIN after the determination result of the least significant bit (LSB) is obtained.

Here, an operation of the analog-to-digital converter 201 will be described. First, an operation of the analog-to-digital converter 201 performing analog-to-digital conversion on the voltage value of the input signal VIN at the gain factor value of 1 will be described. In the following description, when the respective constituent elements (not illustrated) included in the two analog-to-digital converters 100 are distinguished from each other, the constituent elements of the digital-to-analog converter 100P or 100N are distinguished by suffixing "P" or "N" to reference numerals given to the constituent elements. For example, the capacitance C2 included in the digital-to-analog converter 100P is referred to as a "capacitance C2P" and a switch SW0 included in the digital-to-analog converter 100N is referred to as a "switch SW0N."

In the following description, values of the digital signals D (the digital signals D2, D1, and D0) of 3 bits corresponding to three capacitances C of the capacitances C2 to C0 used when a factor of the gain of the digital-to-analog converter 100 is 1 will be described appropriately with binary codes. As described above, when the gain of the output amplitude of the analog signal VDAC output with the gain factor value of 1 by the digital-to-analog converter 100 is adjusted, the digital signal DA1 corresponding to the capacitance CA1 remains in the "low" level without change during all the operation periods. Therefore, description thereof will be omitted appropriately.

When the analog-to-digital converter 201 starts the analog-to-digital conversion operation, the control circuit 221 first sets the "high level" in each of the digital signals DSP and DSN and sets the "low level" in each of the digital signals D2P to D0P and DA1P and the digital signals D2N to D0N and DA1N during the sampling period. Thus, in the digital-to-analog converter 100P, the input terminal of the input signal VIN is connected to the node of the analog signal VDACP by the switch SWSP and the second terminals of the capacitances C2P to C0P and CA1P are connected to the node with the ground potential by the switches SW2P to SW0P and SWA1P. In the digital-to-analog converter 100P, the capacitances C2P to C0P and CA1P are charged with charges in accordance with a potential difference between the potential of the input signal VIN and the ground potential. On the other hand, in the digital-to-analog converter 100N, the input terminal of the comparison reference voltage VCOM is connected to the node of the analog signal VDACN by the switch SWSN and the second terminals of the capacitances C2N to C0N and CA1N are connected to the node with the ground potential by the switches SW2N to SW0N and SWA1N. In the digital-to-analog converter 100N, the capacitances C2N to C0N and CA1N are charged with charges in accordance with a potential difference between the potential of the comparison reference voltage VCOM and the ground potential.

Thereafter, the control circuit 221 sets the "low" level in the digital signals DSP and DSN. Thus, in the digital-to-analog converter 100P, the input terminal of the input signal VIN is disconnected from the node of the analog signal VDACP by the switch SWSP. Then, in the digital-to-analog converter 100P, the voltage value of the input signal VIN is sampled and the charges in accordance with the input signal VIN are held in all the capacitances C of the capacitances C2P to C0P and CA1P. On the other hand, in the digital-to-analog converter 100N, the input terminal of the comparison reference voltage VCOM is disconnected from the node of the analog signal VDACN by the switch SWSN. Then, in the digital-to-analog converter 100N, the voltage value of the comparison reference voltage VCOM is sampled and the charges in accordance with the comparison reference voltage VCOM are held in all the capacitances C of the capacitances C2N to C0N and CA1N.

Then, during the comparison execution period, the comparator 211 first outputs the digital signal VCOUT indicating a comparison result obtained by comparing the voltage value of the analog signal VDACP output from the digital-to-analog converter 100P with the voltage value of the analog signal VDACN output from the digital-to-analog converter 100N to the control circuit 221. Thus, the control circuit 221 acquires the digital signal VCOUT with the "high" level or the "low" level and holds the digital signal VCOUT at the value of the most significant bit BIT3 of the digital signal OUT.

Based on the digital signal VCOUT output from the comparator 211, the control circuit 221 determines whether the value of the digital signal D2P is switched or the value of the digital signal D2N is switched. More specifically, when the digital signal VCOUT output from the comparator 211 is in the "high" level, the control circuit 221 sets the "high" level in the value of the digital signal D2N. Conversely, when the digital signal VCOUT output from the comparator 211 is in the "low" level, the control circuit 221 sets the "high" level in the value of the digital signal D2P.

Thus, the control circuit 221 changes the value of one of the digital signals D2P and D2N from "0" to "1" in accordance with the digital signal VCOUT. That is, when the digital signal VCOUT output from the comparator 211 is in the "high" level, the control circuit 221 switches the voltage value of the analog signal VDACN to a voltage value (VCOM+(4/7.5)Cu×VREF) obtained by adding the voltage value of (4/7.5) Cu×VREF to the current voltage value. Conversely, when the digital signal VCOUT output from the comparator 211 is in the "low" level, the control circuit 221 switches the voltage value of the analog signal VDACP to a voltage value (VIN+(4/7.5)Cu×VREF) obtained by adding the voltage value of (4/7.5)Cu×VREF to the current voltage value.

The comparator 211 outputs the digital signal VCOUT indicating a comparison result obtained by comparing the voltage value of the analog signal VDACP at this time with the voltage value of the analog signal VDACN to the control circuit 221. Thus, the control circuit 221 acquires the digital signal VCOUT with the "high" level or the "low" level and holds the digital signal VCOUT at the value of the bit BIT2 of the digital signal OUT.

Based on the digital signal VCOUT output from the comparator 211, the control circuit 221 determines whether the value of the digital signal D1P is switched or the value of the digital signal D1N is switched. More specifically, when the digital signal VCOUT output from the comparator 211 is in the "high" level, the control circuit 221 sets the "high" level in the value of the digital signal D1N. Conversely, when the digital signal VCOUT output from the comparator 211 is in the "low" level, the control circuit 221 sets the "high" level in the value of the digital signal D1P.

Thus, the control circuit 221 changes the value of one of the digital signals D1P and D1N from "0" to "1" in accordance with the digital signal VCOUT. That is, when the digital signal VCOUT output from the comparator 211 is in the "high" level, the control circuit 221 switches the voltage value of the analog signal VDACN to a voltage value obtained by adding (2/7.5)Cu×VREF to the current voltage value. Conversely, when the digital signal VCOUT output from the comparator 211 is in the "low" level, the control circuit 221 switches the voltage value of the analog signal VDACP to a voltage value obtained by adding the voltage value of (2/7.5)Cu×VREF to the current voltage value.

The comparator 211 outputs the digital signal VCOUT indicating a comparison result obtained by comparing the voltage value of the analog signal VDACP at this time with the voltage value of the analog signal VDACN to the control circuit 221. Thus, the control circuit 221 acquires the digital signal VCOUT with the "high" level or the "low" level and holds the digital signal VCOUT at the value of the bit BIT1 of the digital signal OUT.

Based on the digital signal VCOUT output from the comparator 211, the control circuit 221 determines whether the value of the digital signal D0P is switched or the value of the digital signal D0N is switched. More specifically, when the digital signal VCOUT output from the comparator 211 is in the "high" level, the control circuit 221 sets the "high" level in the value of the digital signal D0N. Conversely, when the digital signal VCOUT output from the comparator 211 is in the "low" level, the control circuit 221 sets the "high" level in the value of the digital signal D0P.

Thus, the control circuit 221 changes the value of one of the digital signals D0P and D0N from "0" to "1" in accordance with the digital signal VCOUT. That is, when the digital signal VCOUT output from the comparator 211 is in the "high" level, the control circuit 221 switches the voltage value of the analog signal VDACN to a voltage value obtained by adding a voltage value of (1/7.5)Cu×VREF to the current voltage value. Conversely, when the digital signal VCOUT output from the comparator 211 is in the "low" level, the control circuit 221 switches the voltage value of the analog signal VDACP to a voltage value obtained by adding the voltage value of (1/7.5)Cu×VREF to the current voltage value.

The comparator 211 outputs the digital signal VCOUT indicating a comparison result obtained by comparing the voltage value of the analog signal VDACP at this time with the voltage value of the analog signal VDACN to the control circuit 221. Thus, the control circuit 221 acquires the digital signal VCOUT with the "high" level or the "low" level and holds the digital signal VCOUT at the value of the bit BIT0 of the digital signal OUT.

In this way, during the comparison execution period, the control circuit 221 acquires the digital signal VCOUT output from the comparator 211 in order bit by bit from the most significant bit (MSB) to the least significant bit (LSB) and holds the value of each bit BIT of the digital signal OUT. Then, the control circuit 221 outputs the finally held value of each bit BIT as the digital signal OUT indicating the magnitude of the voltage value of the input signal VIN subjected to the analog-to-digital conversion by the analog-to-digital converter 201.

Thereafter, the analog-to-digital converter 201 sequentially performs the analog-to-digital conversion on the voltage values of the input signals VIN which have been sequentially input by repeating the operation during the sampling period and the operation during the comparison execution period, as described above. After the control circuit 221 holds the values of all the bits BIT, the analog-to-digital converter 201 may start sampling the subsequent input signal VIN and performing the comparison operation based on the voltage value of the subsequent input signal VIN from any timing.

In the description of the operation of the above-described analog-to-digital converter 201, the operation of the analog-to-digital converter in the case in which the analog-to-digital converter 201 outputs the digital signal OUT in the parallel format has been described. However, even in the analog-to-digital converter 201, as in the above-described analog-to-digital converter 200, a case in which the analog-to-digital converter 201 is an analog-to-digital converter outputting the digital signal OUT in the serial output format can also be considered. In this case, as in the above-described analog-to-digital converter 200, the analog-to-digital converter 201 also sequentially outputs the digital signal OUT indicating the magnitude of the voltage value of the final input signal VIN whenever a determination result of each bit BIT is obtained.

Next, an operation of the analog-to-digital converter 201 performing the analog-to-digital conversion on the voltage value of the input signal VIN at the gain factor value of 2 will be described. In the following description, values of the digital signals D (the digital signals D1, D0, and DA1) of 3 bits corresponding to three capacitances C of the capacitances C0, C1, and CA1 used when a factor of the gain of the digital-to-analog converter 100 is ½ will be described appropriately with binary codes. As described above, when the gain of the output amplitude of the analog signal VDAC output with the gain factor value of ½ by the digital-to-analog converter 100 is adjusted, the digital signal D2 corresponding to the capacitance C2 remains in the "low" level without change during all the operation periods. Therefore, description thereof will be omitted appropriately.

When the analog-to-digital converter 201 starts the analog-to-digital conversion operation, the control circuit 221 first samples the voltage value of the input signal VIN during the sampling period. An operation of each constituent element in this case is similar to the operation in the case of the analog-to-digital conversion of the voltage value of the input signal VIN at the gain factor value of 1. Accordingly, detailed description of an operation during the sampling period when the voltage value of the input signal VIN is subjected to the analog-to-digital conversion at the gain factor value of 2 will be omitted.

During the comparison execution period, the comparator 211 first outputs the digital signal VCOUT indicating a comparison result obtained by comparing the voltage value of the analog signal VDACP output from the digital-to-analog converter 100P with the voltage value of the analog signal VDACN output from the digital-to-analog converter 100N to the control circuit 221. Thus, the control circuit 221 acquires the digital signal VCOUT with the "high" level or the "low" level and holds the digital signal VCOUT at the value of the most significant bit BIT3 of the digital signal OUT.

Based on the digital signal VCOUT output from the comparator 211, the control circuit 221 determines whether the value of the digital signal D1P is switched or the value of the digital signal D1N is switched. More specifically, when the digital signal VCOUT output from the comparator 211 is in the "high" level, the control circuit 221 sets the "high" level in the value of the digital signal D1N. Conversely, when the digital signal VCOUT output from the comparator 211 is in the "low" level, the control circuit 221 sets the "high" level in the value of the digital signal D1P.

Thus, the control circuit 221 changes the value of one of the digital signals D1P and D1N from "0" to "1" in accordance with the digital signal VCOUT. That is, when the digital signal VCOUT output from the comparator 211 is in the "high" level, the control circuit 221 switches the voltage value of the analog signal VDACN to a voltage value obtained by adding the voltage value of (2/7.5)Cu×VREF to the current voltage value. Conversely, when the digital signal VCOUT output from the comparator 211 is in the "low" level, the control circuit 221 switches the voltage value of the analog signal VDACP to a voltage value obtained by adding the voltage value of (2/7.5)Cu×VREF to the current voltage value.

The comparator 211 outputs the digital signal VCOUT indicating a comparison result obtained by comparing the voltage value of the analog signal VDACP at this time with the voltage value of the analog signal VDACN to the to the control circuit 221. Thus, the control circuit 221 acquires the digital signal VCOUT with the "high" level or the "low" level and holds the digital signal VCOUT at the value of the bit BIT2 of the digital signal OUT.

Thereafter, similarly, the control circuit 221 changes the value of one of the digital signals D0P and D0N from "0" to "1" based on the digital signal VCOUT output from the comparator 211. Thus, the control circuit 221 switches the voltage value of the analog signal VDACP or VDACN to a voltage value obtained by adding the voltage value of (1/7.5)Cu×VREF to the current voltage value.

The comparator 211 outputs the digital signal VCOUT indicating a comparison result obtained by comparing the voltage value of the analog signal VDACP at this time with the voltage value of the analog signal VDACN to the control circuit 221. Thus, the control circuit 221 acquires the digital signal VCOUT with the "high" level or the "low" level and holds the digital signal VCOUT at the value of the bit BIT1 of the digital signal OUT.

Thereafter, similarly, the control circuit 221 changes the value of one of the digital signals DA1P and DA1N from "0" to "1" based on the digital signal VCOUT output from the comparator 211. Thus, the control circuit 221 switches the voltage value of the analog signal VDACP or VDACN to a voltage value obtained by adding the voltage value of (0.5/7.5)Cu×VREF to the current voltage value.

The comparator 211 outputs the digital signal VCOUT indicating a comparison result obtained by comparing the voltage value of the analog signal VDACP at this time with the voltage value of the analog signal VDACN to the control circuit 221. Thus, the control circuit 221 acquires the digital signal VCOUT with the "high" level or the "low" level and holds the digital signal VCOUT at the value of the bit BIT0 of the digital signal OUT.

In this way, the control circuit 221 acquires the digital signal VCOUT output from the comparator 211 in order bit by bit from the most significant bit (MSB) to the least significant bit (LSB) and holds the value of each bit BIT of the digital signal OUT during the comparison execution period even in a case in which the voltage value of the input signal VIN is subjected to the analog-to-digital conversion at the gain factor value of 2, as in the case in which the voltage value of the input signal VIN is subjected to the analog-to-digital conversion at the gain factor value of 1. The control circuit 221 outputs the finally held value of each bit BIT as the digital signal OUT indicating the magnitude of the voltage value of the input signal VIN subjected to the analog-to-digital conversion by the analog-to-digital converter 201 even in a case in which the voltage value of the input signal VIN is subjected to the analog-to-digital conversion at the gain factor value of 2, as in the case in which the voltage value of the input signal VIN is subjected to the analog-to-digital conversion at the gain factor value of 1.

Thereafter, the analog-to-digital converter 201 sequentially performs analog-to-digital conversion on the voltage values of the input signals VIN which have been sequentially input by repeating the operation during the sampling period and the operation during the comparison execution period, as described above. Even when the voltage value of the input signal VIN is subjected to the analog-to-digital conversion at the gain factor value of 2, the analog-to-digital converter 201 may start sampling the subsequent input signal VIN and performing the comparison operation based on the voltage value of the subsequent input signal VIN from any timing after the control circuit 221 holds the values of all the bits BIT, as in the case in which the voltage value of the input signal VIN is subjected to the analog-to-digital conversion at the gain factor value of 1.

In this way, the analog-to-digital converter 201 is configured as a successive approximation analog-to-digital converter that outputs the digital signal OUT with the 4-bit resolution by using two digital-to-analog converters 100. Since each of the digital-to-analog converters 100P and 100N is configured as a successive approximation analog-to-digital converter that adjusts the gain factor to 1 or ½ and outputs each of the analog signals VDACP and VDACN, the analog-to-digital converter 201 is configured as a successive approximation analog-to-digital converter that adjusts a factor of the input/output gain to 1 or 2 and performs analog-to-digital conversion on the input signal VIN. Here, while each of the digital-to-analog converters 100P and 100N used in the analog-to-digital converter 201 is configured to output the analog signal VDAC switched within the range of the plurality of gain-adjusted voltage values, it is possible to inhibit an increase in an area necessary to form each digital-to-analog converter 100. Thus, the analog-to-digital converter 201 can also be realized by inhibiting the increase in the area necessary to form the analog-to-digital converter as in the analog-to-digital converter 200. Further, in the analog-to-digital converter 201, as in the analog-to-digital converter 200, the gain is adjusted with the analog-to-digital converter 201 in the configuration of the digital-t-analog converter 100. Therefore, by adjusting the gain factor to 2 through the digital signal processing (that is, performing bit shifting) on the digital value OUT of which the gain factor is adjusted to 1, it is possible to inhibit deterioration in signal/noise (S/N) characteristics or distortion characteristics.

As the analog-to-digital converter according to the present invention, an analog-to-digital converter (for example, the analog-to-digital converter 100) includes a digital-to-analog converter (for example, the digital-to-analog converter 100), a comparator (the comparator 210) that compares a magnitude relation between a voltage value of an analog signal (the analog signal VDAC) output by a digital-to-analog converter (for example, the digital-to-analog converter 100) and input to one input terminal and a voltage value of a comparison target voltage (for example, the comparison reference voltage VCOM) input to the other input terminal, and a control circuit (the control circuit 220) that outputs a digital signal (the digital signal OUT) with a resolution indicating the magnitude of the voltage value of an input signal (for example, the input signal VIN) based on a comparison result of the comparator 210 and generates a control signal (the digital signal D) corresponding to each switch (the switch SW) included in the digital-to-analog converter (for example, the digital-to-analog converter 200).

As described above, the analog-to-digital converter according to the present invention is configured as a successive approximation analog-to-digital converter using the digital-to-analog converter according to the present invention. Here, while the digital-to-analog converter according to the present invention used in the analog-to-digital converter according to the present invention is configured to output the analog signal VDAC switched within the range of the plurality of gain-adjusted voltage values, it is possible to inhibit an increase in an area necessary to form the digital-to-analog converter according to the present invention. Thus, the analog-to-digital converter according to the present invention can also be realized by inhibiting the increase in the area necessary to form the analog-to-digital converter. In the analog-to-digital converter according to the present invention, the gain is adjusted by the digital-to-analog converter in the configuration of the digital-to-analog converter according to the present invention. Therefore, by adjusting the gain factor to 2 through the digital signal processing (that is, performing bit shifting) on the digital value OUT of which the gain factor is adjusted to 1, it is possible to inhibit deterioration in signal/noise (S/N) characteristics or distortion characteristics.

(Signal Processing Device)

Figure 20:
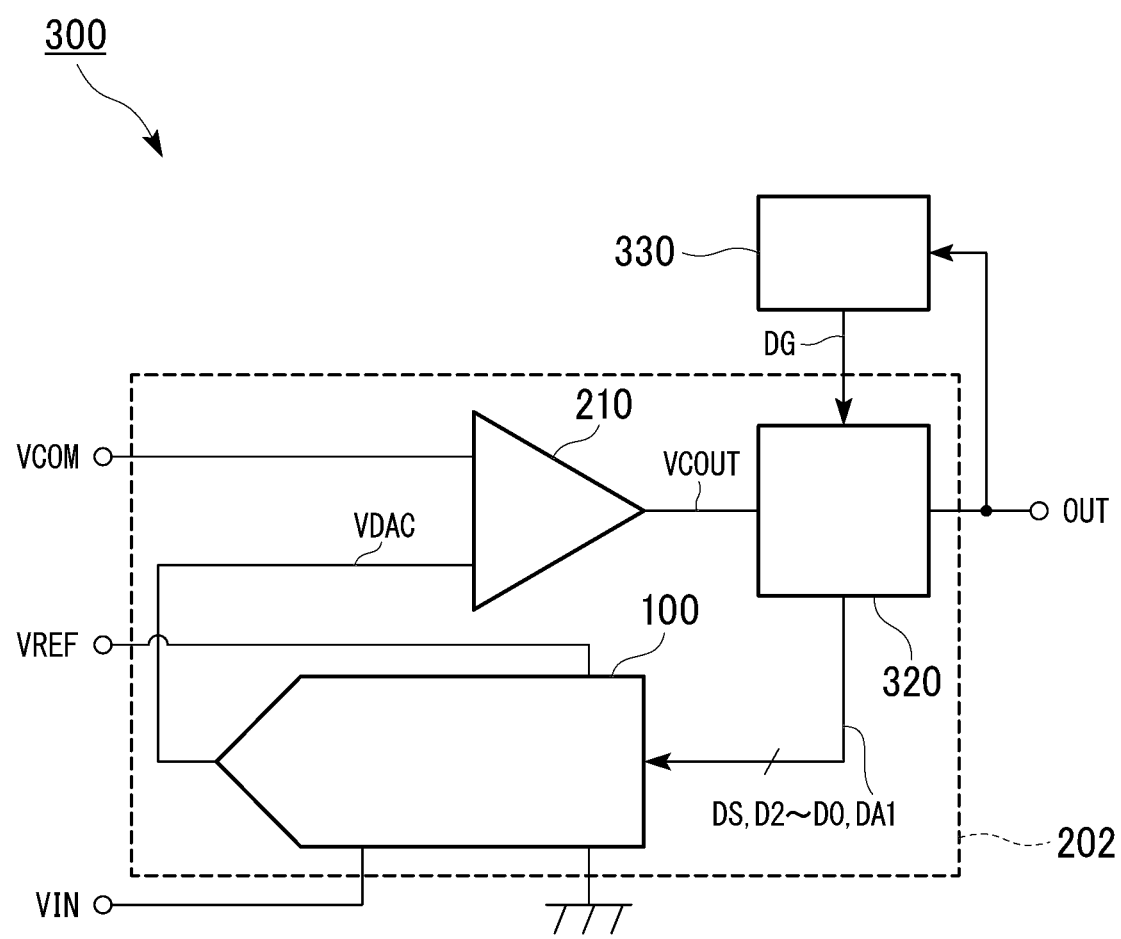
FIG. 20 is a block diagram showing an example of a configuration of a signal processing device of the present invention.

Next, a signal processing device including the analog-to-digital converter (the successive approximation analog-to-digital converter) according to the present invention will be described. In the following description, a signal processing device including the analog-to-digital converter in which the digital-to-analog converter 100 is used will be described. FIG. 20 is a block diagram illustrating an example of the signal processing device according to the present invention. A signal processing device 300 illustrated in FIG. 20 includes the digital-to-analog converter 100, the comparator 210, a control circuit 320, and a signal processing circuit 330.

The digital-to-analog converter 100 outputs the analog signal VDAC with the 3-bit resolution in which the voltage value based on the gain-adjusted reference voltage VREF of which the gain factor is adjusted to 1 or ½ is added to the voltage value of the input signal VIN to the comparator 210, as described above.

As described above, the comparator 210 compares the voltage value of the analog signal VDAC output from the digital-to-analog converter 100 with the voltage value of the input comparison reference voltage VCOM and outputs the digital signal VCOUT indicating a comparison result in accordance with a magnitude relation between the compared voltage value of the analog signal VDAC and voltage value of the comparison reference voltage VCOM to the control circuit 320.

The control circuit 320 generates the digital signals D (the digital signals DS, D0 to D2, and DA1) based on the digital signal VCOUT output from the comparator 210 and outputs the generated digital signals D to the digital-to-analog converter 100. Here, the control circuit 320 is configured to switch a magnification at the time of gain adjustment of a factor of the output amplitude of the analog signal VDAC output by the digital-to-analog converter 100 to one of 1 and ½ in accordance with a digital signal DG output from the signal processing circuit 330. That is, the control circuit 320 generates the digital signals D for outputting the analog signal VDAC of which the gain is adjusted to the magnification corresponding to the digital signal DG output from the signal processing circuit 330 and outputs the digital signals D to the digital-to-analog converter 100. Each of the digital signals D output by the control circuit 220 is connected to the control terminal of each of the corresponding switches SW included in the switch unit 120 in the digital-to-analog converter 100. Thus, the control circuit 320 causes the digital-to-analog converter 100 to perform an operation of outputting the analog signal VDAC which has the 3-bit resolution and of which the gain is adjusted at the magnification corresponding to the digital signal DG output from the signal processing circuit 330. In the signal processing device 300, a method or configuration in which the control circuit 320 generates the digital signals D, a direction or a configuration in which the digital-to-analog converter 100 is caused to operate (controlled), and the like are not particularly regulated.

The control circuit 320 can also cause the digital-to-analog converter 100 to operate (control) the analog signal VDAC to be output such that the offset is adjusted. For example, when the voltage value of the input signal VIN is lower than a range of a desired voltage value, the control circuit 320 causes the offset to be adjusted so that the voltage value of the input signal VIN is raised. When the voltage value of the input signal VIN is higher than the range of the desired voltage value, the control circuit 320 causes the offset to be adjusted so that the voltage value of the input signal VIN is lowered. In the signal processing device 300, a method, a configuration, or the like in which the control circuit 320 causes the digital-to-analog converter 100 to perform (control) an operation such that the offset is adjusted is not particularly regulated.

The control circuit 320 is an SAR logic circuit similar to the control circuit 220 included in the analog-to-digital converter 200. Accordingly, the control circuit 320 sequentially determines the magnitude of the voltage value of the input signal VIN which is an analog-to-digital conversion target based on the digital signal VCOUT output from the comparator 210. The control circuit 320 outputs a value indicating the finally determined magnitude of the voltage value of the input signal VIN as the digital signal OUT of the result obtained by performing the analog-to-digital conversion on the input signal VIN by the analog-to-digital converter. In the signal processing device 300, the digital signal OUT output by the control circuit 320 is also output to the signal processing circuit 330. In the signal processing device 300, a structure or the like of the digital signal OUT output by the control circuit 320 is not particularly regulated.

In the signal processing device 300, a successive approximation analog-to-digital converter similar to the analog-to-digital converter 200 is configured in accordance with the configuration of the digital-to-analog converter 100, the comparator 210, and the control circuit 320. In the following description, the successive approximation analog-to-digital converter configured in the signal processing device 300 is referred to as an "analog-to-digital converter 202."

Based on the digital signal OUT output from the control circuit 320 included in the analog-to-digital converter 202, the signal processing circuit 330 determines the gain value of the analog signal VDAC of which the gain is adjusted when the analog-to-digital converter 202 performs subsequent analog-to-digital conversion. The number of digital signals OUT used for the signal processing circuit 330 to determine the gain value of the analog signal VDAC may be 1 or plural. Based on a determination result, the signal processing circuit 330 outputs the digital signal DG which is a gain changing signal for giving an instruction to change (switch) the gain value to the control circuit 320. More specifically, when the current gain factor is 1 and the value of the digital signal OUT indicates that an amplitude (a variation range) of an input signal is small, the signal processing circuit 330 determines that the gain value is high at the time of subsequent analog-to-digital conversion and outputs the digital signal DG indicating that the gain factor value is switched to 2 to the control circuit 320. Conversely, when the current gain factor is 2 and the value of the digital signal OUT indicates that the amplitude (the variation range) of the input signal is large, the signal processing circuit 330 determines that the gain value is low at the time of subsequent analog-to-digital conversion and outputs the digital signal DG indicating that the gain factor value is switched to 1 to the control circuit 320. In other words, the signal processing circuit 330 determines whether to raise or lower the gain value at the time of gain adjustment of the analog signal VDAC based on the current gain value for gain adjustment of the analog signal VDAC and the current digital signal OUT, and feeds a determination result back to the control circuit 320 (that is, the analog-to-digital converter 202). When the signal processing circuit 330 determines whether to raise or lower the gain value at the time of gain adjustment of the analog signal VDAC based on the plurality of digital signals OUT, the signal processing circuit 330 determines whether to raise or lower the gain value based on the previous gain value and the digital signals OUT up to the present and feeds a determination result back to the control circuit 320 (the analog-to-digital converter 202). Thus, the control circuit 320 causes the digital-to-analog converter 100 to output the analog signal VDAC of which the gain value of the output amplitude is adjusted to one gain factor value of 1 and ½ to the digital-to-analog converter 100 in accordance with the digital signal DG output from the signal processing circuit 330.

In this configuration, the signal processing device 300 is configured as a signal processing device that includes the successive approximation analog-to-digital converter 202. The signal processing device 300 feeds the gain value for gain adjustment of the analog signal VDAC back when the analog-to-digital converter 202 performs the analog-to-digital conversion, as described above. Thus, the signal processing device 300 can obtain the digital signal OUT indicating the magnitude of the voltage value of the input signal VIN subjected to the analog-to-digital conversion within a range of an optimum size. Here, while the digital-to-analog converter 100 used in the analog-to-digital converter 202 is configured to output the analog signal VDAC switched within the range of the plurality of gain-adjusted voltage values, it is possible to inhibit an increase in an area necessary to form each digital-to-analog converter 100. Thus, the signal processing device 300 can also be realized by inhibiting the increase in the area necessary to form the signal processing device.

In the above-described signal processing device 300, the configuration in which the analog-to-digital converter 202 configured using the digital-to-analog converter 100 is included has been described. However, the digital-to-analog converter used to configure the successive approximation analog-to-digital converter included in the signal processing device according to the present invention is not limited to the above-described digital-to-analog converter 100. That is, as the digital-to-analog converter used to configure the successive approximation analog-to-digital converter included in the signal processing device according to the present invention, for example, the digital-to-analog converter that has the above-described configuration according to the present invention, such as the above-described digital-to-analog converter 101 or the digital-to-analog converter 102, may be used.

In the above-described signal processing device 300, the configuration in which the analog-to-digital converter 202 configured using one digital-to-analog converter 100 is included as in the analog-to-digital converter 200 has been described. However, the number of digital-to-analog converters used in the analog-to-digital converter included in the signal processing device according to the present invention is not limited to 1. That is, as the digital-to-analog converter used to configure the successive approximation analog-to-digital converter included in the signal processing device according to the present invention, for example, the digital-to-analog converter according to the present invention configured using two digital-to-analog converters, as in the analog-to-digital converter 201, may be included.

As the signal processing device according to the present invention, a signal processing device (for example, the signal processing device 300) includes an analog-to-digital converter (for example, the analog-to-digital converter 202) and a signal processing circuit (the signal processing circuit 330) that determines a gain value of a voltage value of an analog signal (the analog signal VDAC) output by a digital-to-analog converter (for example, the digital-to-analog converter 100) in the analog-to-digital converter 202 performing gain adjustment when the analog-to-digital converter 202 performs subsequent analog-to-digital conversion based on a digital signal (the digital signal OUT) output from the analog-to-digital converter 202 and outputs a gain changing signal (the digital signal DG) for giving an instruction to change the gain value based on a determination result to the analog-to-digital converter 202. As a control circuit (the control circuit 320) included in the analog-to-digital converter 202, a signal processing device (for example, the signal processing device 300) generating a control signal (The digital signal D) corresponding to each switch (the switch SW) included in the digital-to-analog converter 100 in accordance with the digital signal DG is configured.

As described above, the signal processing device according to the present invention includes the analog-to-digital converter according to the present invention. The signal processing device according to the present invention feeds the gain value for gain adjustment of the analog signal VDAC back when the included analog-to-digital converter according to the invention performs the analog-to-digital conversion. Thus, in the signal processing device according to the present invention, it is possible to obtain the digital signal OUT indicating the magnitude of the voltage value of the input signal VIN subjected to the analog-to-digital conversion within the range of the optimum size. Here, while the digital-to-analog converter according to the present invention used in the analog-to-digital converter according to the present invention included in the signal processing device according to the present invention is configured to output the analog signal VDAC switched within the range of the plurality of gain-adjusted voltage values, it is possible to inhibit an increase in an area necessary to form the digital-to-analog converter according to the present invention. Thus, the signal processing device according to the present invention can also be realized by inhibiting the increase in the area necessary to form the signal processing device. Further, in the analog-to-digital converter according to the present invention included in the signal processing device according to the present invention, the gain adjustment is performed by the digital-to-analog converter according to the present invention in the configuration of the digital-to-analog converter according to the present invention. Therefore, by adjusting the gain to 2 times through the digital signal processing (that is, performing bit shifting) on the digital value OUT of which the gain factor is adjusted to 1, it is possible to inhibit deterioration in signal/noise (S/N) characteristics or distortion characteristics.

(Solid-State Imaging Device)

Figure 21:
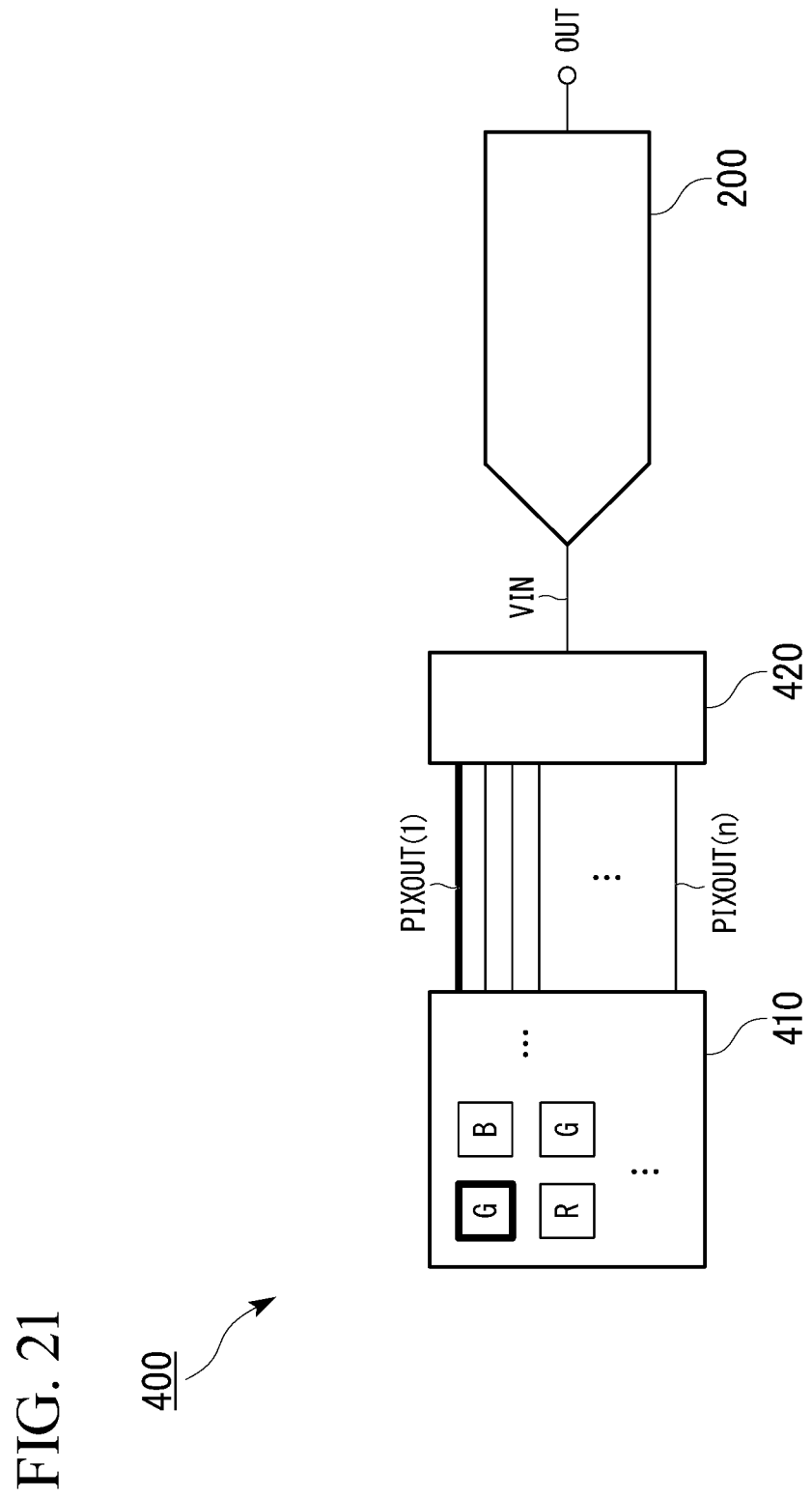
FIG. 21 is a block diagram showing an example of the configuration of a solid-state imaging device according to the present invention.

Next, a solid-state imaging device including the analog-to-digital converter according to the present invention (the successive approximation analog-to-digital converter) will be described. In the following description, a solid-state imaging device including the analog-to-digital converter 200 in which the digital-to-analog converter 100 is used will be described. FIG. 21 is a block diagram illustrating an example of a configuration of the solid-state imaging device according to the present invention. A solid-state imaging device 400 illustrated in FIG. 21 includes a pixel array unit 410, a pixel selection unit 420, and the analog-to-digital converter 200.

In the solid-state imaging device 400, the analog-to-digital converter 200 performs the analog-to-digital conversion on each pixel signal (an analog signal) output from each of the pixels arrayed in the pixel array unit 410 performing imaging and sequentially outputs digital values of the pixels as the digital signals OUT. The solid-state imaging device 400 is a solid-state imaging device that includes one analog-to-digital converter 200.

In the pixel array unit 410, a plurality of pixels are arrayed in a 2-dimensional matrix form. Each of the pixels arrayed in the pixel array unit 410 includes, for example, a photoelectric conversion element such as a photodiode, and the photoelectric conversion element included in each pixel generates a photoelectric conversion signal in accordance with an amount of light incident within a constant accumulation time (an exposure time). The pixel array unit 410 outputs a pixel signal in accordance with the photoelectric conversion signal generated by each pixel under reading control of the pixel selection unit 420 to a corresponding pixel signal output line PIXOUT. FIG. 21 illustrates the pixel array unit 410 in which n (where n=a natural number equal to or greater than 2 and a positive integer) pixels are arrayed. As the pixels arrayed in the pixel array unit 410, there are a pixel to which an on-chip color filter through which light with a red (R) wavelength band transmits is affixed (hereinafter referred to as an "R pixel"), a pixel to which an on-chip color filter through which light with a green (G) wavelength band transmits is affixed (hereinafter referred to as a "G pixel"), and a pixel to which an on-chip color filter through which light with a blue (B) wavelength band transmits is affixed (hereinafter referred to as a "B pixel"). Each of the pixels outputs a pixel signal in accordance with the generated photoelectric conversion signal to each of corresponding pixel signal output lines PIXOUT (1) to PIXOUT (n). For example, the first pixel (G pixel) arrayed in the pixel array unit 410 outputs the pixel signal in accordance with the generated photoelectric conversion signal to the corresponding pixel signal output line PIXOUT (1).

The pixel selection unit 420 sequentially selects the pixels arrayed in the pixel array unit 410 and reads the pixel signals from the selected pixels. The pixel selection unit 420 acquires the pixel signals read from the selected pixels and output to the corresponding pixel signal output lines PIXOUT and sequentially outputs the acquired pixel signals as the input signals VIN to the analog-to-digital converter 200. The pixel selection unit 420 includes, for example, constituent elements such as a vertical scanning circuit and a horizontal scanning circuit related to the selection of the pixels and the reading of the pixel signals. The vertical scanning circuit drives the pixels arrayed in the pixel array unit 410 for each row of the pixel array unit 410 and outputs the pixel signals to the pixel signal output lines PIXOUT. The horizontal scanning circuit selects the pixel signals of each row output from the pixels arrayed in the pixel array unit 410 to the corresponding pixel signal output lines PIXOUT for each row of the pixel array unit 410 and sequentially the selected pixel signals as the input signals VIN to the analog-to-digital converter 200. Thus, the input signal VIN corresponding to the pixel signal output by each of the pixels arrayed in the pixel array unit 410 is sequentially output to the analog-to-digital converter 200 in a so-called raster order. The pixel selection unit 420 may include a constituent element performing a process on the pixel signal which is an analog signal, such as a correlated double sampling (CDS) circuit that inhibits noise of the pixel signal through the CDS process.

As described above, the analog-to-digital converter 200 performs the analog-to-digital conversion on the input signals VIN which have been input and outputs the input signals as the digital signals OUT. The analog-to-digital converter 200 sequentially outputs the digital signals OUT which are the analog-to-digital conversion results of the input signals VIN sequentially output from the pixel selection unit 420 to the outside of the solid-state imaging device 400.

Here, the analog-to-digital converter 200 included in the solid-state imaging device 400 includes the digital-to-analog converter 100 that outputs the analog signal VDAC with the 3-bit resolution in which the voltage value based on the reference voltage VREF of which the gain factor is adjusted to 1 or ½ is added to the voltage value of the input signal VIN, as described above. Therefore, the analog-to-digital converter 200 included in the solid-state imaging device 400 can adjust a factor of the input/output gain to 1 or 2 using the analog signal VDAC which is output by the digital-to-analog converter 100 and of which the gain factor is adjusted to 1 or ½ and perform the analog-to-digital conversion on the input signal VIN, as described above. Accordingly, the solid-state imaging device 400 can cause the analog-to-digital converter 200 to perform the gain adjustment on the pixel signal output from each of the pixels arrayed in the pixel array unit 410 to a factor of 1 or 2 and perform the analog-to-digital conversion.

More specifically, the solid-state imaging device 400 can cause the analog-to-digital converter 200 to perform the gain adjustment on all the pixel signals corresponding to the pixels arrayed in the pixel array unit 410 at the same gain value and perform the analog-to-digital conversion. For example, when a dark scene is imaged in the solid-state imaging device 400, the pixel signals output from the pixels can be considered to be small on the whole. In this case, the solid-state imaging device 400 causes the analog-to-digital converter 200 to perform the gain adjustment on all the pixel signals (the input signals VIN) at the gain factor value of 2 and perform the analog-to-digital conversion. On the other hand, when a bright scene is imaged in the solid-state imaging device 400, the pixel signals output from the pixels are considered to be large on the whole. In this case, the solid-state imaging device 400 causes the analog-to-digital converter 200 to perform the gain adjustment on all the pixel signals at the gain factor value of 1 and perform the analog-to-digital conversion. When a bright scene imaged in the solid-state imaging device 400 is, for example, a white scene on the whole and differences between the values of the pixel signals output from the pixels are small, it is effective that the gains of all the pixel signals are adjusted at the gain factor value of 2 (or the offsets are adjusted) and the analog-to-digital conversion is performed. In this case, the solid-state imaging device 400 causes the analog-to-digital converter 200 to perform the gain adjustment on all the pixel signals at the gain factor value of 2 (or adjust the offsets) and perform the analog-to-digital conversion. On the other hand, when a bright scene imaged in the solid-state imaging device 400 is, for example, a scene with many colors on the whole and differences between the values of the pixel signals output from the pixels are large, the solid-state imaging device 400 causes the analog-to-digital converter 200 to perform the gain adjustment on all the pixel signals at the gain factor value of 1 and perform the analog-to-digital conversion. In this way, in the solid-state imaging device 400, when the digital signals OUT are output to the outside, the digital signals OUT obtained by adjusting the gains at the appropriate gain value in accordance with the imaged scene and performing the analog-to-digital conversion on the pixel signals can be output.

In the solid-state imaging device 400, as described above, the pixel selection unit 420 sequentially outputs the input signals VIN corresponding to the pixel signals output by the pixels arrayed in the pixel array unit 410 in the raster order. Accordingly, in the solid-state imaging device 400, it can be known that each pixel signal input as the input signal VIN to the analog-to-digital converter 200 is the pixel signal output by the pixel to which a certain on-chip color filter is affixed. Therefore, the solid-state imaging device 400 can cause the analog-to-digital converter 200 to perform the gain adjustment at a different gain value on each pixel signal corresponding to each of the pixels arrayed in the pixel array unit 410 and perform the analog-to-digital conversion. For example, in the on-chip color filter affixed to each of the pixels arrayed in the pixel array unit 410, transmission characteristics of light is considered to be low only in the wavelength band of a specific color. In this case, the solid-state imaging device 400 causes the analog-to-digital converter 200 to perform gain adjustment at the gain factor value of 2 on the pixel signal (the input signal VIN) of the pixels to which the on-chip color filter with the low transmission characteristics is affixed and causes the analog-to-digital converter 200 to perform the gain adjustment at the gain factor of 1 on the pixel signals of the other pixels and perform the analog-to-digital conversion. Thus, in the solid-state imaging device 400, when the digital signals OUT are output to the outside, it is possible to output the digital signals OUT obtained by performing the gain adjustment at the gain value appropriate in accordance with the characteristics of each pixel and performing the analog-to-digital conversion on each pixel signal. In other words, in the solid-state imaging device 400, it is possible to output the digital signals OUT in which an influence of deviation in the characteristics of each of the pixels arrayed in the pixel array unit 410 is inhibited.

The reason that the gain adjustment is performed at the different gain value for each pixel signal in the solid-state imaging device 400 is not limited to the reason that the transmission characteristics of the light is low only in the wavelength band of a specific color, as described above. For example, when white balance adjustment or color adjustment of an image captured in the solid-state imaging device 400 is performed, gain adjustment may be performed changing (switching) the gain value for each pixel signal. In this case, in the solid-state imaging device 400, when the digital signal OUT corresponding to each pixel signal is output, the digital signal OUT corresponding to the image subjected to the white balance adjustment or the color adjustment can be output.

In the solid-state imaging device 400, a configuration in which the gain value at which the analog-to-digital converter 200 is caused to perform the gain adjustment is changed (switched) is not particularly regulated. For example, the solid-state imaging device 400 may be configured such that the gain value is switched under the control of an external signal processing circuit when the analog-to-digital converter 200 performs the gain adjustment. For example, the solid-state imaging device 400 may include a signal processing circuit (not illustrated) that realize a function similar to the function of the signal processing circuit 330 included in the above-described signal processing device 300 and the analog-to-digital converter 200 may switch the gain value at the time of gain adjustment in response to an instruction from the signal processing circuit (not illustrated).

In this configuration, the solid-state imaging device 400 is configured as a solid-state imaging device that includes the successive approximation analog-to-digital converter 200. As described above, the solid-state imaging device 400 sequentially outputs the digital signals OUT obtained by performing the gain adjustment on the pixel signals output from the pixels arrayed in the array pixel unit 410 and performing the analog-to-digital conversion to the outside. That is, in the solid-state imaging device 400, the analog-to-digital converter 200 performs the gain adjustment on the pixel signals output from the pixels arrayed in the pixel array unit 410. Here, while the digital-to-analog converter 100 used in the analog-to-digital converter 200 included in the solid-state imaging device 400 is configured to output the analog signal VDAC switched within the range of the plurality of gain-adjustment voltage values, it is possible to inhibit an increase in an area necessary to form the digital-to-analog converter 100. Thus, in the solid-state imaging device 400, it is not necessary to provide an amplification circuit or the like to realize a function for the gain adjustment of the pixel signal in a circuit at the front stage (for example, in the pixel selection unit 420) of the analog-to-digital converter 200, and the function for the gain adjustment can be added while inhibiting an increase in an area necessary to provide the amplification circuit or an increase in power consumption. Further, the analog-to-digital converter 200 included in the solid-state imaging device 400 performs the gain adjustment in the configuration of the digital-to-analog converter 100. Therefore, in the solid-state imaging device 400, compared to the case in which the gain adjustment of a factor of 2 is performed on the pixel signals, by performing the gain adjustment of a factor of 2 through the digital signal processing (that is, performing bit shifting) by an external signal processing circuit or the like, it is possible to inhibit deterioration in signal/noise (S/N) characteristics or distortion characteristics. In the solid-state imaging device 400, the analog-to-digital converter 200 can perform the gain adjustment on each pixel signal at the appropriate gain value. Thus, in the solid-state imaging device 400, it is possible to improve quality of a captured image.

In the above-described solid-state imaging device 400, the configuration in which the analog-to-digital converter 200 is included has been described. However, an analog-to-digital converter included in a solid-state imaging device according to the present invention is not limited to the above-described analog-to-digital converter 200. That is, the analog-to-digital converter included in the solid-state imaging device according to the present invention may include, for example, the analog-to-digital converter according to the present invention that has the above-describe configuration, such as the above-described analog-to-digital converter 201 or 202.

The solid-state imaging device according to the present invention may include, for example, the signal processing circuit 330 included in the above-described signal processing device 300. That is, the above-described solid-state imaging device 400 may have a configuration similar to the configuration of the signal processing device 300 instead of the analog-to-digital converter 200.

In the above-described solid-state imaging device 400, the configuration in which one analog-to-digital converter 200 is included has been described. However, the number of analog-to-digital converters included in the solid-state imaging device according to the present invention is not limited to 1. That is, the solid-state imaging device according to the present invention may include the plurality of analog-to-digital converters according to the present invention.

(Modification Example of Solid-State Imaging Device)

Figure 22:
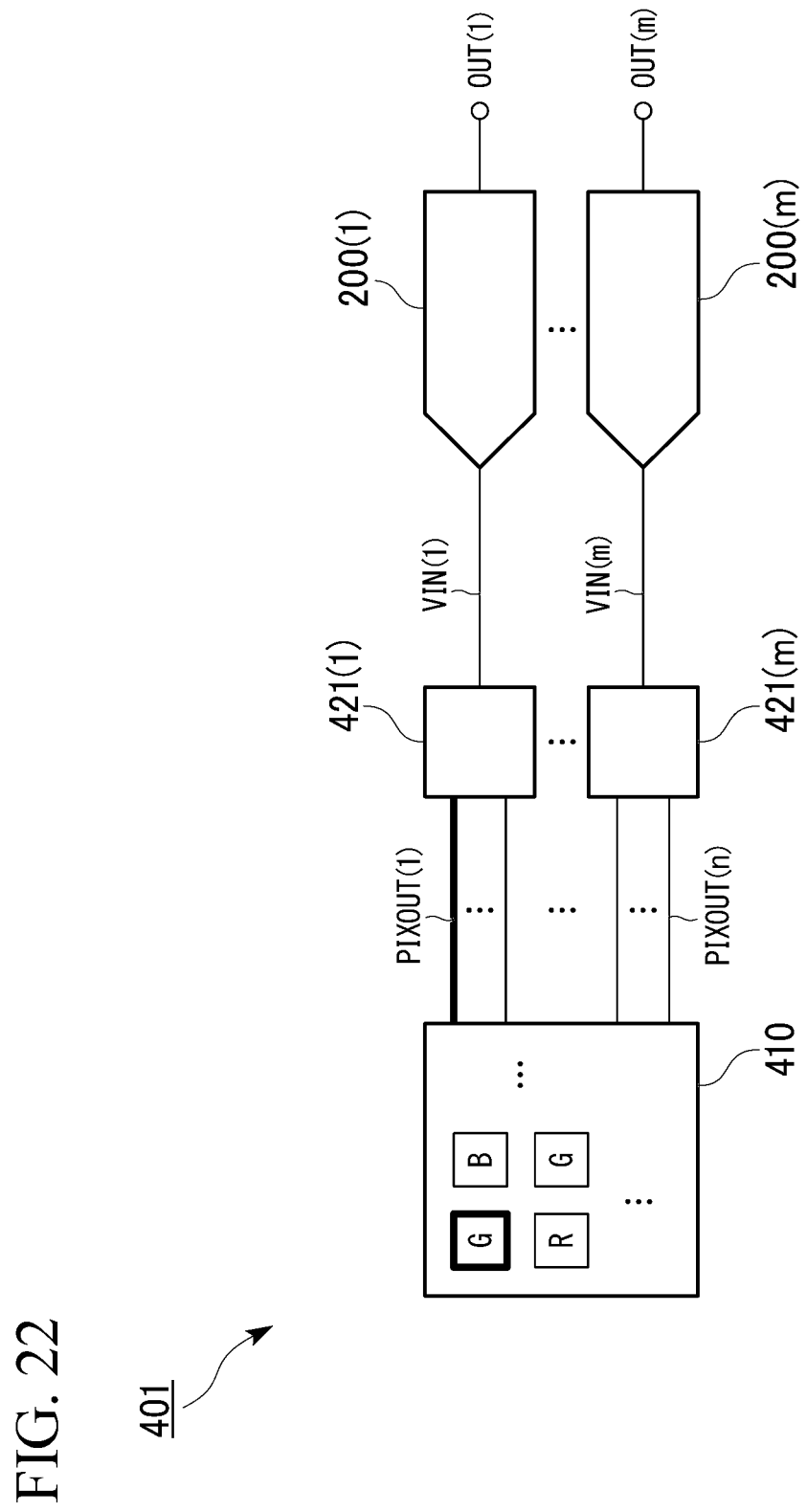
FIG. 22 is a block diagram showing an example of a configuration of a modified example of the solid-state imaging device of the present invention.

Here, an example of a solid-state imaging device including a plurality of analog-to-digital converters (successive approximation analog-to-digital converters) will be described. In the following description, a configuration in which the solid-state imaging device includes the analog-to-digital converter 200 in which the digital-to-analog converter 100 is used will be described. FIG. 22 is a block diagram illustrating an example of a configuration according to a modification example of the solid-state imaging device according to the present invention. A solid-state imaging device 401 illustrated in FIG. 22 includes the pixel array unit 410, a plurality of pixel selection units 421, and the plurality of analog-to-digital converters 200.

The constituent elements of the solid-state imaging device 401 illustrated in FIG. 22 also include constituent elements similar to the constituent elements of the solid-state imaging device 400 illustrated in FIG. 21. Accordingly, in the constituent elements of the solid-state imaging device 401, the same reference numerals are given to the constituent elements similar to the constituent elements of the solid-state imaging device 400 and detailed description of each constituent element will be omitted.

As in the solid-state imaging device 400, the solid-state imaging device 401 performs the analog-to-digital conversion on each pixel signal output from each of the pixels arrayed in the pixel array unit 410 performing imaging and sequentially outputs digital values of the pixels as the digital signals OUT. Here, the solid-state imaging device 401 includes one corresponding analog-to-digital converter 200 for each area of pre-decided pixels (hereinafter referred to as a "pixel area") arrayed in the pixel array unit 410. Here, in the pixel area, for example, an area of the pixels included in one same column or a plurality of columns of the pixel array unit 410 may be set as a single pixel area. In the pixel area, for example, an area of the pixels included in a rectangular area formed by the pre-decided numbers of rows and columns of the pixel array unit 410 may be set as a single pixel area. In the pixel area, for example, a plurality of pixels arrayed at a pre-decided interval in the pixel array unit 410 may be set as a single pixel area. In the pixel area, for example, each pixel arrayed in the pixel array unit 410 may be set as a single pixel area.

As in the pixel selection unit 420, the pixel selection unit 421 sequentially selects the pixels arrayed in the pixel array unit 410 and reads the pixels signals from the selected pixels. Here, the pixel selection unit 421 sequentially reads the pixel signals from the pixels arrayed in the corresponding pixel area in the pixel array unit 410. FIG. 22 illustrates m (where m=a natural number equal to or greater than 2 and a positive integer) pixel selection units 421. The pixel selection units 421(1) to 421(m) each acquire the pixel signals read from the pixels selected in the corresponding pixel areas and output to the corresponding pixel signal output lines PIXOUT and sequentially output the acquired pixel signals as the input signals VIN(1) to VIN(m) to the corresponding analog-to-digital converters 200. As in the pixel selection unit 420, each pixel selection unit 421 also includes, for example, constituent elements such as a vertical scanning circuit and a horizontal scanning circuit related to the selection of the pixels and the reading of the pixel signals. The pixel selection unit 421 may include the constituent elements such as a vertical scanning circuit and a horizontal scanning circuit related to the selection of the pixels and the reading of the pixel signals for each pixel selection unit 421 or may include constituent elements such as a vertical scanning circuit and a horizontal scanning circuit common to the plurality of pixel selection units 421. In this case, each pixel selection unit 421 acquires the pixel signals when the pixel signals are read from the corresponding pixels by the common vertical scanning circuit or horizontal scanning circuit and are output to the corresponding pixel signal output lines PIXOUT. Each of the pixel selection units 421 may include a constituent element performing a process on the pixel signals, such as a CDS circuit, as in the pixel selection unit 420.

As described above, the analog-to-digital converter 200 performs the analog-to-digital conversion on the input signals VIN which have been input and outputs the input signals as the digital signals OUT. Here, the analog-to-digital converter 200 performs the analog-to-digital conversion on the input signals VIN sequentially output from the corresponding pixel selection unit 421 and outputs the input signals. FIG. 22 illustrates a configuration in which m (where m=a natural number equal to or greater than 2 and a positive integer) corresponding analog-to-digital converters 200 of the pixel selection units 421 are included. The analog-to-digital converter 200(1) to the analog-to-digital converter 200(m) each sequentially output digital signals OUT(1) to OUT(m) which are results of the analog-to-digital conversion on the corresponding input signals VIN (1) to VIN(m) output sequentially by the corresponding pixel selection units 421(1) to 421(m) to the outside of the solid-state imaging device 401.

In this configuration, the solid-state imaging device 401 is configured as a solid-state imaging device that includes the plurality of successive approximation analog-to-digital converters 200 corresponding to the pixel areas. As in the solid-state imaging device 400, the solid-state imaging device 401 sequentially outputs the digital signals OUT obtained by performing the gain adjustment on the pixel signals output from the pixels arrayed in the array pixel unit 410 and performing the analog-to-digital conversion to the outside. Thus, in the solid-state imaging device 401, as in the solid-state imaging device 400, when the digital signals OUT are output to the outside, it is possible to output the digital signals OUT obtained by performing the gain adjustment at the gain value appropriate in accordance with the characteristics of the pixels or an imaged scene and performing the analog-to-digital conversion on the pixel signals. Thus, in the solid-state imaging device 401, it is possible to obtain similar advantageous effects to the solid-state imaging device 400. Further, in the solid-state imaging device 401, the gain adjustment on the pixel signal output from each of the pixels arrayed in the pixel array unit 410 can be performed at a different gain value for each analog-to-digital converter 200. Therefore, in the solid-state imaging device 401, when the gain adjustment is performed at a different gain value in units of divisions of the pixel area and the analog-to-digital conversion is performed, the gain value for the gain adjustment may be set for each analog-to-digital converter 200. In other words, in the solid-state imaging device 401, each analog-to-digital converter 200 can be easily controlled without performing control such that the gain value is changed (switched) for the same analog-to-digital converter 200. In the solid-state imaging device 401, as in the solid-state imaging device 400, a configuration in which the gain value for causing the analog-to-digital converter 200 to perform the gain adjustment is changed (switched) is not particularly regulated.

As the solid-state imaging device according to the present invention, a solid-state imaging device (for example, the solid-state imaging device 400) includes a pixel array unit (for example, the pixel array unit 410) in which a plurality of pixels generating photoelectric conversion signals in accordance with an amount of incident light are arrayed in a 2-dimensional matrix form, a pixel selection unit (for example, the pixel selection unit 420) that selects each of the pixels arrayed in the pixel array unit 410 and reads a pixel signal in accordance with the photoelectric conversion signal from the selected pixel, and an analog-to-digital converter (for example, the analog-to-digital converter 200). The analog-to-digital converter 200 outputs digital signals (the digital signals OUT) with a resolution indicating the magnitude of the pixel value of the pixel signal.

As described above, the solid-state imaging device according to the present invention includes the analog-to-digital converter according to the present invention. In the solid-state imaging device according to the present invention, the included analog-to-digital converter according to the present invention sequentially outputs the digital signals OUT obtained by performing the gain adjustment on the pixel signal output from each of the pixels arrayed in the pixel array unit and performing the analog-to-digital conversion to the outside. Thus, in the solid-state imaging device according to the present invention, when the digital signals OUT are output to the outside, it is possible to output the digital signals OUT obtained by performing the gain adjustment at the gain value appropriate in accordance with the characteristics or the like of the pixels or an imaged scene and performing the analog-to-digital conversion on each pixel signal. Here, while the digital-to-analog converter according to the present invention used in the analog-to-digital converter according to the present invention included in the solid-state imaging device according to the present invention is configured to output the analog signal VDAC switched within the range of the plurality of gain-adjustment voltage values, it is possible to inhibit an increase in an area necessary to form the digital-to-analog converter according to the present invention. Thus, in the solid-state imaging device according to the present invention, while inhibiting an increase in the area necessary to form the solid-state imaging device or an increase in power consumption, it is possible to realize the solid-state imaging device to which a gain adjustment function is added. Further, in the analog-to-digital converter according to the present invention included in the solid-state imaging device according to the present invention, even when the gain adjustment is performed at the same gain factor value of 2 to perform the gain adjustment on the pixel signal in the configuration of the digital-to-analog converter according to the present invention, it is possible to inhibit deterioration in signal/noise (S/N) characteristics or distortion characteristics by performing the gain adjustment at the gain factor value of 2 through the digital signal processing (that is, performing bit shifting) by an external signal processing circuit or the like.

Thus, in the solid-state imaging device according to the present invention, it is possible to improve quality of a captured image.

As described above, according to each embodiment of the present invention, by switching connection of a plurality of capacitances binary weighted (may be weighted by a number other than a binary number) by switches, at least one capacitance with a capacitance value of a factor of $1/k$ (where k=a multiplier of 2 equal to or greater than 2) is added to the capacitance unit of the digital-to-analog converter that outputs analog signals with various voltage values based on a reference voltage and an input signal which has been input at a predetermined resolution. According to each embodiment of the present invention, the switch SW corresponding to each capacitance with the capacitance value of a factor of $1/k$ added to the capacitance unit is added to the switch unit of the digital-to-analog converter. Thus, according to each embodiment of the present invention, the digital-to-analog converter that performs gain adjustment on the voltage value of the reference voltage up to a factor of $1/k$ can be configured.

According to each embodiment of the present invention, in the digital-to-analog converter, among plurality of capacitances binary weighted and included in the capacitance unit and the added capacitances, the number of capacitances corresponding to the resolution of the analog signals to be output are used as the capacitances for generating the voltage values of the analog signals to be output at the resolution of the number of bits in accordance with the switching of the corresponding switches after the voltage value of the input signal is sampled. According to each embodiment of the present invention, in the digital-to-analog converter, the remaining capacitances that are not used as the capacitances for generating the voltage value of the analog signal are fixed (held) without switching the corresponding switches and are used as the capacitances for adjusting the gain adjustment on the voltage value of the reference voltage. Thus, according to each embodiment of the present invention, the digital-to-analog converter can output the analog signal obtained by adding or subtracting the voltage value of the reference voltage of which the gain is adjusted to a factor of $1/k$ to or from the voltage value of the input signal.

Further, according to each embodiment of the present invention, the capacitance value of the capacitance added to the capacitance unit of the digital-to-analog converter is a capacitance value less than the capacitance with the smallest capacitance value among the plurality of capacitances binary weighted. According to each embodiment of the present invention, the switch added to the switch unit of the digital-to-analog converter has a similar configuration to the other switches (the switches corresponding to the plurality of capacitances binary weighted) included in the switch unit and is not a switch that has a configuration in which a special function is necessary. Thus, according to each embodiment of the present invention, while the digital-to-analog converter configured to output the analog signal in which the voltage value of the reference voltage of which the gain is adjusted within the broad range of voltage values from a factor of 1 to a factor of $1/k$ is added to the voltage value of the input signal, that is, the analog signal switched within the plurality of gain-adjusted voltage values is realized, it is possible to inhibit an increase in an area necessary to form the digital-to-analog converter.

According to the embodiments of the present invention, the successive approximation analog-to-digital converter is configured using the digital-to-analog converter configured to output the analog signal switched within the range of the plurality of gain-adjusted voltage values. More specifically, according to the embodiments of the present invention, the successive approximation analog-to-digital converter includes the digital-to-analog converter, the comparator that compares the analog signal output by the digital-to-analog converter with the comparison reference voltage, and the control circuit that generates the digital signal for controlling each switch included in the switch unit in the digital-to-analog converter based on the digital signal output from the comparator. Thus, according to the embodiments of the present invention, it is possible to inhibit an increase in an area necessary to form the analog-to-digital converter.

According to the embodiments of the present invention, the signal processing device includes the analog-to-digital converter in which the digital-to-analog converter configured to output the analog signals switched within the range of the plurality of gain-adjusted voltage values is used. More specifically, according to the embodiments of the present invention, the signal processing device includes the analog-to-digital converter and the signal processing circuit that determines the gain value at the time of gain adjustment of the analog signal based on the digital signal on which the analog-to-digital converter performs the analog-to-digital conversion. According to the embodiments of the present invention, the signal processing circuit feeds the gain value for gain adjustment of the analog signal back when the analog-to-digital converter performs the analog-to-digital conversion. Thus, according to the embodiments of the present invention, the signal processing device can obtain the digital signal indicating the magnitude of the voltage value of the input signal subjected to the analog-to-digital conversion within a range of an optimum size. Further, according to the embodiments of the present invention, it is possible to inhibit an increase in an area necessary to form the signal processing device.

According to the embodiments of the present invention, the solid-state imaging device includes the analog-to-digital converter in which the digital-to-analog converter configured to output the analog signal switched within the range of the plurality of gain-adjusted voltage values is used. According to the embodiments of the present invention, in the solid-state imaging device, the analog-to-digital converter outputs the digital signals obtained by performing the gain adjustment on the pixel signals output from the pixels and performing the analog-to-digital conversion. Thus, according to the embodiments of the present invention, when the solid-state imaging device outputs the digital signals, it is possible to output the digital signals obtained by performing the gain adjustment on the pixel signals at the gain value appropriate in accordance with characteristics or the like of the pixels or an imaged scene and performing the analog-to-digital conversion on the pixel signals. Thus, according to the embodiments of the present invention, it is possible to improve quality of an image captured in the solid-state imaging device. Further, according to the embodiments of the present invention, since it is possible to inhibit an increase in an area necessary to form the analog-to-digital converter in the solid-state imaging device, it is possible to inhibit an increase in the size of the solid-state imaging device.

The preferred embodiments of the present invention have been described, but the present invention is not limited to theses embodiments and the modification examples. Addition, omission, substitution, and other changes of configurations can be made within the scope of the present invention without departing from the gist of the present invention.

The present invention is not limited to the above description and is limited by only the appended claims.

According to each of the foregoing embodiments, it is possible to provide a digital-to-analog converter that can be formed by inhibiting an increase in an area and outputs an analog signal switched within a range of a plurality of voltage values, an analog-to-digital converter using the digital-to-analog converter, and a driving method therefor. Further, according to each of the foregoing embodiments, it is possible to provide a signal processing device and an imaging device using the analog-to-digital converter.

What is claimed is:

1. A digital-to-analog converter that samples a voltage value of an input signal and outputs an analog signal of a voltage value obtained by adding and subtracting a voltage value based on a reference voltage to the sampled voltage value of the input signal with a predetermined resolution, comprising:
   a plurality of capacitances at least one more than the resolution, of which first terminal is connected to an output node side of the analog signal, and of which second terminal is connected to either a high potential side or a low potential side of the reference voltage; and
   a plurality of switches corresponding to each of the capacitances, and configured to switch the second terminal of a corresponding capacitance to either the high potential side node or the low potential side node according to an input control signal,
   wherein a capacitance among the plurality of capacitances, of which the number corresponds to the resolution of the analog signal to be output, is used as a voltage value generation capacitance, so as to generate a voltage value based on the reference voltage to be added or subtracted, by switching a node to which the second terminal is connected by a corresponding switch,
   a remaining capacitance, which is not used as the voltage value generation capacitance among the plurality of capacitances, is used as a gain adjustment capacitance, so as to adjust gain of a voltage value based on the reference voltage to be added or subtracted, by holding a node to which the second terminal is connected by a corresponding switch,
   when changing to lower a gain value of the voltage value of the output analog signal, a capacitance among the plurality of the capacitances are selected as the voltage value generation capacitance or the gain adjustment capacitance so that a capacitance value of a capacitance used as the voltage value generation capacitance is reduced, and
   when changing to increase the gain value of the voltage value of the output analog signal, the capacitance among the plurality of the capacitances are selected as the voltage value generation capacitance or the gain adjustment capacitance so that the capacitance value of the capacitance used as the voltage value generation capacitance is increased.

2. The digital-to-analog converter according to claim 1, wherein
   each of the above capacitance is either a main capacitance weighted by a binary number corresponding to the resolution of the analog signal to be output, or a sub capacitance with a capacitance value of 1/k times (wherein k is 2 or more multiplier of 2) a smallest capacitance value among the main capacitances,
   when changing to lower a gain value of the voltage value of the analog signal to be output, sub capacitances, of which the number corresponds to the gain value to be changed, are included in the voltage value generation capacitance in order from the sub capacitance having a largest capacitance value among the sub capacitances included in the gain adjustment capacitance, and main capacitances, of which the number is same as the number of the sub capacitances included in the voltage value generation capacitance, are included in the gain adjustment capacitance, in order from the main capacitance having a largest capacitance value among the voltage value generation capacitances, when changing to increase the gain value, main capacitances, of which the number corresponds to the gain value to be changed, are included in the voltage value generation capacitance, in order from the main capacitance having the smallest capacitance value among the main capacitances included in the gain adjustment capacitance, and sub capacitances, of which the number is same as the number of the main capacitance included in the voltage value generation capacitance, are included in the gain adjustment capacitance, in order from the sub capacitance having the smallest capacitance value among the sub capacitances included in the voltage value generation capacitance.

3. The digital-to-analog converter according to claim 1, wherein a connection destination of the second terminal of at least one of the plurality of capacitances is switched to a node different from a node connected when sampling the voltage value of the input signal by the corresponding switch, and the capacitance is used for offset adjustment of a voltage value based on the reference voltage that is added or subtracted by the voltage value generation capacitance.

4. The digital-to-analog converter according to claim 1, wherein a connection destination of the second terminal of at least one of the plurality of capacitances during sampling the voltage value of the input signal is switched to a node different from a node to be connected when not performing offset adjustment by the corresponding switch, and the capacitance is used for offset adjustment of a voltage value based on the reference voltage that is added or subtracted by the voltage value generation capacitance.

5. An analog-to-digital converter comprising:
the digital-to-analog converter according to claim 1;
a comparator configured to compare the voltage value of the analog signal output from the digital-to-analog converter input to one input terminal and the voltage value of the voltage to be compared input to the other input terminal; and
a control circuit configured to output a digital signal with the resolution representing a magnitude of the voltage value of the input signal, and to generate the control signal corresponding to each of the switches provided in the digital-to-analog converter, in reference to a comparison result of the comparator.

6. A signal processing device comprising:
the analog-to-digital converter according to claim 5; and
a signal processing circuit configured to determine a gain value of the voltage value of the analog signal output by the digital-to-analog converter in the analog-to-digital converter whose gain is adjusted when the analog-to-digital converter next performs analog-to-digital conversion based on the digital signal output from the analog-to-digital converter, and to output a gain change signal instructing the change of the gain value based on the determination result, to the analog-digital converter,
wherein the control circuit provided in the analog-to-digital converter generates the control signal corresponding to each of the switches provided in the digital-to-analog converter according to the gain change signal.

7. A solid-state imaging device comprising:
a pixel array section in which a plurality of pixels that generate photoelectric conversion signals according to the amount of incident light are arranged in a two-dimensional matrix;
a pixel selector configured to select each of the pixels arranged in the pixel array section, and to read out a pixel signal corresponding to the photoelectric conversion signal from the selected pixel; and
the analog-to-digital converter according to claim 5,
wherein the analog-to-digital converter outputs the digital signal with the resolution representing the magnitude of the voltage value of the pixel signal.

8. A driving method of a digital-to-analog converter that samples a voltage value of an input signal and outputs an analog signal with a predetermined resolution, of which a voltage value obtained by adding and subtracting a voltage value based on a reference voltage to the sampled voltage value of the input signal, the digital-to-analog converter including: a plurality of capacitances at least one more than the resolution, of which first terminal is connected to an output node side of the analog signal, and of which second terminal is connected to either a high potential side or a low potential side of the reference voltage; and a plurality of switches corresponding to each of the capacitances, and configured to switch the second terminal of a corresponding capacitance to either the high potential side node or the low potential side node according to an input control signal, the driving method comprising:

generating a voltage value based on the reference voltage to be added or subtracted, by switching a node to which the second terminal is connected by a corresponding switch, using a capacitance among the plurality of capacitances, of which the number corresponds to the resolution of the analog signal to be output, as a voltage value generation capacitance;

adjusting gain of a voltage value based on the reference voltage to be added or subtracted, by holding a node to which the second terminal is connected by a corresponding switch, using a remaining capacitance among the plurality of capacitances, which is not used as the voltage value generation capacitance, as a gain adjustment capacitance;

selecting a plurality of the capacitances as the voltage value generation capacitance or the gain adjustment capacitance, when changing to lower a gain value of the voltage value of the analog signal to be output, sub capacitances, of which the number corresponds to the gain value to be changed, are included in the voltage value generation capacitance, in order from the sub capacitance having a largest capacitance value among the sub capacitances included in the gain adjustment capacitance, and main capacitances, of which the number is same as the number of the sub capacitances included in the voltage value generation capacitance, are included in the gain adjustment capacitance, in order from the main capacitance having a largest capacitance value among the voltage value generation capacitances, when changing to increase the gain value, main capacitances, of which the number corresponds to the gain value to be changed, are included in the voltage value generation capacitance, in order from the main capacitance having the smallest capacitance value among the main capacitances included in the gain adjustment capacitance, and sub capacitances, of which the number is same as the number of the main capacitance included in the voltage value generation capacitance, are included in the gain adjustment capacitance, in order from the sub capacitance having the smallest capacitance value among the sub capacitances included in the voltage value generation capacitance.

* * * * *